(12) United States Patent
Chang et al.

(10) Patent No.: US 8,907,497 B2
(45) Date of Patent: Dec. 9, 2014

(54) SEMICONDUCTOR DEVICE WITH SELF-ALIGNED INTERCONNECTS AND BLOCKING PORTIONS

(75) Inventors: Shih-Ming Chang, Zhubei (TW); Ken-Hsien Hsieh, Taipei (TW); Tsong-Hua Ou, Taipei (TW); Ru-Gun Liu, Zhubei (TW); Fang-Yu Fan, Hukou Township, Hsinchu County (TW); Yuan-Te Hou, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 13/458,396

(22) Filed: Apr. 27, 2012

(65) Prior Publication Data
US 2013/0285246 A1    Oct. 31, 2013

(51) Int. Cl.
*H01L 23/48* (2006.01)
*H01L 23/52* (2006.01)
*H01L 29/40* (2006.01)

(52) U.S. Cl.
USPC .......................................... 257/776; 257/758

(58) Field of Classification Search
CPC ........................ H01L 23/5221; H01L 23/5381
USPC .................................................. 257/758, 776
See application file for complete search history.

(56) References Cited

U.S. PATENT DOCUMENTS

| | | | |
|---|---|---|---|
| 5,949,098 A * | 9/1999 | Mori | 257/211 |
| 6,445,071 B1 * | 9/2002 | Haruhana et al. | 257/758 |
| 6,486,558 B2 * | 11/2002 | Sugiyama et al. | 257/758 |
| 6,541,862 B2 * | 4/2003 | Amishiro et al. | 257/751 |
| 6,657,302 B1 * | 12/2003 | Shao et al. | 257/758 |
| 6,717,267 B1 * | 4/2004 | Kunikiyo | 257/758 |
| 6,727,590 B2 * | 4/2004 | Izumitani et al. | 257/758 |
| 6,919,637 B2 * | 7/2005 | He et al. | 257/758 |
| 7,247,552 B2 * | 7/2007 | Pozder et al. | 438/618 |
| 7,256,474 B2 * | 8/2007 | Wakayama et al. | 257/620 |
| 7,282,803 B2 * | 10/2007 | Cathelin et al. | 257/758 |
| 7,288,786 B2 * | 10/2007 | Janke | 257/48 |
| 7,301,218 B2 * | 11/2007 | Lee | 257/535 |
| 7,474,003 B2 * | 1/2009 | Koubuchi et al. | 257/776 |
| 7,482,675 B2 * | 1/2009 | Adkisson et al. | 257/620 |
| 7,550,805 B2 * | 6/2009 | Leedy | 257/347 |
| 8,492,904 B2 * | 7/2013 | Fujihara | 257/776 |
| 2008/0042299 A1 * | 2/2008 | Mouttet | 257/776 |

OTHER PUBLICATIONS

Shih-Ming Chang et al., U.S. Appl. No. 13/444,648, filed Apr. 11, 2012, for "A Semiconductor Device With Self-Aligned Interconnects", 21 pages of text and 18 pages of drawings.
US Patent Office, unpublished U.S. Appl. No. 13/461,224, filed May 1, 2012, titled "Via-Free Interconnect Structure with Self-Aligned Metal Line Interconnections," 32 pages.

* cited by examiner

*Primary Examiner* — David Zarneke
(74) *Attorney, Agent, or Firm* — Haynes and Boone, LLP

(57) ABSTRACT

A device and method for fabricating a device is disclosed. An exemplary device includes a first conductive layer disposed over a substrate, the first conductive layer including a first plurality of conductive lines extending in a first direction. The device further includes a second conductive layer disposed over the first conductive layer, the second conductive layer including a second plurality of conductive lines extending in a second direction. The device further includes a self-aligned interconnect formed at an interface where a first conductive line of the first plurality of conductive lines is in electrical contact with a first conductive line of the second plurality of conductive lines. The device further includes a blocking portion interposed between a second conductive line of the first plurality of conductive lines and a second conductive line of the second plurality of conductive lines.

18 Claims, 58 Drawing Sheets

SEMICONDUCTOR DEVICE WITH SELF-ALIGNED INTERCONNECTS AND BLOCKING PORTIONS

CROSS-REFERENCE TO RELATED APPLICATION

The present disclosure is related to U.S. patent application Ser. No. 13/444,648, by inventors Shih-Ming Chang, et al., entitled "A SEMICONDUCTOR DEVICE WITH SELF-ALIGNED INTERCONNECTS," filed on Apr. 11, 2012, which is hereby incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of multilayer (or three dimensional) integrated devices. The multilayer devices may include a plurality of interlayer dielectric layers (ILDs) each including one or more conductive layers which are aligned and connected with other conductive layers. However, as the scaling down continues, forming and aligning conductive layers has proved difficult. Accordingly, although existing multilayer devices and methods of fabricating multilayer devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
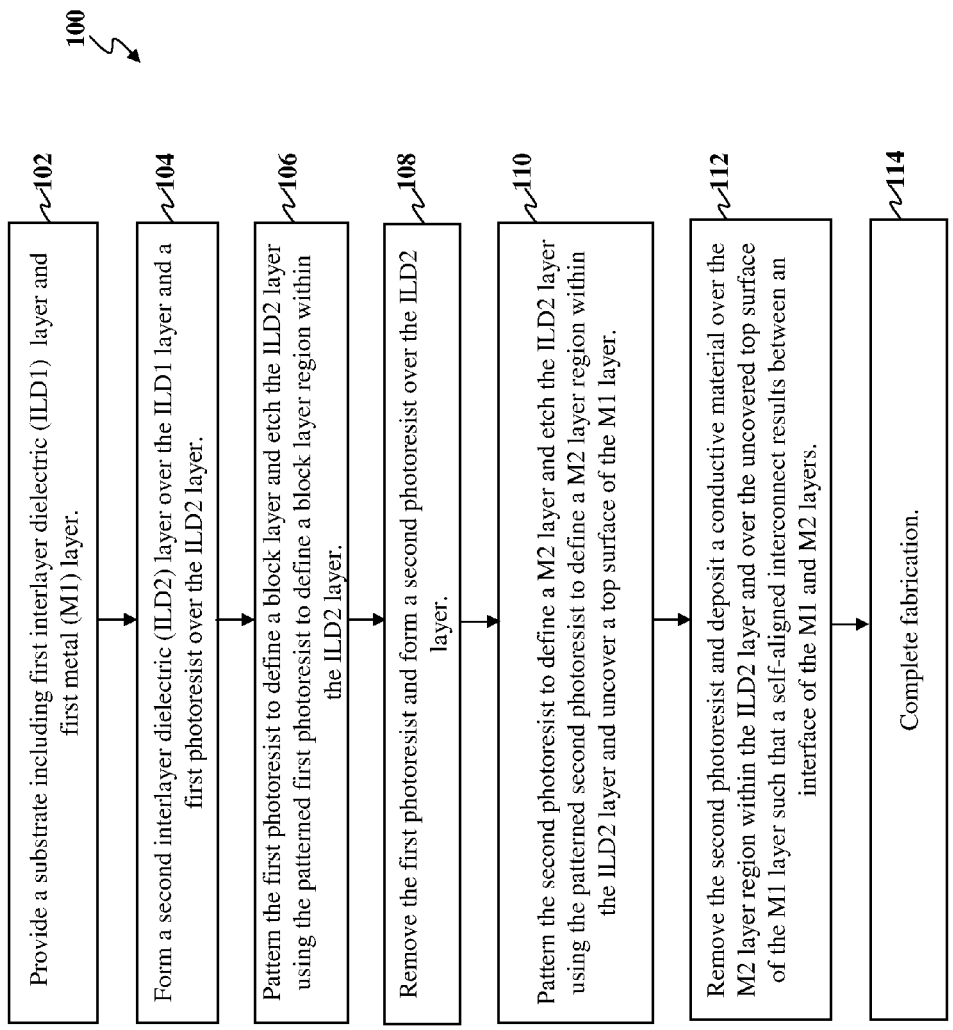
FIG. 1 is a flowchart illustrating a method of fabricating a multilayer device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Modern semiconductor devices may utilize an interconnect structure to perform electrical routing between the various components and features on a semiconductor wafer and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. An interlayer dielectric (ILD) which may comprise a plurality of ILD layer of the interconnect structure provides isolation between the metal lines.

An interconnect structure may also include a plurality of vias/contacts that provide electrical connections between the metal lines from different interconnect layers. For example, a via may extend vertically and therefore allows a metal line from the M1 layer to be electrically connected to another metal line from the M2 layer. As semiconductor device fabrication technologies continue to evolve, the sizes of the various features on a semiconductor device become smaller and smaller, including the sizes of the vias and metal lines. This leads to fabrication challenges. For example, the formation of the vias may involve one or more lithography and etching processes. Variations associated with these processes (e.g., critical dimension uniformity variations or lithography overlay errors) exacerbate via alignment problems. Alternatively stated, the device scaling down process may place a more stringent requirement on the precise alignment between the via and the interconnected metal lines above and/or below, since a small shift can cause the via to be misaligned with the metal lines. Therefore, an improved interconnect structure that does not suffer from these via alignment problems is desired.

According to the various aspects of the present disclosure, a via-free interconnect structure is disclosed. The via-free interconnect structure contains metal layers where the metal lines are electrically coupled to other metal lines from different metal layers, thereby obviating the need for vias to perform the interconnections. In other words, the metal lines are self-aligned. The various aspects of such interconnect structure is described in more detail below.

With reference to FIGS. 1 and 2-14, a method 100 and multilayer device 200 and 300 are collectively described below. FIG. 1 is a flow chart of a method 100 for fabricating an integrated circuit device according to various aspects of the present disclosure. In the present embodiment, the method 100 is for fabricating a multilayer integrated circuit device. The method 100 begins at block 102 where a substrate including first interlayer dielectric (ILD1) layer and first metal (M1) layer is provided. At block 104, a second interlayer dielectric (ILD2) layer is formed over the ILD1 layer and a first photoresist is formed over the ILD2 layer. The method continues with block 106 where the first photoresist is patterned to define a block layer and the ILD2 layer is etched using the patterned first photoresist to define a block layer region within the ILD2 layer. The method continues with block 108 where the first photoresist is removed and a second photoresist is formed over the ILD2 layer. At block 110, the second photoresist layer is patterned to define a M2 layer and the ILD2 layer is etched using the patterned second photoresist to define a M2 layer region within the ILD2 layer and uncover a top surface of the M1 layer. At block 112, the second photoresist is removed and a conductive material is deposited over the M2 layer region within the ILD2 layer and over the uncovered top surface of the M1 layer such that a self-aligned interconnect results between an interface of the M1 and M2 layers. A planarizing process may be performed to remove excess M2 layer material, thus planarizing the top surface of the multilayer device. In alternative embodiments, the second photoresist is not removed prior to formation of the M2 layer, but rather it is also removed by the planarizing process that is performed to remove excess M2 layer material. The method 100 continues with block 114 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes on two conductive layers (e.g., M1 and M2) more than two conducive layers are contemplated. Additional steps can be provided before, during, and after the method 100, and some of the steps described can be replaced or eliminated for other embodiments of the method. The discussion that follows illustrates various embodiments of a multilayer device that can be fabricated according to the method 100 of FIG. 1.

FIGS. 2-14 illustrate diagrammatic top and cross-sectional side views of one embodiment of a multilayer device 200 and 300 at various stages of fabrication, according to the method of FIG. 1. It is understood that the multilayer device 200 and 300 may include various other devices and features, such as other types of transistors such as bipolar junction transistors, resistors, capacitors, diodes, fuses, etc., but is simplified for a better understanding of the inventive concepts of the present disclosure. Accordingly, FIGS. 2-14 have been simplified for the sake of clarity to better understand the inventive concepts of the present disclosure. Additional features can be added in the multilayer device 200 and 300, and some of the features described below can be replaced or eliminated in other embodiments of the multilayer device 200 and 300.

Figure 2:
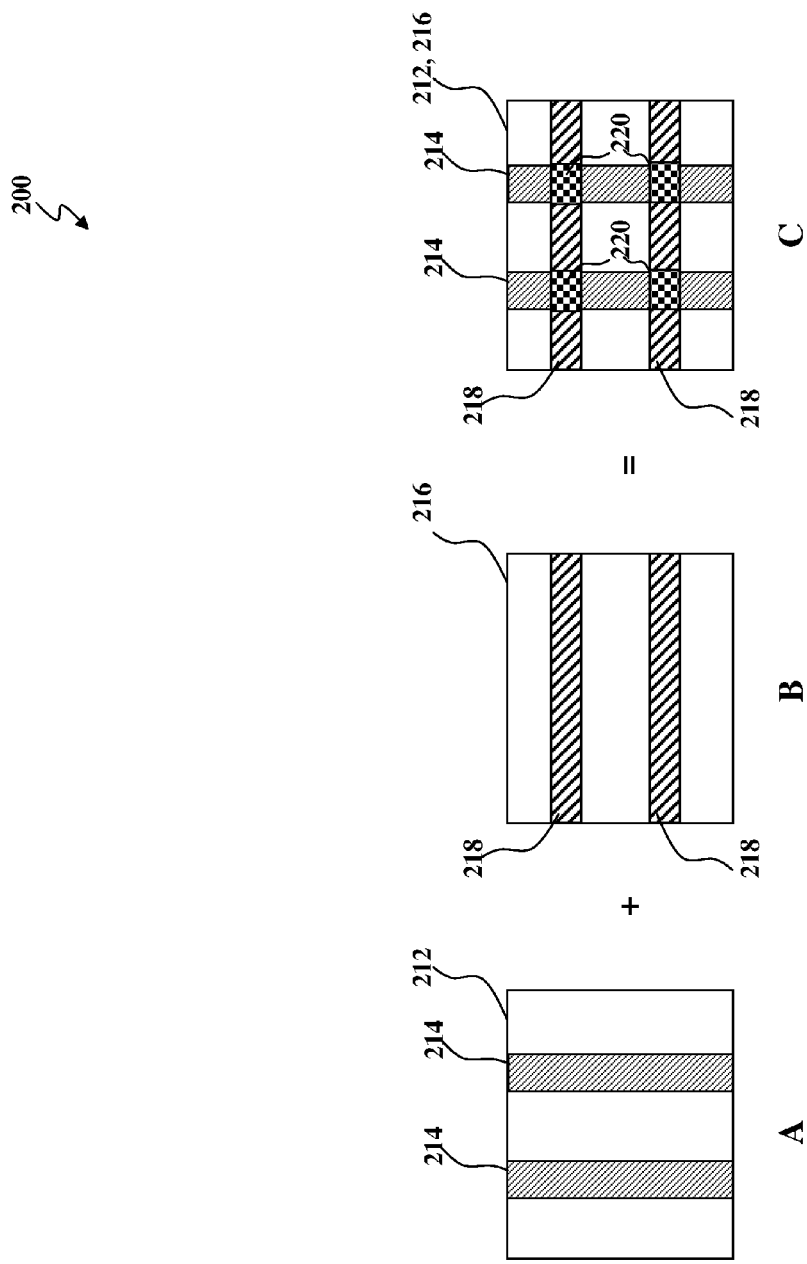
FIGS. 2-4 are diagrammatic fragmentary top views of a semiconductor device at various stages of fabrication in accordance with various aspects of the present disclosure.
Figure 3:
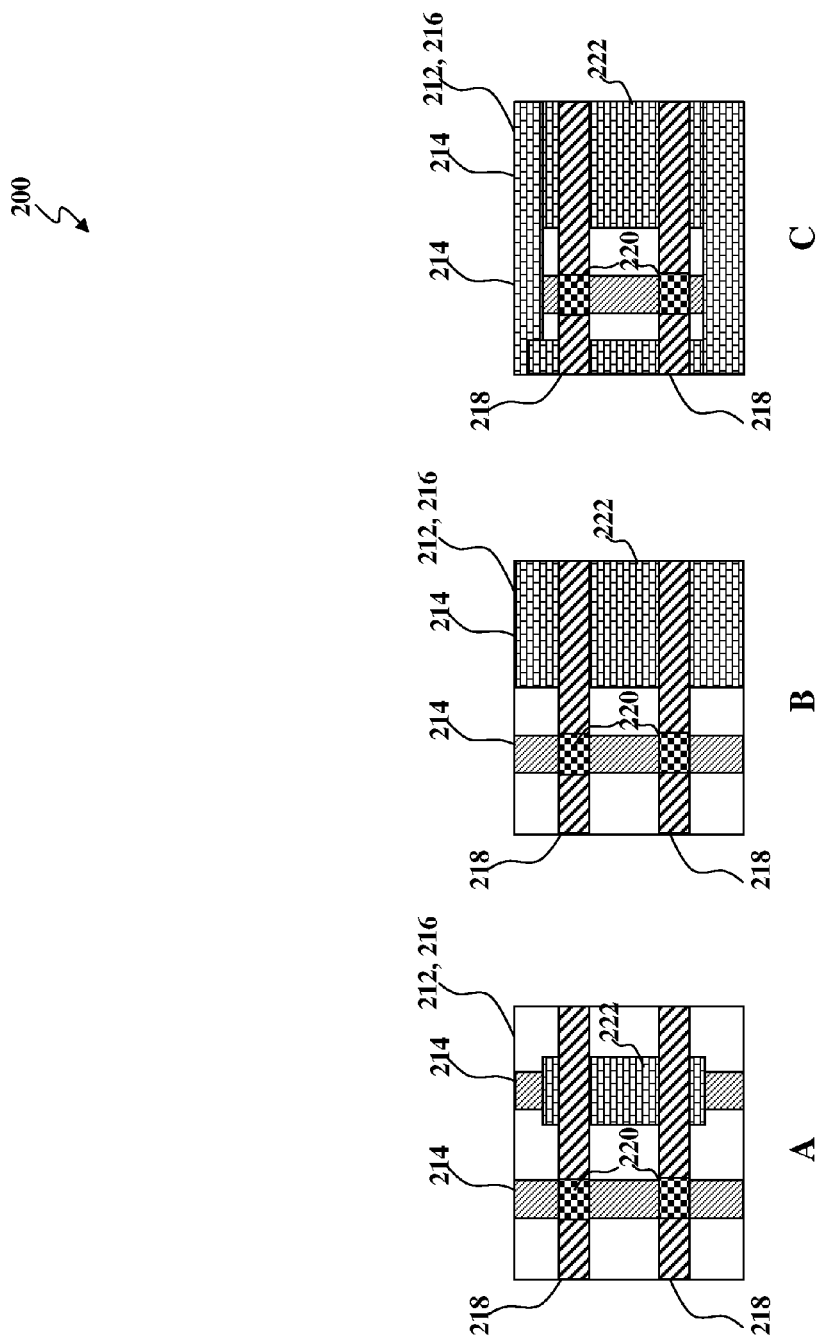
Figure 4:
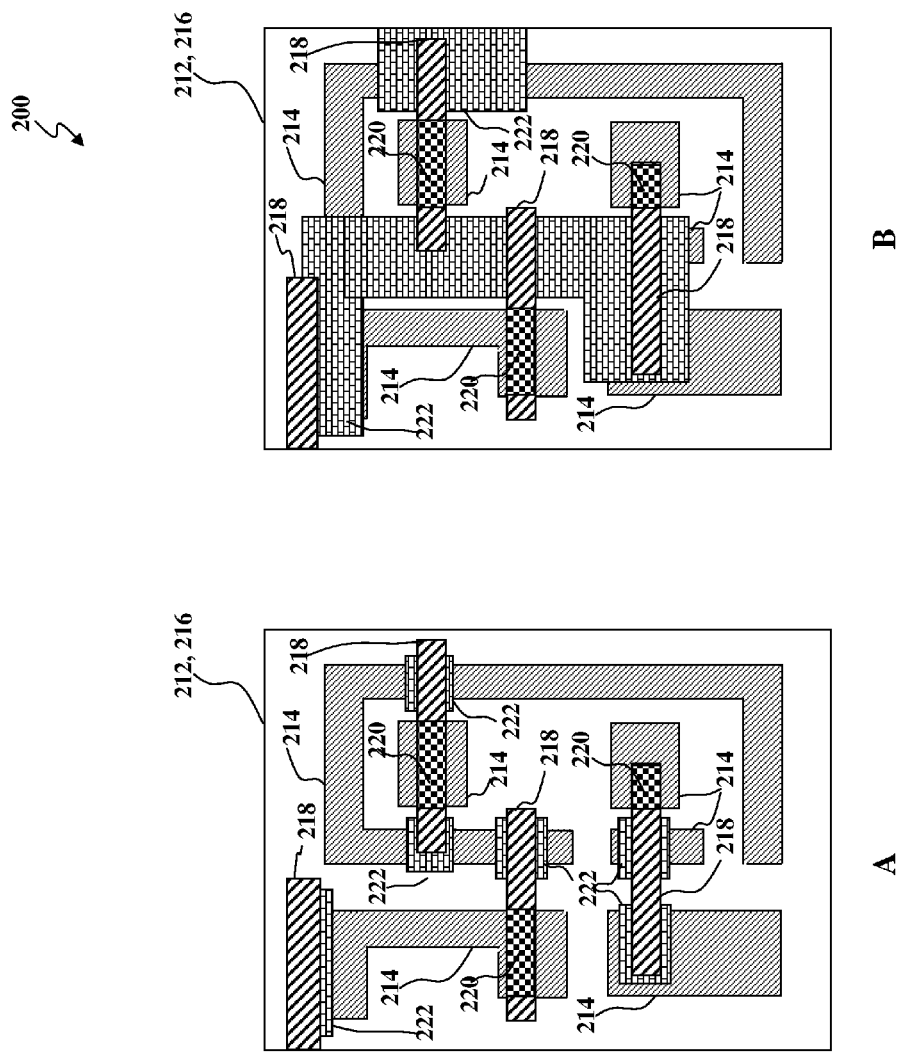

Referring to FIG. 2, a top view of a multilayer device 200 is provided to better understand the concepts described herein. With regard to FIG. 2A, a first interlayer dielectric (ILD1) layer 212 is provided including a first metal (M1) layer 214 having a plurality of lines, in a first direction. With regard to FIG. 2B, a second interlayer dielectric (ILD2) layer 216 is provided including a second metal (M2) layer 218 having a plurality of lines, in a second direction. In the present embodiment, the first and second direction are perpendicular. In alternative embodiments, the first and second direction are substantially the same. With respect to FIG. 2C, when the ILD2 layer 216 and M2 layer 218 of FIG. 2B is formed over the ILD1 layer 212 and M1 layer 214 of FIG. 2A, a self-aligned interconnect 220 results at the interface between the lines of the M1 and M2 layers 214, 218. As such, the M1 and M2 layers 214, 218 do not need to be aligned with a via as the self-aligned interconnect 220 will result at any point where the lines of the two conductive layers interface with each other.

Referring to FIGS. 3A-C, in certain situations, it may be desirable to not allow all of the interfaces between the lines of the M1 and M2 layer 214, 218 to connect and form self-aligned interconnects 220. As such, one or more of the self-aligned interconnects 220 may be blocked from forming by providing for a blocking layer 222 interposed between lines of the M1 and M2 layer 214, 218. Various examples of providing the blocking layer 222 are provided in FIGS. 3A-C. For example, in FIG. 3A, only the specific areas where the self-aligned interconnect would result are blocked by the blocking layer 222. In another example, in FIG. 3B, a broader area (beyond the area where self-aligned interconnects would result) is blocked by the blocking layer 222. In yet a further example, in FIG. 3C, the area surrounding the self-aligned interconnects 220 is blocked, thereby only allowing those specific self-aligned interconnects 220 to form. These approaches allow for easier process flow as a single broad pattern with looser tolerances can be utilized to define the area to be blocked such that multiple self-aligned interconnects can be blocked with one portion of the blocking layer. In such situations, the tolerances (or alignment) of the blocking layer is not critical. For example, where the minimum pitch between lines of the M1 layer and lines of the M2 layer is 64 nm, the blocking embodiments of FIGS. 3A-C to block multiple self-aligned interconnects may be used. In such embodiments, a single patterning process (e.g., photoresist exposure/etching) is required to define the blocking layer. In contrast, where each interface between the self-aligned interconnects is blocked by a separate blocking layer, a double patterning process (e.g., two photoresist exposures/etching) is required because of the tighter tolerances. Accordingly, the disclosed blocking embodiments provide for process-friendly approaches that minimize process steps/time and reduce alignment issues by allowing for blocking multiple self-aligned interconnects from forming with one portion of the blocking layer.

Referring to FIGS. 4A-B, a top view of blocking the formation of self-aligned interconnects is illustrated. The multilayer device 200 includes M1 and M2 layers 214, 218 each having a plurality of lines formed in ILD1 and ILD2 layers 212, 216. The interface between the lines of the M1 and M2 layers results in a self-aligned interconnects 220. However, the formation of the self-aligned interconnects can be blocked by providing a blocking layer 222 interposed between the lines of the M1 and M2 layers 214, 218. In an example, FIG. 4A illustrates individually blocking self-aligned interconnects from forming with separate portions of the blocking layer 222. In this approach, the formation of the portions of the blocking layer 222 must be precisely aligned with the M1 and M2 layers. In an alternative example, FIG. 4B shows blocking multiple self-aligned interconnects with one portion of a blocking layer 222. Further, FIG. 4B shows that where only one self-aligned interconnect is blocked, the blocking layer 222 may be formed larger than the self-aligned interconnect and thereby minimize alignment issues. In other words, the blocking layer need not necessarily be formed only between the self-aligned interface that needs to be blocked. It is understood that the approaches illustrated in FIGS. 4A-B are not mutually exclusive and that a single embodiment may include both approaches of forming blocking layers 222. The blocking layer 222 may include a layer/material such as a dielectric layer, a hard mask layer, a combination of both, or any suitable layer/material that blocks formation of self-aligned interconnects and/or electrical connection between lines of conductive layers. As illustrated, the M1 and M2 layers 214, 218, include multiple lines in the same or different directions.

Figure 5:
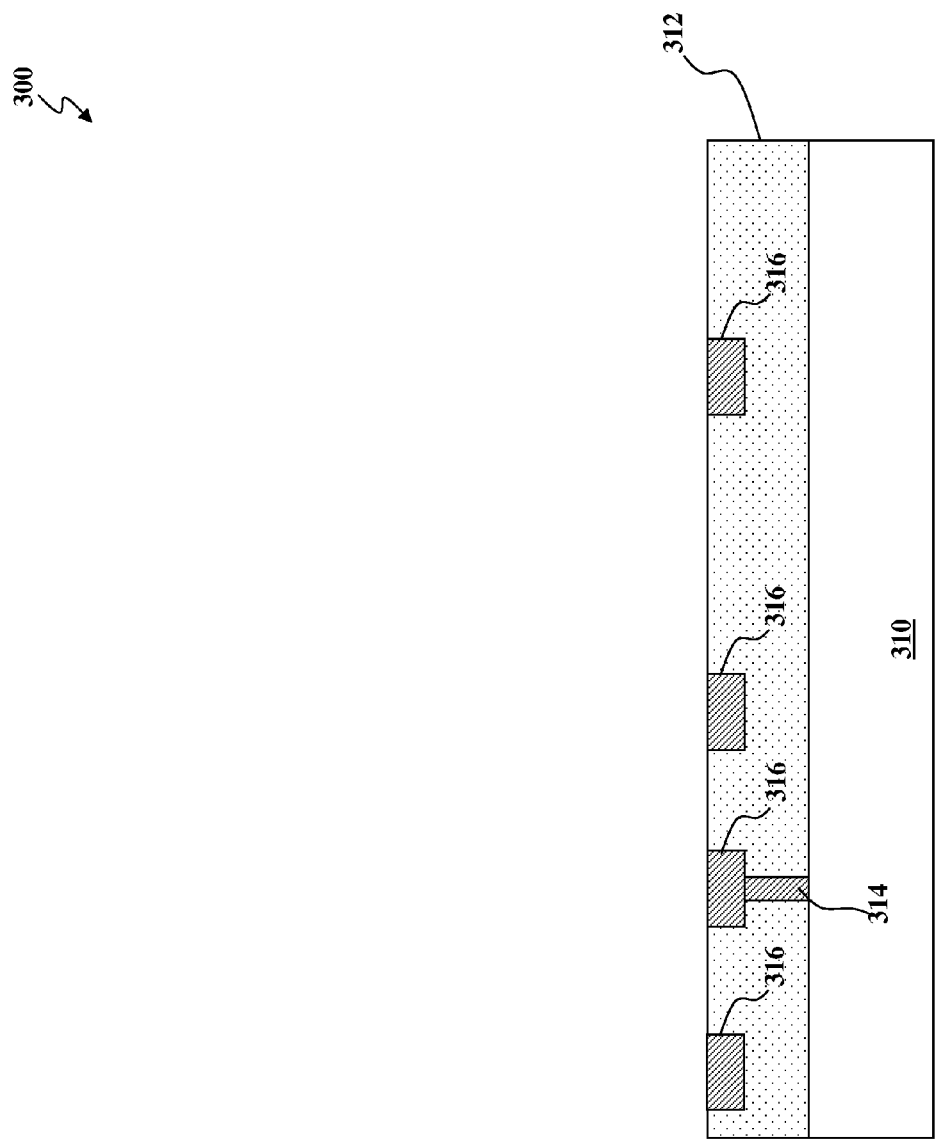
FIGS. 5-14 illustrate diagrammatic cross-sectional side views of one embodiment of a multilayer device at various stages of fabrication, according to the method of FIG. 1.

Referring to FIG. 5, multilayer device 300 includes a substrate 310. The substrate 310 (e.g., wafer) is a bulk silicon substrate. Alternatively, the substrate 310 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 310 includes a silicon-on-insulator (SOI) substrate. The SOI substrate can be fabricated using separation by implantation of oxygen (SIMOX), wafer bonding, and/or other suitable methods. The substrate 310 may include various devices and various features according to the various devices. For example, where the substrate 310 includes a field effect transistor device, various doped regions may be present to define source/drain regions. Likewise, where the substrate 310 includes any other device various features may be present to provide functionality or connection to the device.

Still referring to FIG. 5, the substrate 310 further includes a first interlayer dielectric (ILD1) layer 312. Formed within the ILD1 layer 312 is a via 314 used to interconnect various devices of the substrate 310 with the first metal (M1) layer 316. The M1 layer 316 includes a plurality of lines used to provide connection between the various devices of the substrate 310 and other layers/devices of the multilayer device 300. The ILD1 layer 312 may include silicon oxide, silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD1 layer 312 may be formed by any suitable processing including chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6).

Still referring to FIG. 5, the via 314 and the M1 layer 316 may be formed by first patterning a photoresist/hard mask and etching the ILD1 layer 312 to define the location of the via 314 and then patterning another photoresist/hard mask and etching the ILD1 layer 312 to define the location of the M1 layer 316 within the ILD1 layer 312. After which, a conductive material, in the present embodiment a metal, is deposited within the etched portion. The conductive material may include aluminum, copper, aluminum alloy, copper alloy, aluminum/silicon/copper alloy, titanium, titanium nitride, tantalum, tantalum nitride, tungsten, polysilicon, metal silicide, combinations thereof, or any suitable conductive material.

Figure 6:
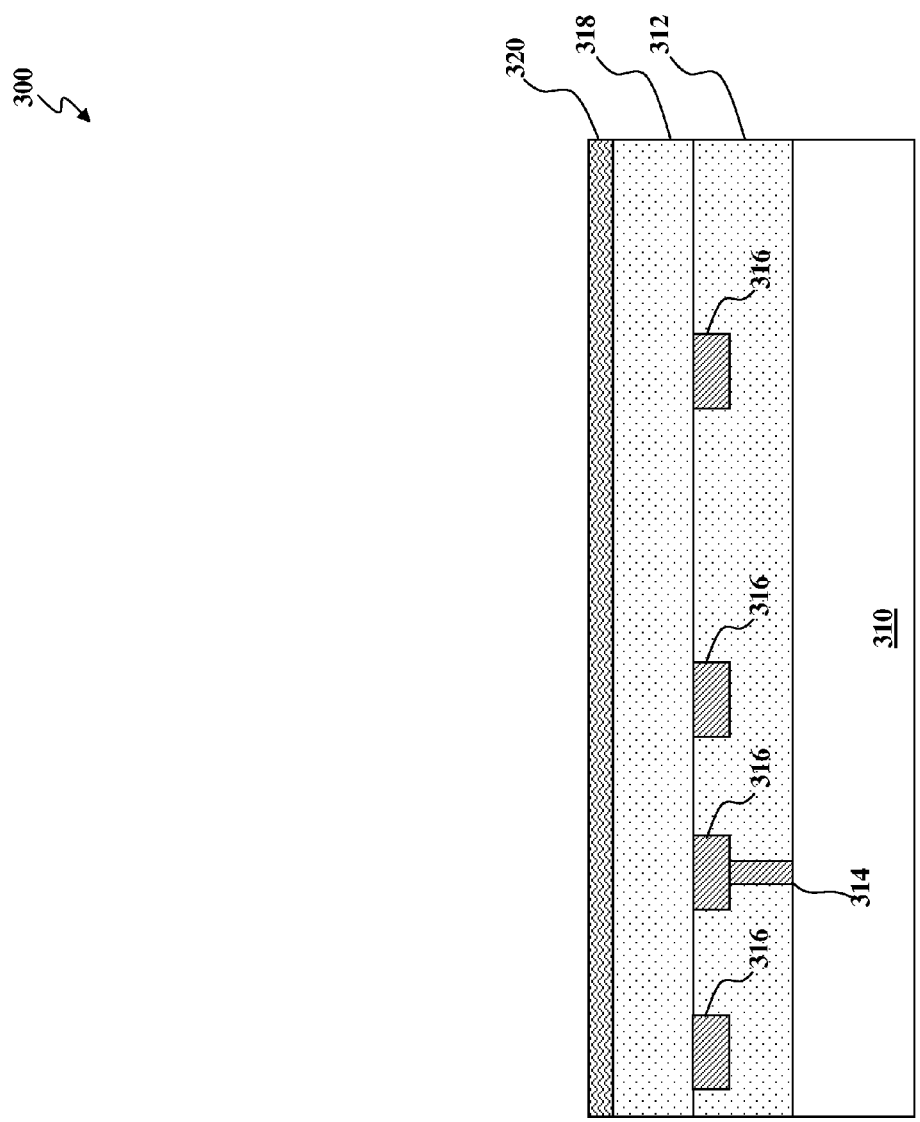

Referring to FIG. 6, formed over the ILD1 layer 312 is a second interlayer dielectric (ILD2) layer 318 and a first photoresist layer 320 is formed over the ILD2 layer 318. The ILD2 layer 318 may include silicon oxide, silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD2 layer 318 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6).

Figure 7:
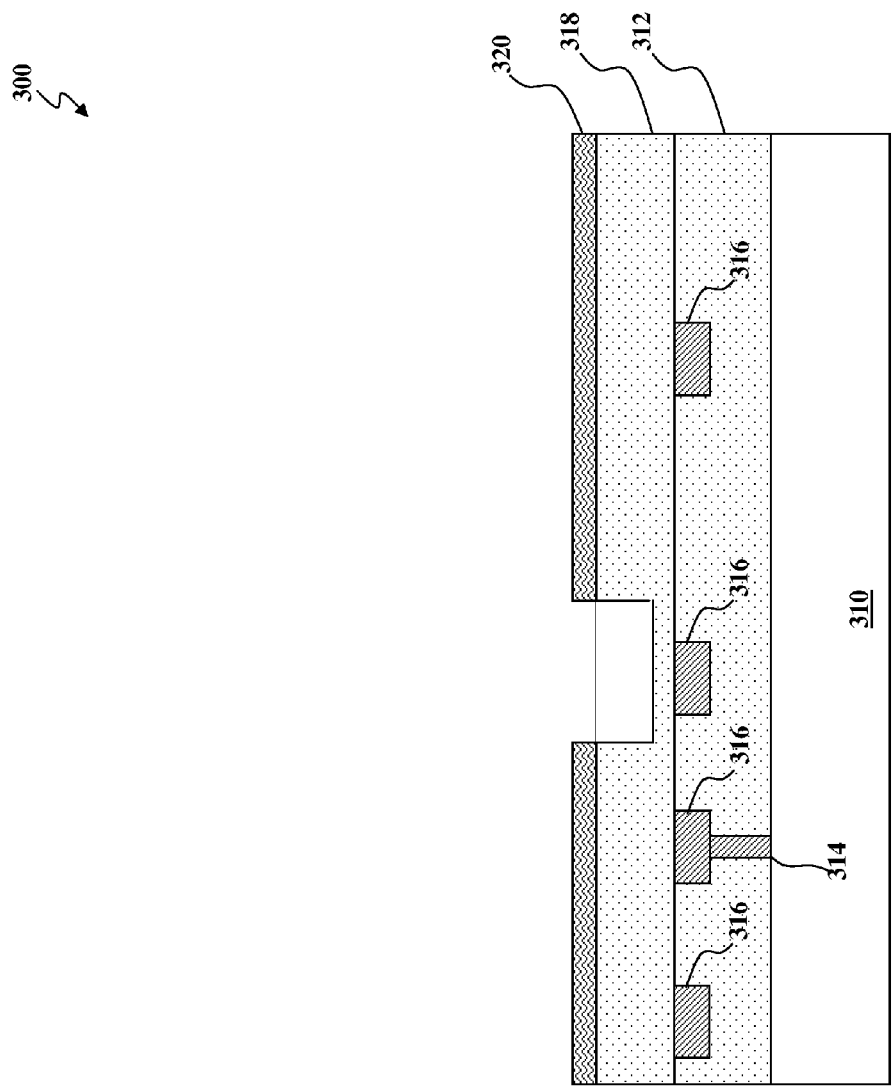

Referring to FIG. 7, the first photoresist layer 320 is patterned over the ILD2 layer to define a block layer. Patterning the first photoresist layer 320 includes exposing the first photoresist layer 320 to a pattern, performing a post-exposure bake process, and developing the photoresist layer thereby forming a patterned first photoresist layer 320. The patterning may also be implemented or replaced by other proper methods, such as maskless photolithography, electron-beam writing, ion-beam writing, and molecular imprint.

Still referring to FIG. 7, after the first photoresist layer 320 has been patterned, the ILD2 layer 318 is etched and the ILD2 layer 318 is protected using the first photoresist layer 320 to define a block layer region within the ILD2 layer 318. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 8:
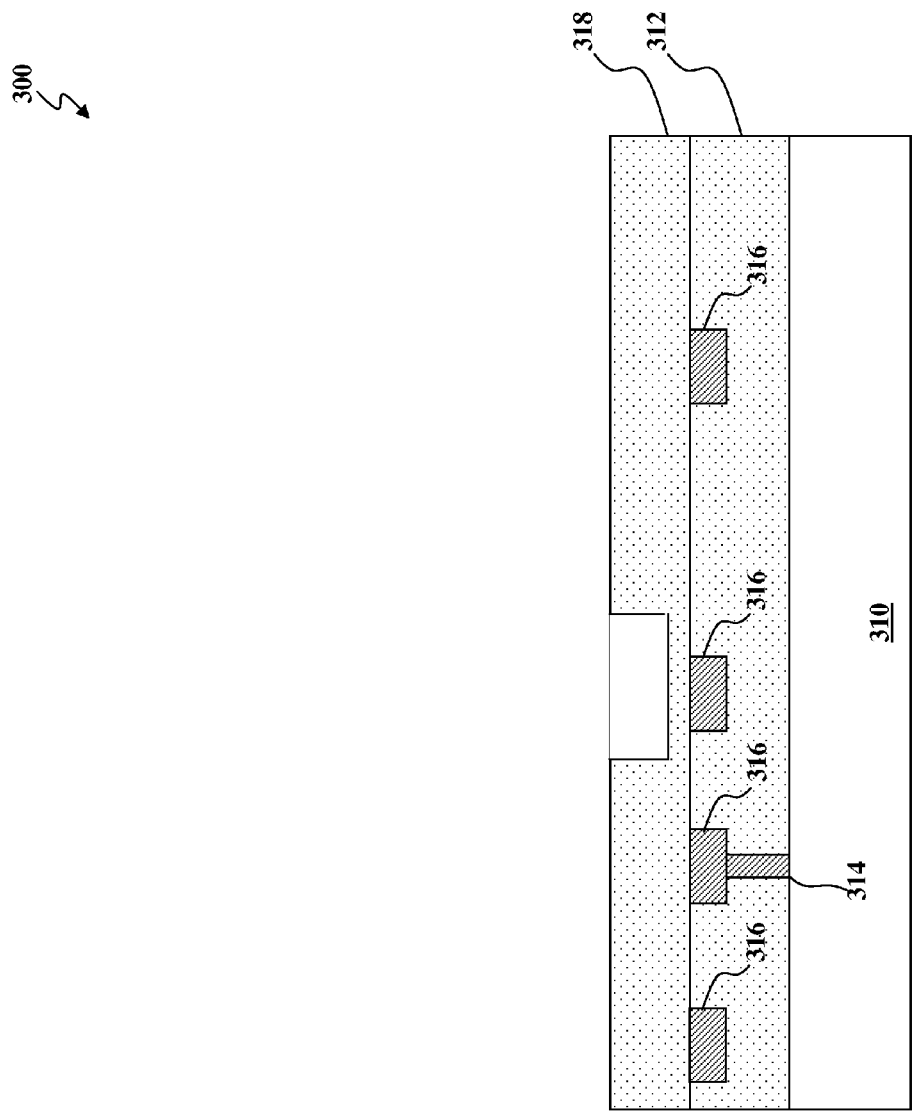

Referring to FIG. 8, after the etching process, the first photoresist layer 320 is removed by any suitable process. For example, the first photoresist layer 320 may be removed by a liquid "resist stripper", which chemically alters the resist so that it no longer adheres to the underlying ILD2 layer 318. Alternatively, first photoresist layer 320 may be removed by a plasma containing oxygen, which oxidizes it, or any suitable process.

Figure 9:
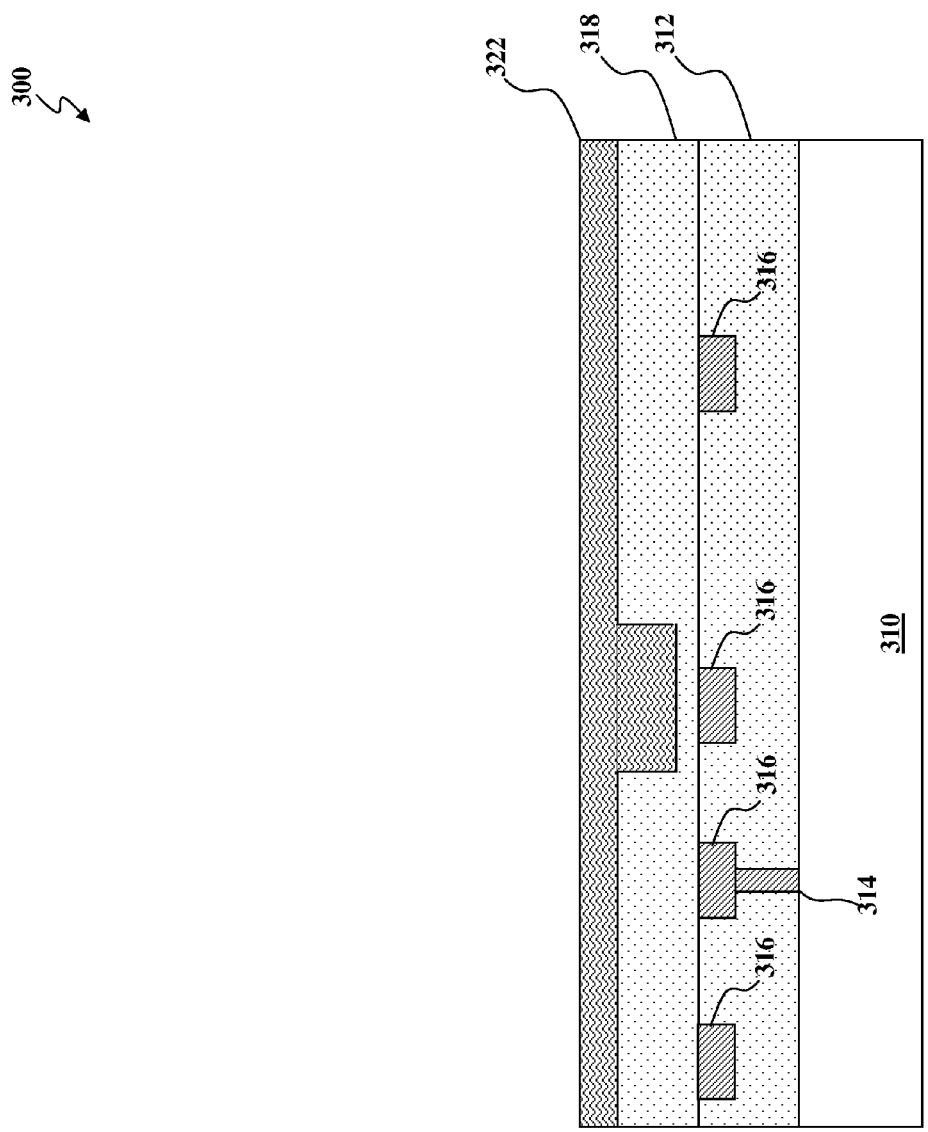
Figure 10:
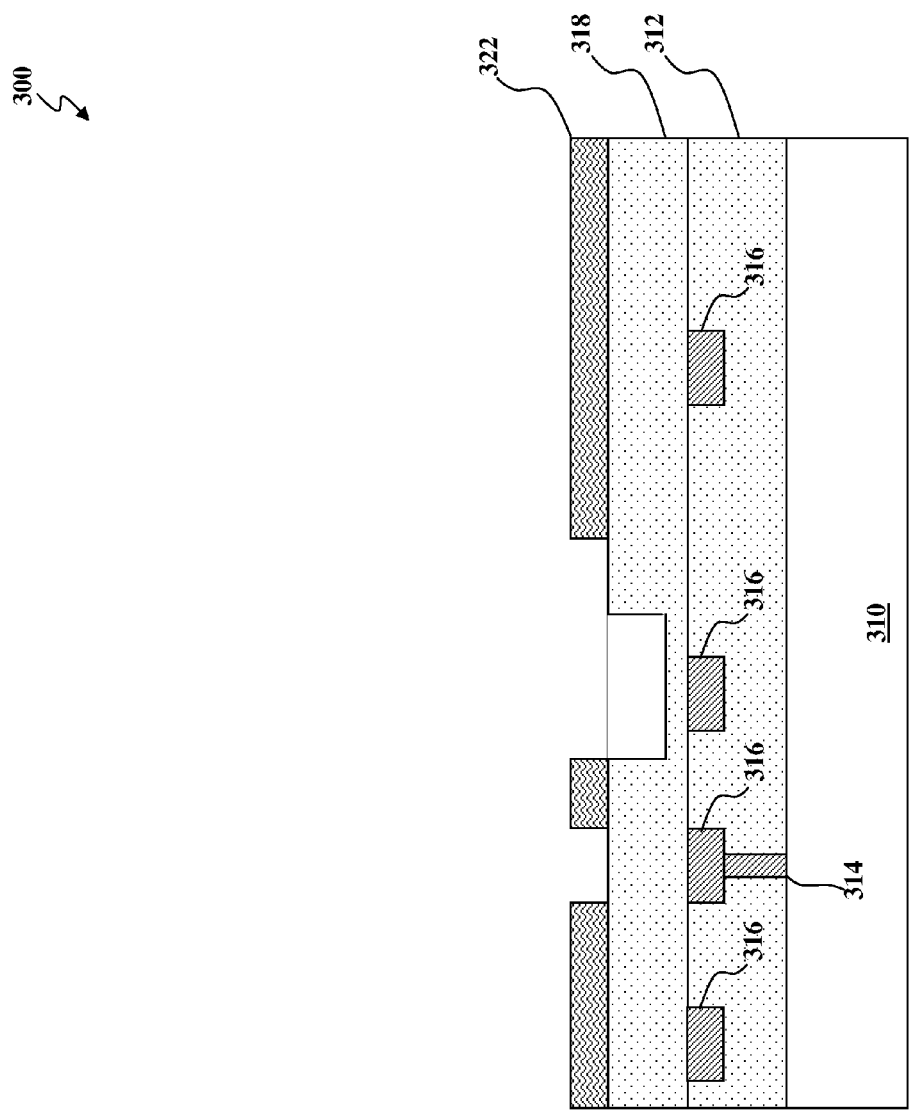

Referring to FIG. 9, a second photoresist layer 322 is formed over the ILD2 layer 318. Referring to FIG. 10, the second photoresist layer 322 is patterned over the ILD2 layer to define a M2 layer where the ILD2 layer 322 will be subsequently etched. Patterning the second photoresist layer 322 includes exposing the second photoresist layer 322 to a pattern, performing a post-exposure bake process, and developing the photoresist layer thereby forming a patterned second photoresist layer 322. The patterning may also be implemented or replaced by other proper methods, such as maskless photolithography, electron-beam writing, ion-beam writing, and molecular imprint.

Figure 11:
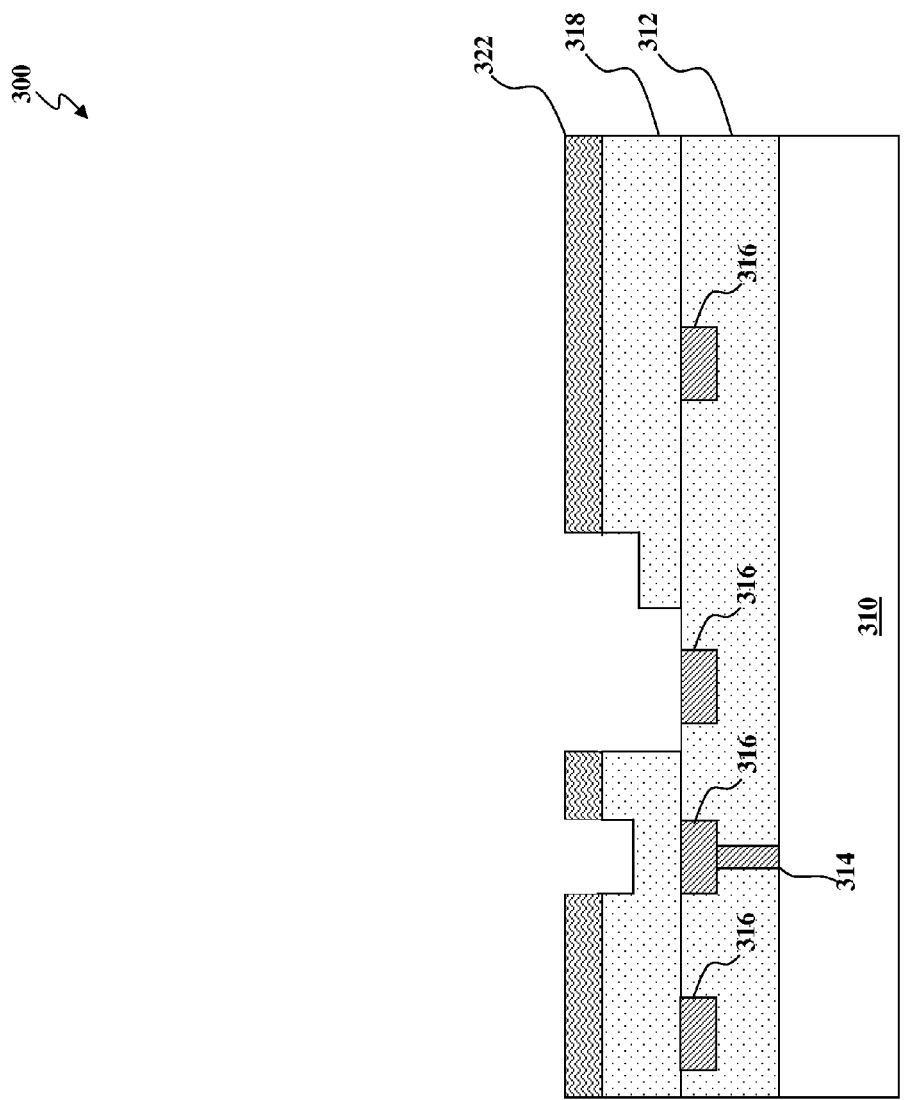

Referring to FIG. 11, after the second photoresist layer 322 has been patterned, the ILD2 layer 318 is etched using the second photoresist layer 322 to further define a M2 layer region within the ILD2 layer 318 and uncover a top surface of the M1 layer 316. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 12:
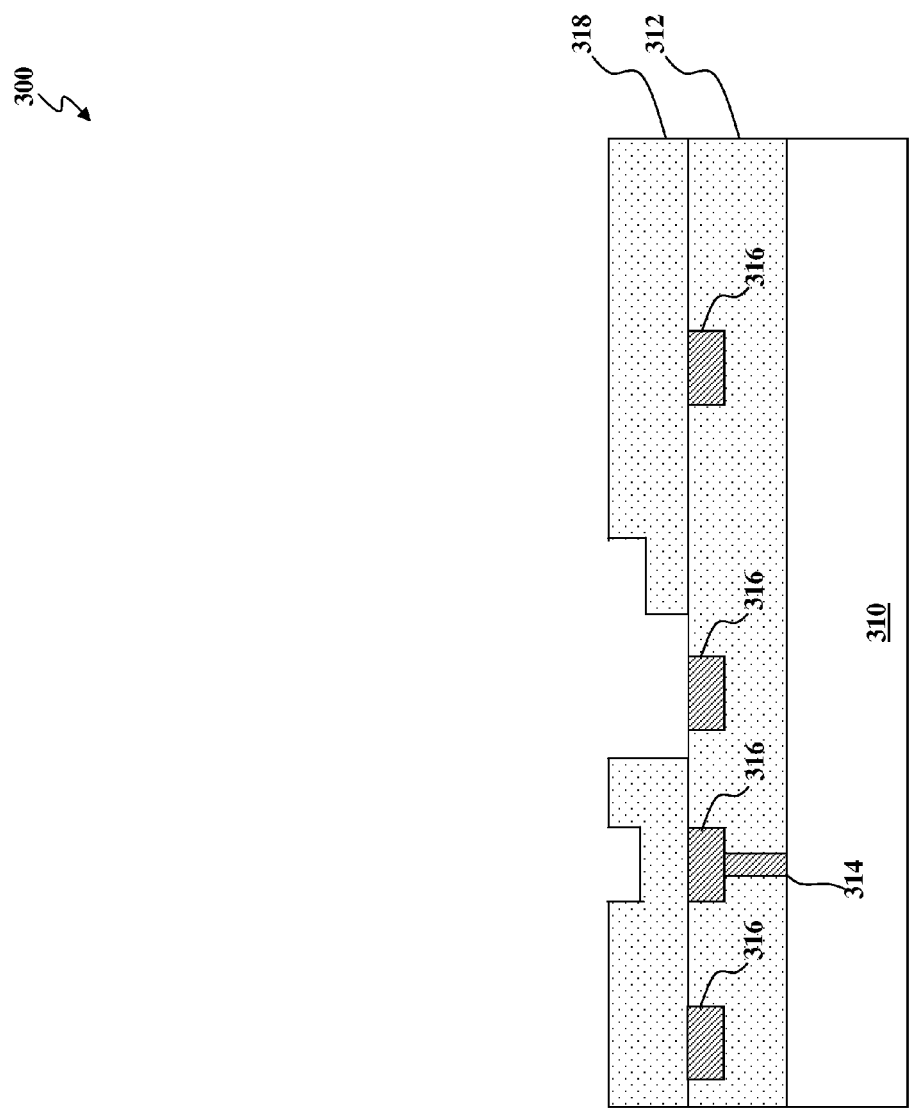

Referring to FIG. 12, after the etching process, the second photoresist layer 322 is removed by any suitable process. For example, the second photoresist layer 322 may be removed by a liquid "resist stripper", which chemically alters the resist so that it no longer adheres to the underlying ILD2 layer 318. Alternatively, second photoresist layer 322 may be removed by a plasma containing oxygen, which oxidizes it, or any suitable process.

Figure 13:
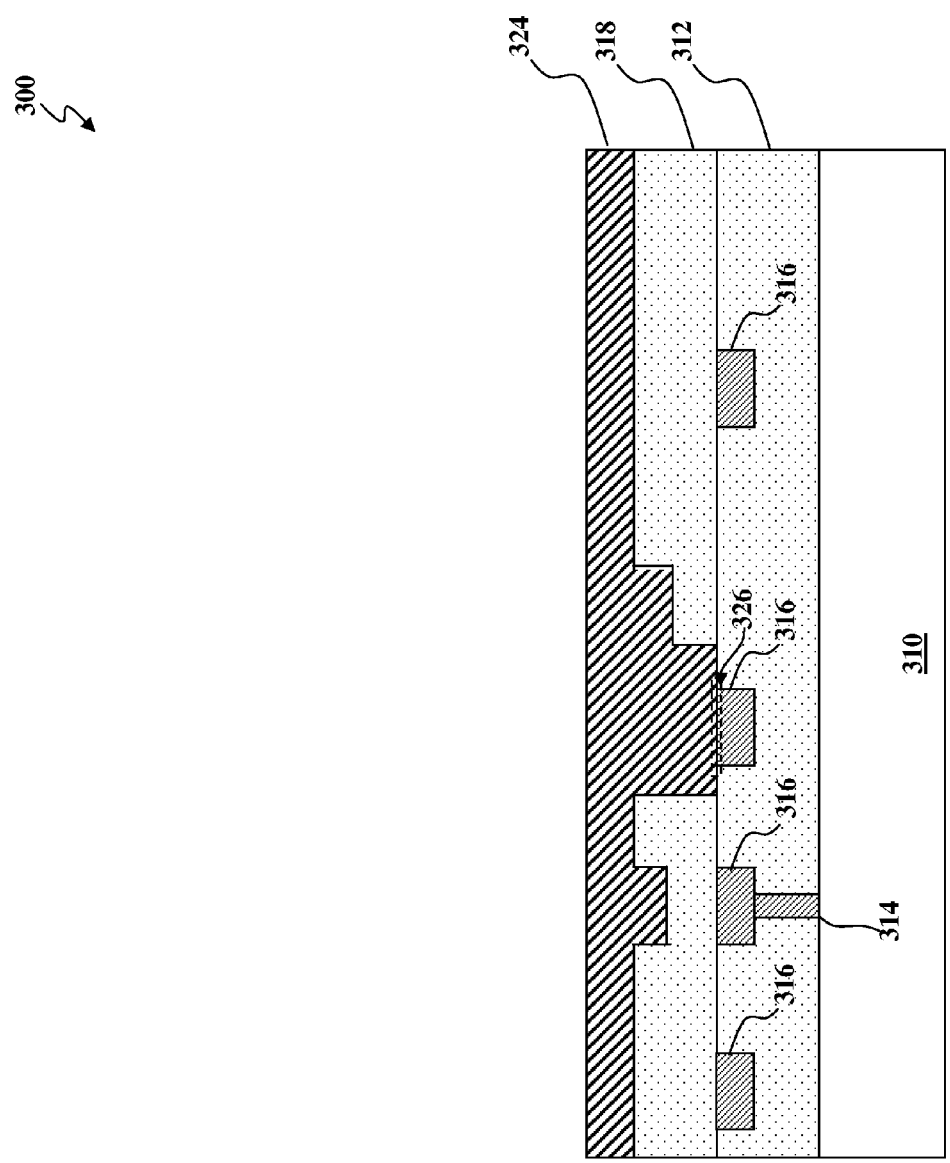

Referring to FIG. 13, a second metal (M2) layer 324 is formed for connecting to the M1 layer 314 and other devices/features of the multilayer device 300. The M2 layer 324 is formed by depositing a conductive material over the M2 layer region (that was etched) within the ILD2 layer 318 and over the uncovered top surface of the M1 layer 316 such that a self-aligned interconnect results between an interface of the M1 and M2 layers 316, 324. The M2 layer 324 may include a metal such as aluminum, copper, aluminum alloy, copper alloy, aluminum/silicon/copper alloy, titanium, titanium nitride, tantalum, tantalum nitride, tungsten, polysilicon, metal silicide, combinations thereof, or any suitable conductive material. The M2 layer 324 may be formed by chemical vapor deposition (CVD), physical vapor deposition (PVD), atomic layer deposition (ALD), high density plasma CVD (HDPCVD), plating, other suitable methods, and/or combinations thereof.

As illustrated, the M2 layer 324 is disposed over the M1 layer 314 and in electrical contact with the M1 layer 316. The interface between at least one line of the M1 layer 316 and the M2 layer 324 forms a self-aligned interconnect 326. The interface forms a self-aligned interconnect 326 because no via is required to be defined between the M1 layer 316 and the M2 layer 323. Further, a blocking portion 328 is defined to block the formation of at least one self-aligned interconnect. In the present embodiment, the M1 layer 316 and the M2 layer 324 are in direct and electrical contact. In alternative embodiments, a material is interposed between the two layers to provide electrical contact between the self-aligned interconnect of the M1 layer 316 and the M2 layer 324.

Figure 14:
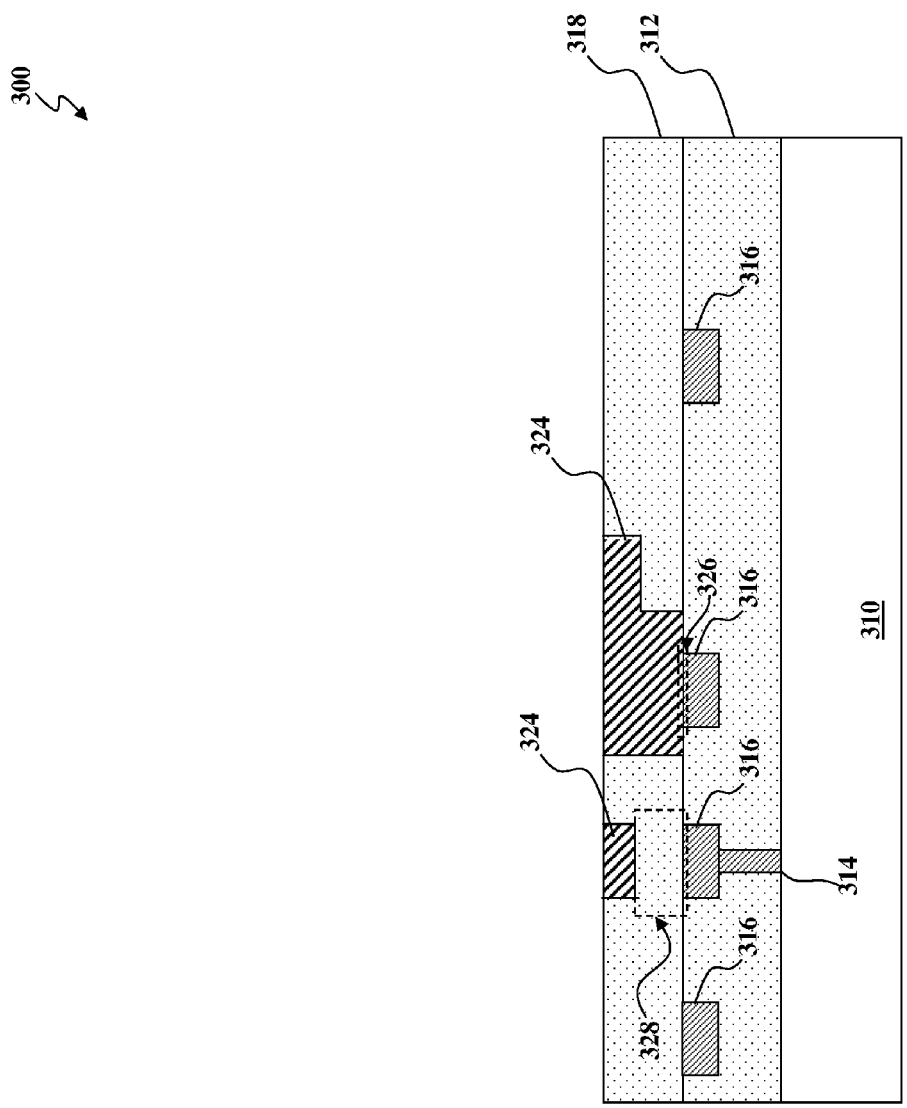

Referring to FIG. 14, the surface of the multilayer device 300 is planarized by any suitable process that removes excess material of the M2 layer 324. In embodiments, where the second photoresist layer 322 has not been removed (as illustrated in FIG. 11), the planarizing process also removes the second photoresist layer 322. The planarizing process may be a chemical mechanical polishing (CMP) process or any suitable process.

Figure 15:
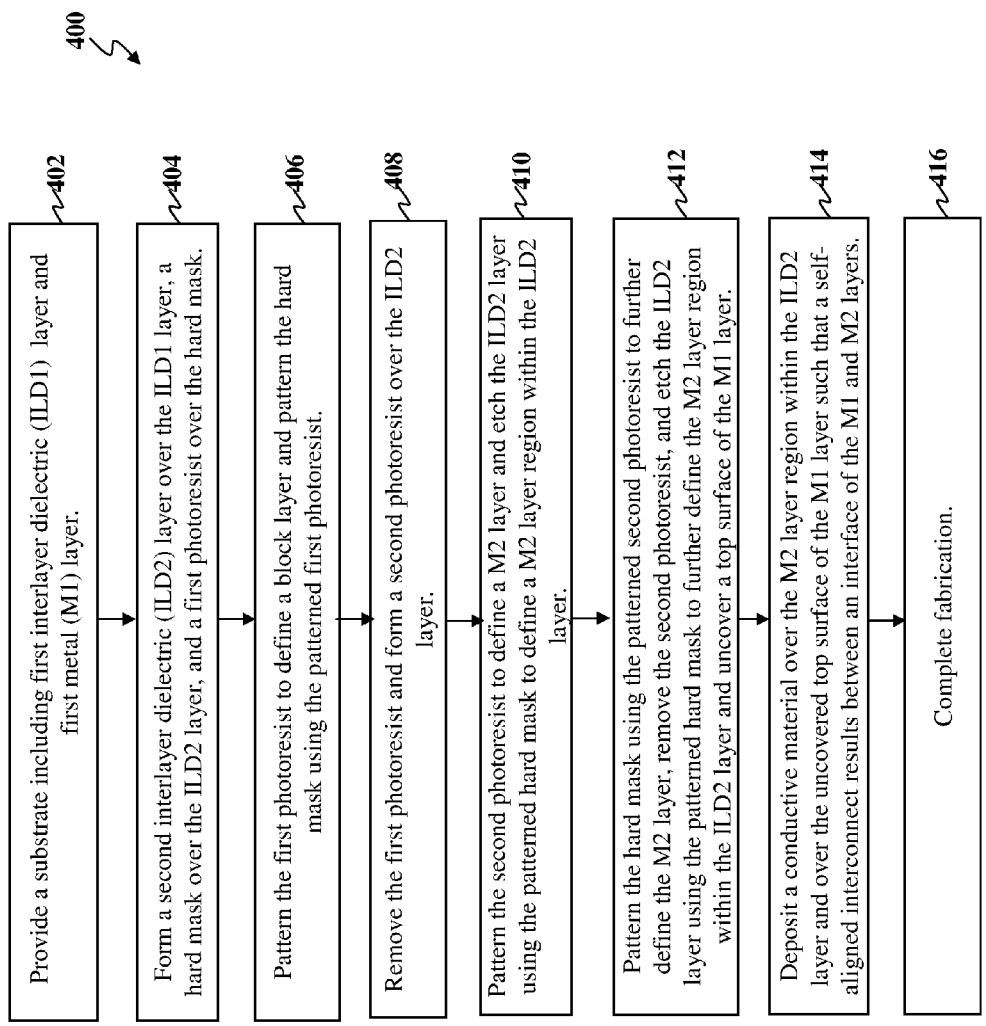
FIG. 15 is a flowchart illustrating a method of fabricating a multilayer device according to various aspects of the present disclosure.

Referring to FIG. 15, a method 400 for fabricating a semiconductor device is described according to various aspects of the present disclosure. The embodiment of method 400 may include similar process steps as an embodiment of the method 100 which is disclosed above. In disclosing the embodiment of method 400, some details regarding processing and/or structure may be skipped for simplicity if they are similar to those described in the embodiment of method 100.

Still referring to FIG. 15, in the present embodiment, the method 400 is for fabricating a multilayer integrated circuit device. The method 400 begins at block 402 where a substrate including first interlayer dielectric (ILD1) layer and first metal (M1) layer is provided. At block 404, a second interlayer dielectric (ILD2) layer is formed over the ILD1 layer, a hard mask is formed over the ILD2 layer, and a first photoresist is formed over the hard mask. The method continues with block 406 where the first photoresist is patterned to define a block layer and the hard mask is patterned using the patterned first photoresist. The method continues with block 408 where the first photoresist is removed and a second photoresist is formed over the ILD2 layer. At block 410, the second photoresist layer is patterned to define a M2 layer and the ILD2 layer is etched using the patterned hard mask to define a M2 layer region within the ILD2 layer. At block 412, hard mask is further patterned using the patterned second photoresist to further define the M2 layer, the second photoresist is removed, and the ILD2 layer is etched using the patterned hard mask to further define the M2 layer region within the ILD2 layer and uncover a top surface of the M1 layer. At block 414, a conductive material is deposited over the M2 layer region within the ILD2 layer and over the uncovered top surface of the M1 layer such that a self-aligned interconnect results between an interface of the M1 and M2 layers. A planarizing process may be performed to remove excess M2 layer material, thus planarizing the top surface of the multilayer device. In alternative embodiments, the second photoresist is not removed prior to formation of the M2 layer, but rather it is also removed by the planarizing process that is performed to remove excess M2 layer material. The method 400 continues with block 416 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes on two conductive layers (e.g., M1 and M2) more than two conducive layers are contemplated. Additional steps can be provided before, during, and after the method 400, and some of the steps described can be replaced or eliminated for other embodiments of the method. The discussion that follows illustrates various embodiments of a multilayer device that can be fabricated according to the method 400 of FIG. 15.

FIGS. 16-25 illustrate diagrammatic cross-sectional side views of one embodiment of a multilayer device 500 at various stages of fabrication, according to the method of FIG. 15. The semiconductor device 500 of FIGS. 16-25 is similar in certain respects to the semiconductor device 300 of FIGS. 5-14. Accordingly, similar features in FIGS. 5-14 and FIGS. 16-25 are identified by the same reference numerals for clarity and simplicity. It is understood that the multilayer device 500 may include various other devices and features, such as other types of transistors such as bipolar junction transistors, resistors, capacitors, diodes, fuses, etc., Accordingly, FIGS. 16-25 have been simplified for the sake of clarity to better understand the inventive concepts of the present disclosure. Additional features can be added in the multilayer device 500, and some of the features described below can be replaced or eliminated in other embodiments of the multilayer device 500.

Figure 16:
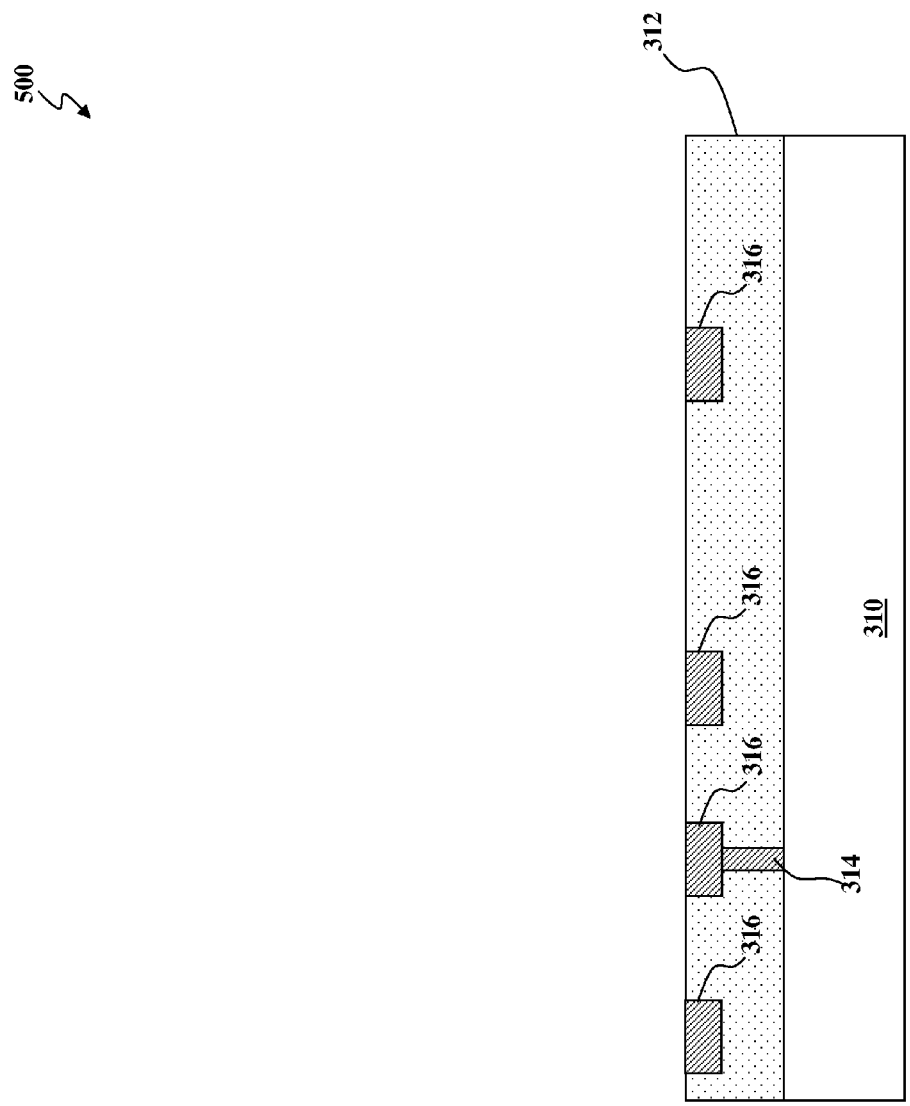
FIGS. 16-25 illustrate diagrammatic cross-sectional side views of one embodiment of a multilayer device at various stages of fabrication, according to the method of FIG. 15.

Referring to FIG. 16, a diagrammatic cross-sectional side view of multilayer device 500 is illustrated. The multilayer device 500 includes a substrate 310. In the present embodiment, the substrate 310 defined in the multilayer device 500 is substantially similar to the substrate 310 of the multilayer device 300 in terms of material composition and formation. In an alternative embodiment, they are different.

Still referring to FIG. 16, the substrate 310 further includes a first interlayer dielectric (ILD1) layer 312. In the present embodiment, the ILD1 layer 312 defined in the multilayer device 500 is substantially similar to the ILD1 layer 312 of the multilayer device 300 in terms of material composition and formation. In an alternative embodiment, they are different. Formed within the ILD1 layer 312 is a via 314 and a first metal (M1) layer 316. In the present embodiment, the via 314 and the M1 layer 316 defined in the multilayer device 500 is substantially similar to the via 314 and the M1 layer 316 of the multilayer device 300 in terms of material composition and formation. In an alternative embodiment, they are different.

Figure 17:
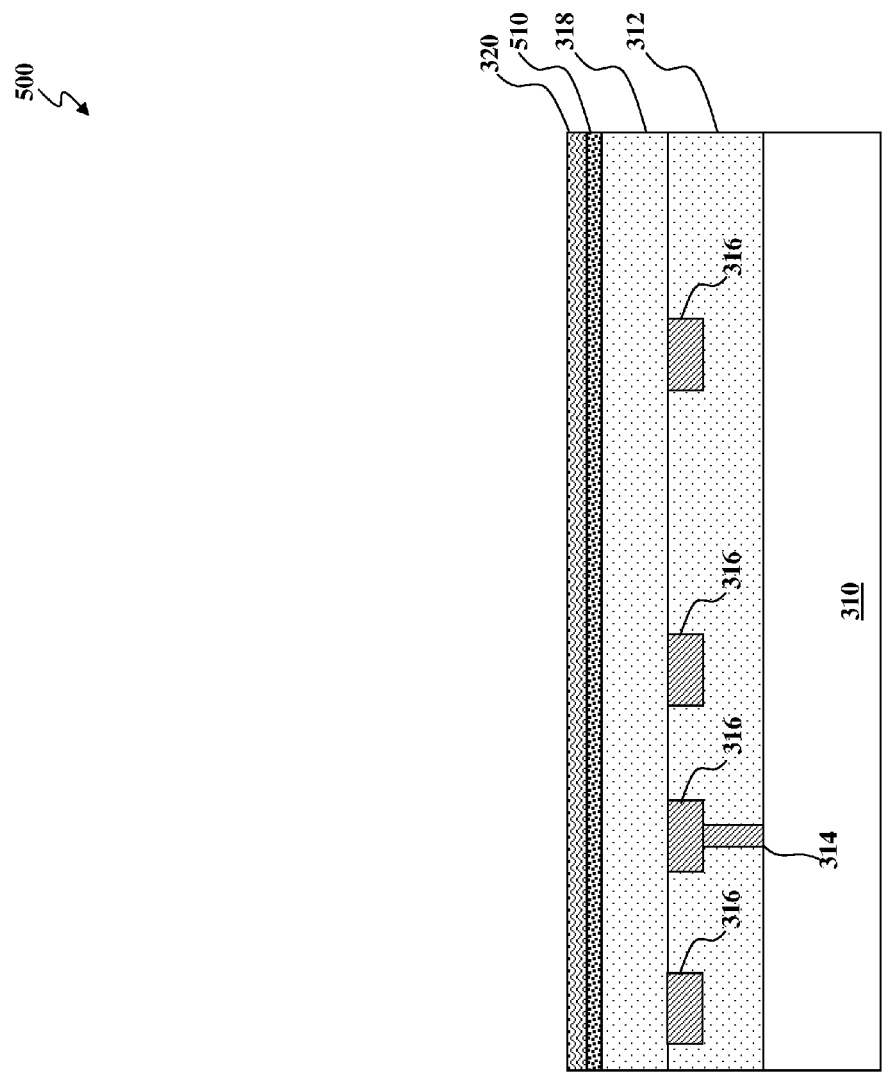

Referring to FIG. 17, formed over the ILD1 layer 312 is a second interlayer dielectric (ILD2) layer 318. In the present embodiment, the ILD2 layer 318 defined in the multilayer device 500 is substantially similar to the ILD2 layer 318 of the multilayer device 300 in terms of material composition and formation. In an alternative embodiment, they are different.

Still referring to FIG. 17, formed over the ILD2 layer 318 is a hard mask 510. Forming the hard mask 510 includes, for example, depositing a material over the ILD2 layer 316 using a CVD process. The material may include, for example, oxide, nitride, or other suitable material. In various examples, the hard mask 510 can be formed by atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis (TertiaryButylAmino) Silane (BTBAS or $C_8H_{22}N_2Si$) and Disilane (DS or $Si_2H_6$). Formed over the hard mask 510 is a first photoresist layer 320. In the present embodiment, the first photoresist layer 320 defined in the multilayer device 500 is substantially similar to the first photoresist layer 320 of the multilayer device 300 in terms of material composition and formation. In an alternative embodiment, they are different.

Figure 18:
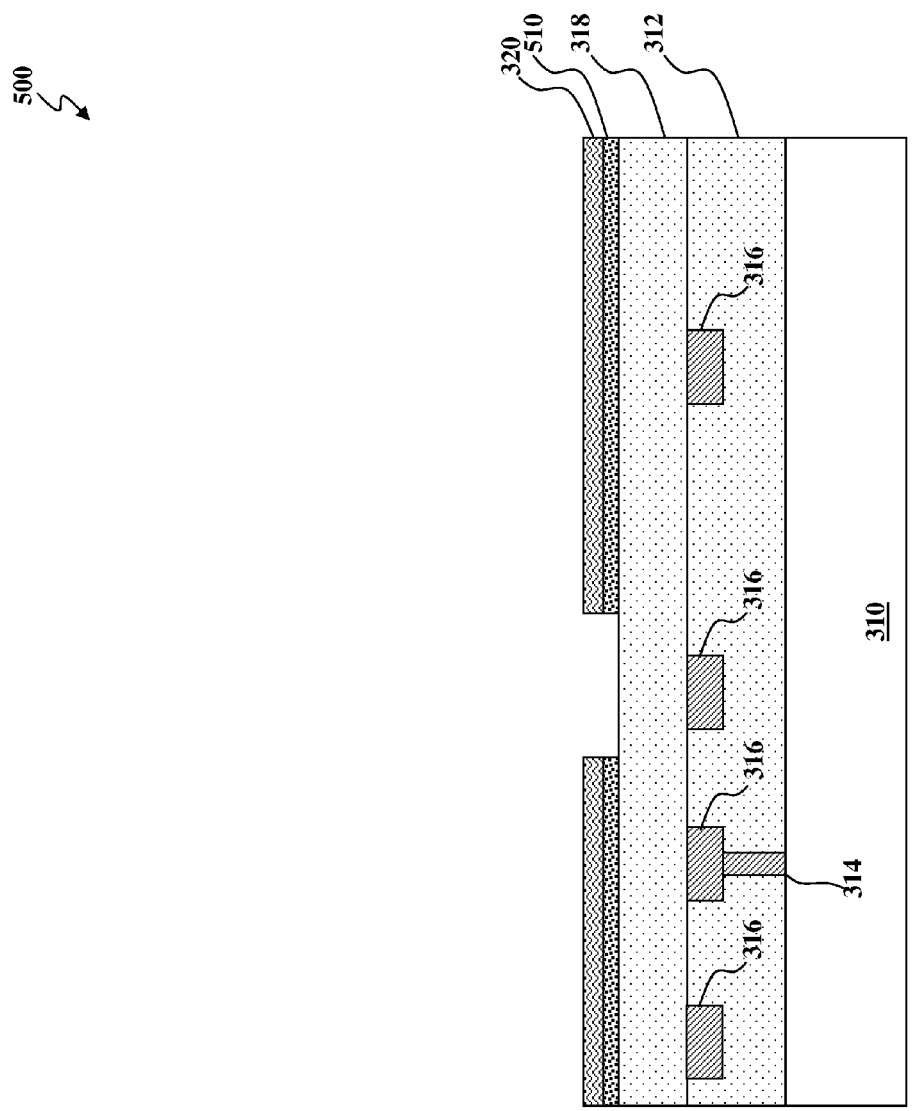

Referring to FIG. 18, the first photoresist layer 320 is patterned to define regions where the hard mask 510 and the ILD2 layer 318 will be subsequently etched. Patterning the first photoresist layer 320 includes exposing the first photoresist layer 320 to a pattern, performing a post-exposure bake process, and developing the photoresist layer thereby forming a patterned first photoresist layer 320. The patterning may also be implemented or replaced by other proper methods, such as maskless photolithography, electron-beam writing, ion-beam writing, and molecular imprint.

Still referring to FIG. 18, the hard mask 510 is patterned using the patterned first photoresist layer 320. Patterning the hard mask 510 includes an etching process. The etching process can include a wet etching process, a dry etching process, or a combination thereof. In one example, a dry etching process used to etch the hard mask may include a chemistry including fluorine-containing gas. In furtherance of the example, the chemistry of the dry etch includes $CF_4$, $SF_6$, or $NF_3$.

Figure 19:
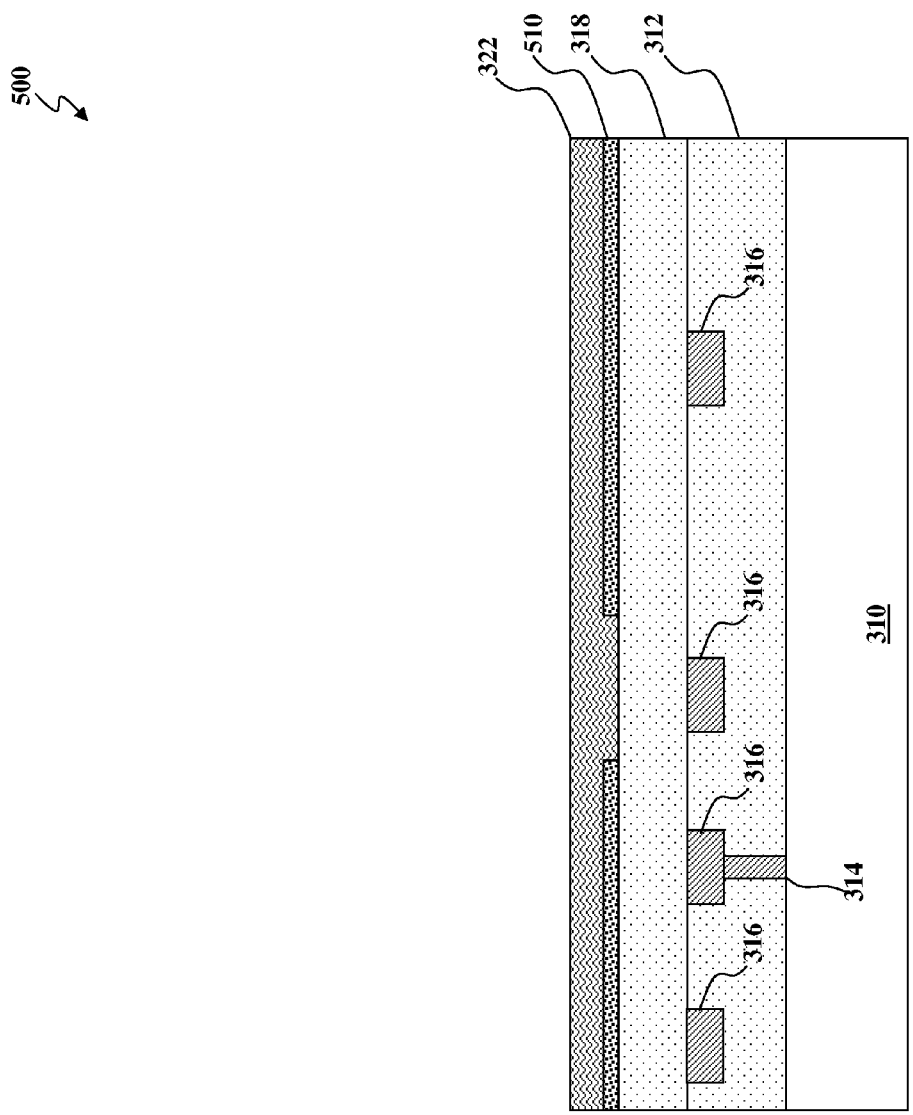

Referring to FIG. 19, after the hard mask 510 patterning process, the first photoresist layer 320 may be removed by any suitable process. For example, the first photoresist layer 320 may be removed by a liquid "resist stripper", which chemically alters the resist so that it no longer adheres to the underlying hard mask. Alternatively, first photoresist layer 320 may be removed by a plasma containing oxygen, which oxidizes it. After removing the first photoresist layer 320, a second photoresist layer 322 is formed over the hard mask 510. In the present embodiment, the second photoresist layer 322 defined in the multilayer device 500 is substantially similar to the second photoresist layer 322 of the multilayer device 300 in terms of material composition and formation. In an alternative embodiment, they are different.

Figure 20:
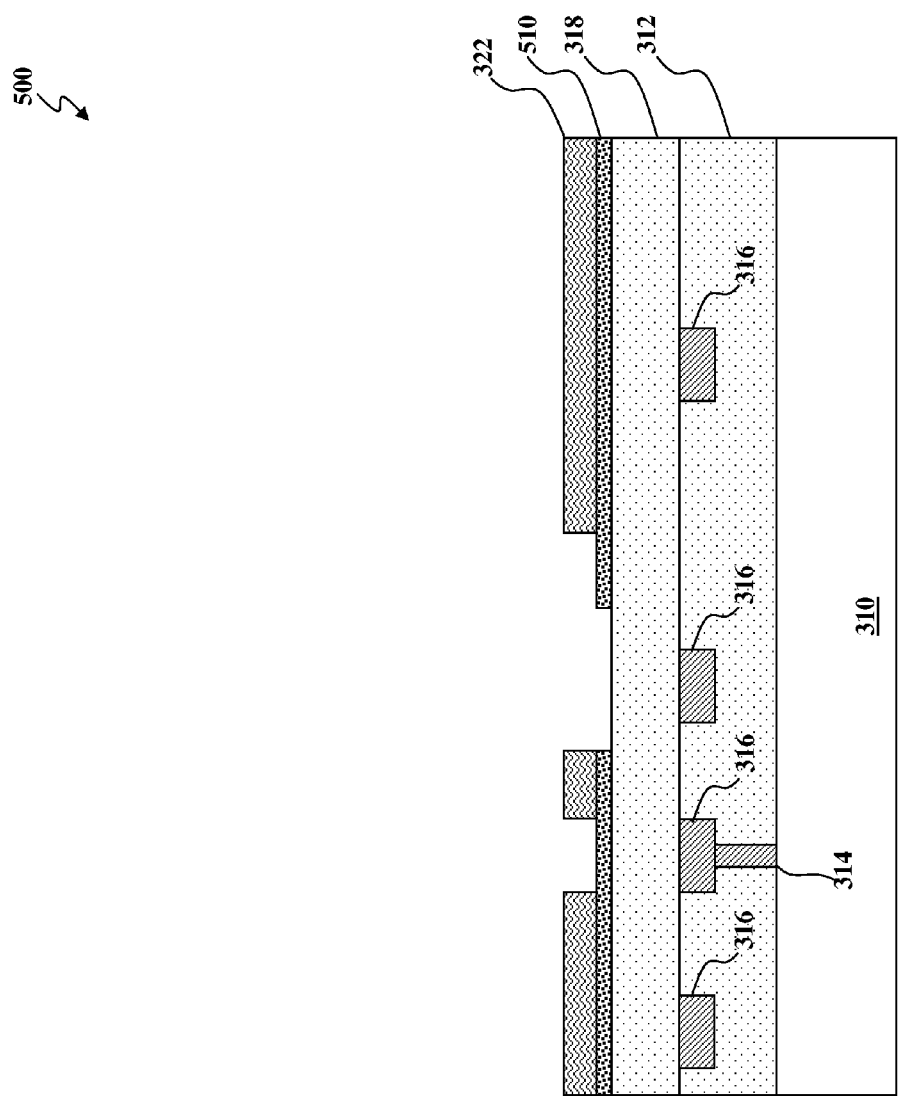

Referring to FIG. 20, the second photoresist layer 322 is patterned to further define regions where the hard mask 510 and the ILD2 layer 318 will be subsequently etched. Patterning the second photoresist layer 322 includes exposing the second photoresist layer 322 to a pattern, performing a post-exposure bake process, and developing the photoresist layer thereby forming a patterned second photoresist layer 322. The patterning may also be implemented or replaced by other proper methods, such as maskless photolithography, electron-beam writing, ion-beam writing, and molecular imprint.

Figure 21:
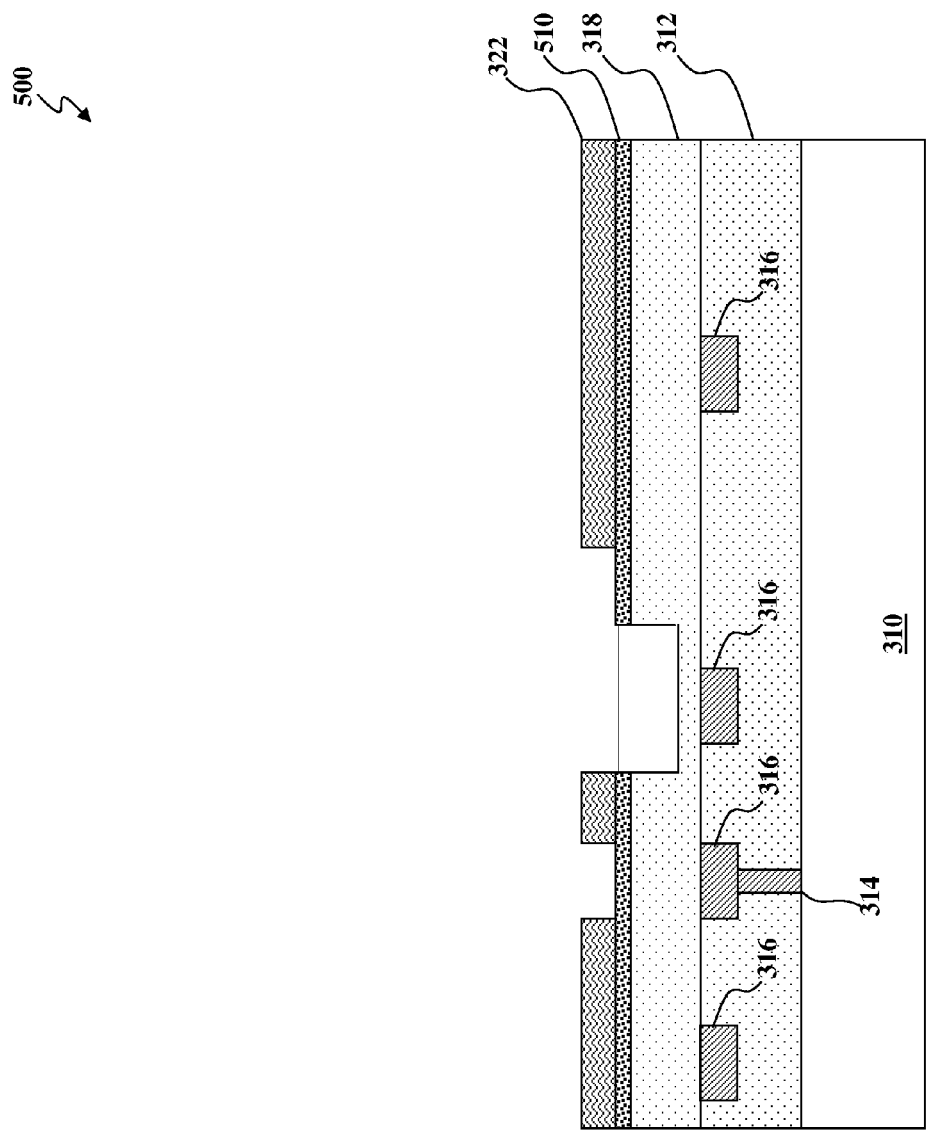

Referring to FIG. 21, the ILD2 layer 318 is etched using the patterned hard mask 510 to define a block layer region within the ILD2 layer 318. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes $CF_4$, $SF_6$, or $NF_3$. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 22:
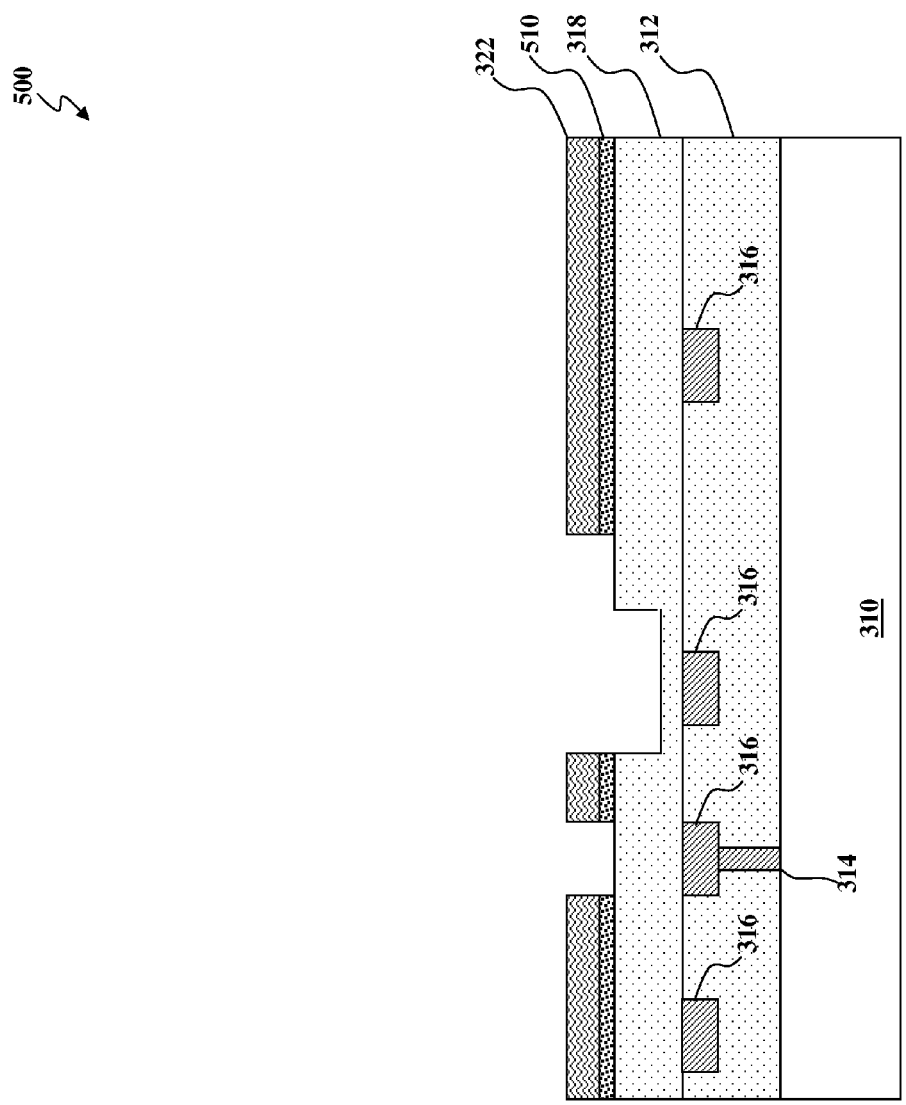

Referring to FIG. 22, the hard mask 510 is further patterned using the patterned second photoresist layer 322 to define a M2 layer. Patterning the hard mask 510 includes an etching process. The etching process can include a wet etching process, a dry etching process, or a combination thereof. In one example, a dry etching process used to etch the hard mask may include a chemistry including fluorine-containing gas. In furtherance of the example, the chemistry of the dry etch includes CF4, SF6, or NF3.

Figure 23:
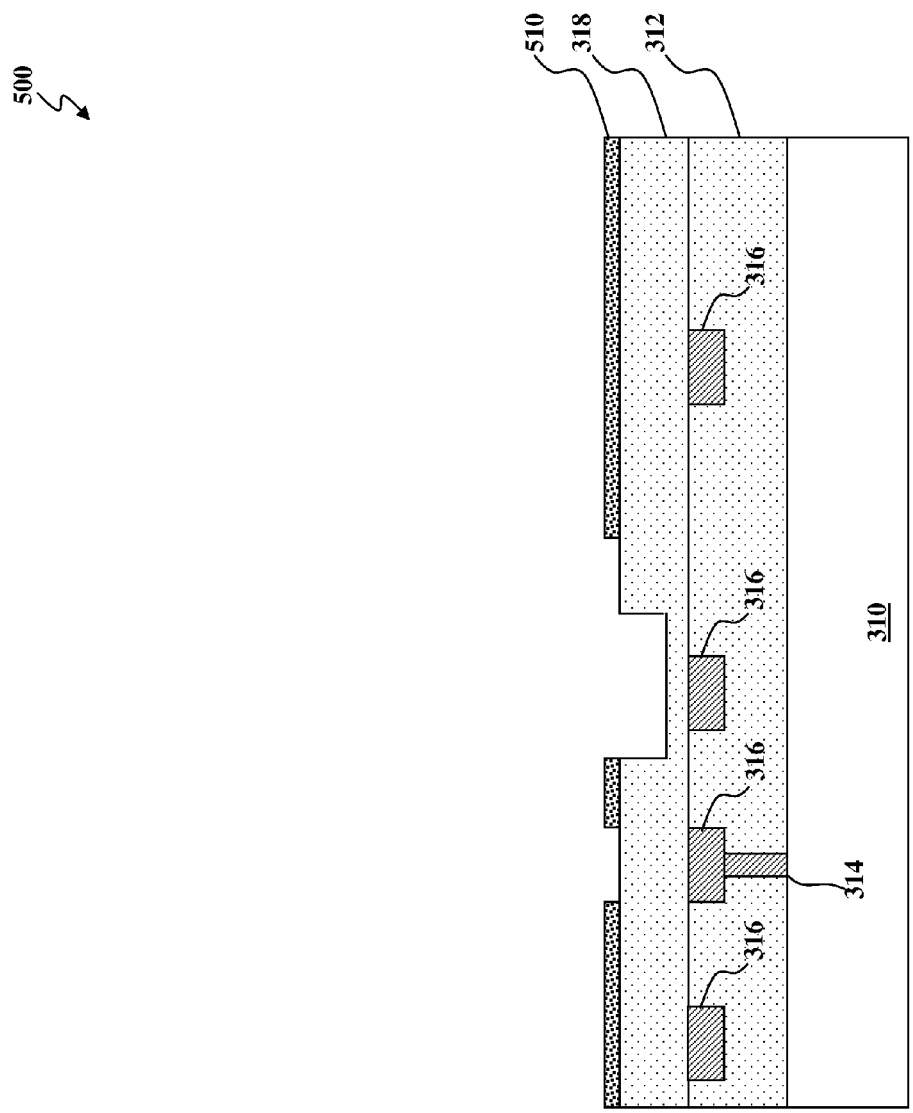

Referring to FIG. 23, after the hard mask 510 patterning process, the second photoresist layer 322 may be removed by any suitable process. For example, the second photoresist layer 322 may be removed by a liquid "resist stripper", which chemically alters the resist so that it no longer adheres to the underlying hard mask. Alternatively, second photoresist layer 322 may be removed by a plasma containing oxygen, which oxidizes it.

Figure 24:
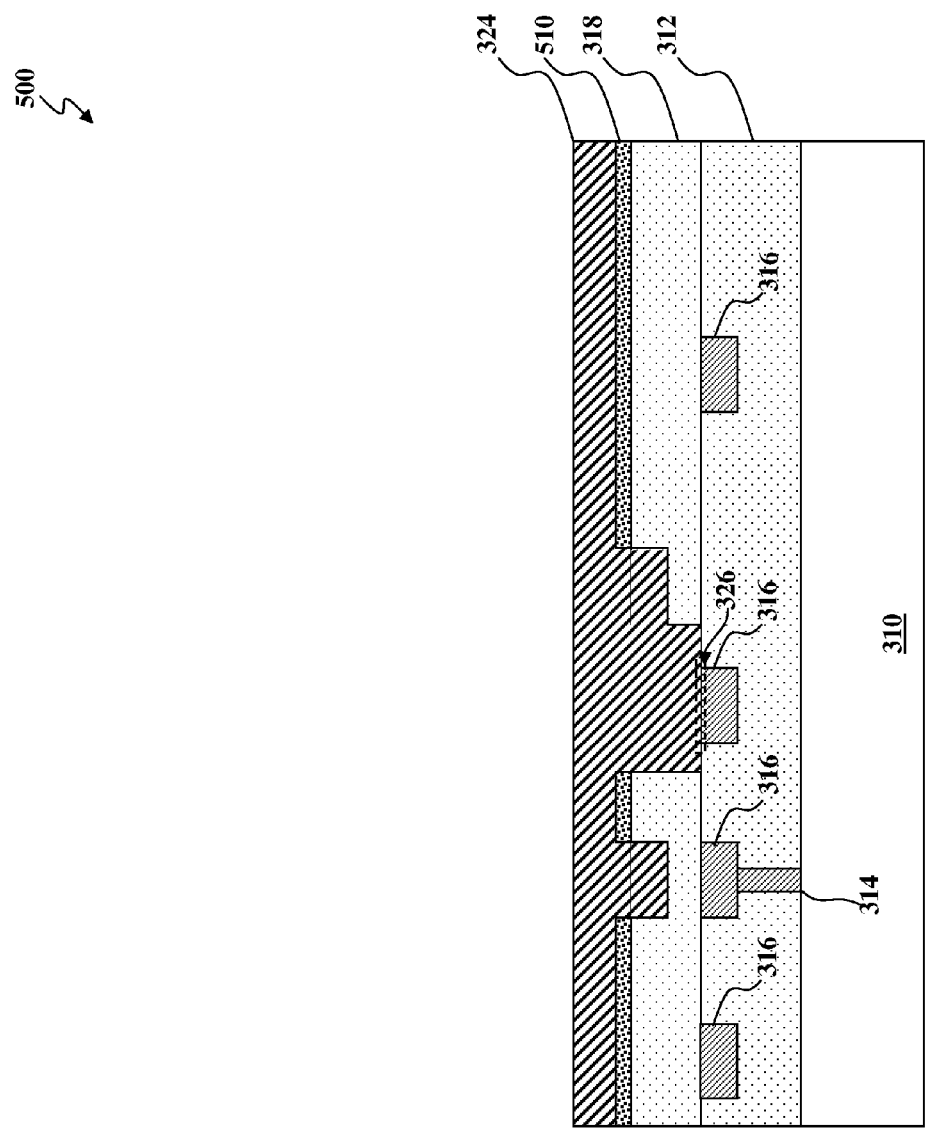

Referring to FIG. 24, the ILD2 layer 318 is further etched using the patterned hard mask 510 to define a M2 layer region within the ILD2 layer 318 and uncover a top surface of the M1 layer 316. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Still referring to FIG. 24, after defining the M2 layer region within the ILD2 layer 318 and uncovering the top surface of the M1 layer 316, a M2 layer 324 is formed over the M2 layer region within the ILD2 layer 318. The M2 layer 324 provides electrical connection to the M1 layer 316 and other devices/features of the multilayer device 500. In the present embodiment, the M2 layer 324 defined in the multilayer device 500 is substantially similar to the M2 layer 324 of the multilayer device 300 in terms of material composition and formation. In an alternative embodiment, they are different.

As illustrated, the M2 layer 324 is disposed over the M1 layer 314 and in electrical contact with the M1 layer 316. The interface between at least one line of the M1 layer 316 and the M2 layer 324 forms a self-aligned interconnect 326. The interface forms a self-aligned interconnect 326 because no via is required to be defined between the M1 layer 316 and the M2 layer 323. Further, a blocking portion 328 is defined to block the formation of at least one self-aligned interconnect. In the present embodiment, the M1 layer 316 and the M2 layer 324 are in direct and electrical contact. In alternative embodiments, a material is interposed between the two layers to provide electrical contact between the self-aligned interconnect of the M1 layer 316 and the M2 layer 324.

Figure 25:
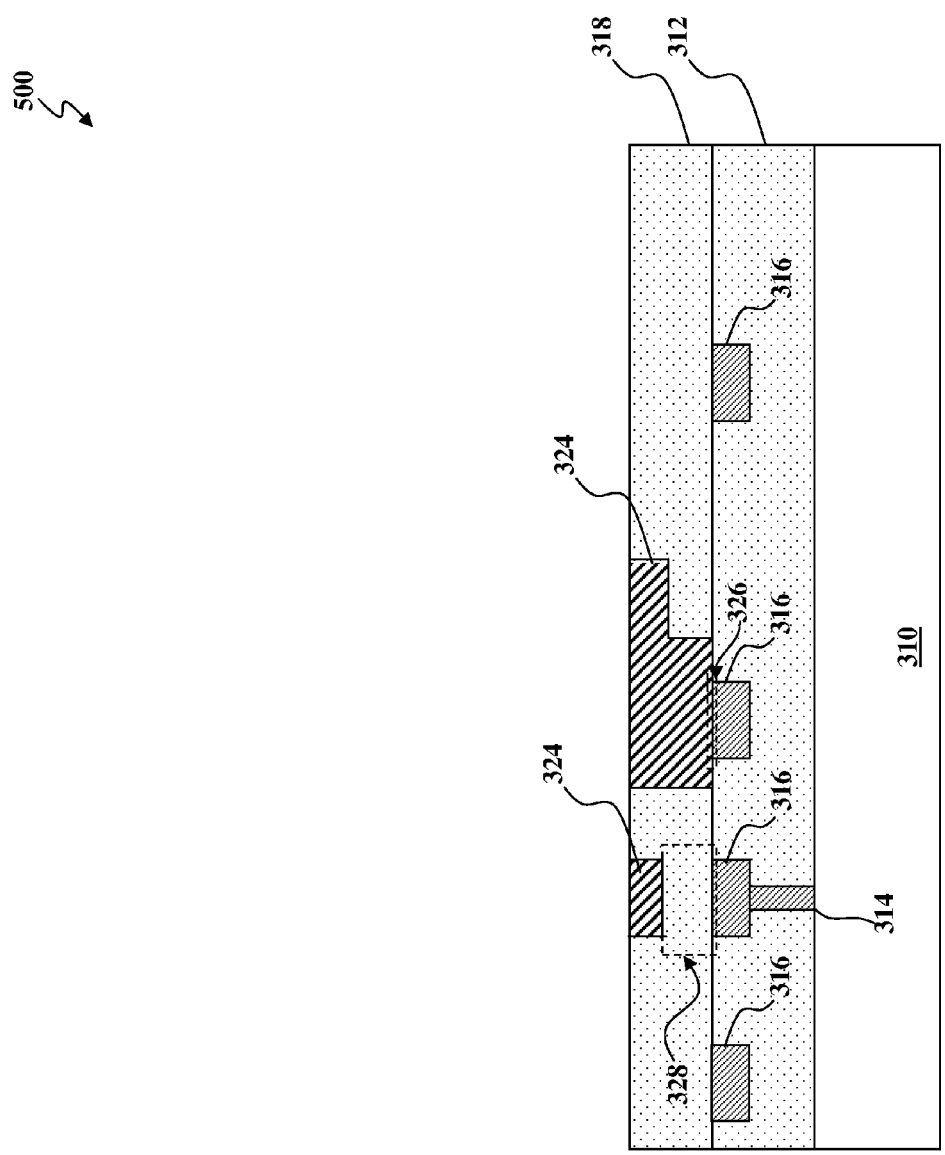

Referring to FIG. 25, the surface of the multilayer device 500 is planarized by a planarizing process that removes excess material of the M2 layer 324 and the hard mask 510. In embodiments, where the second photoresist layer 322 has not been removed (as illustrated in FIG. 22), the planarizing process also removes the second photoresist layer 322. The planarizing process may be a chemical mechanical polishing (CMP) process or any suitable process.

Figure 26:
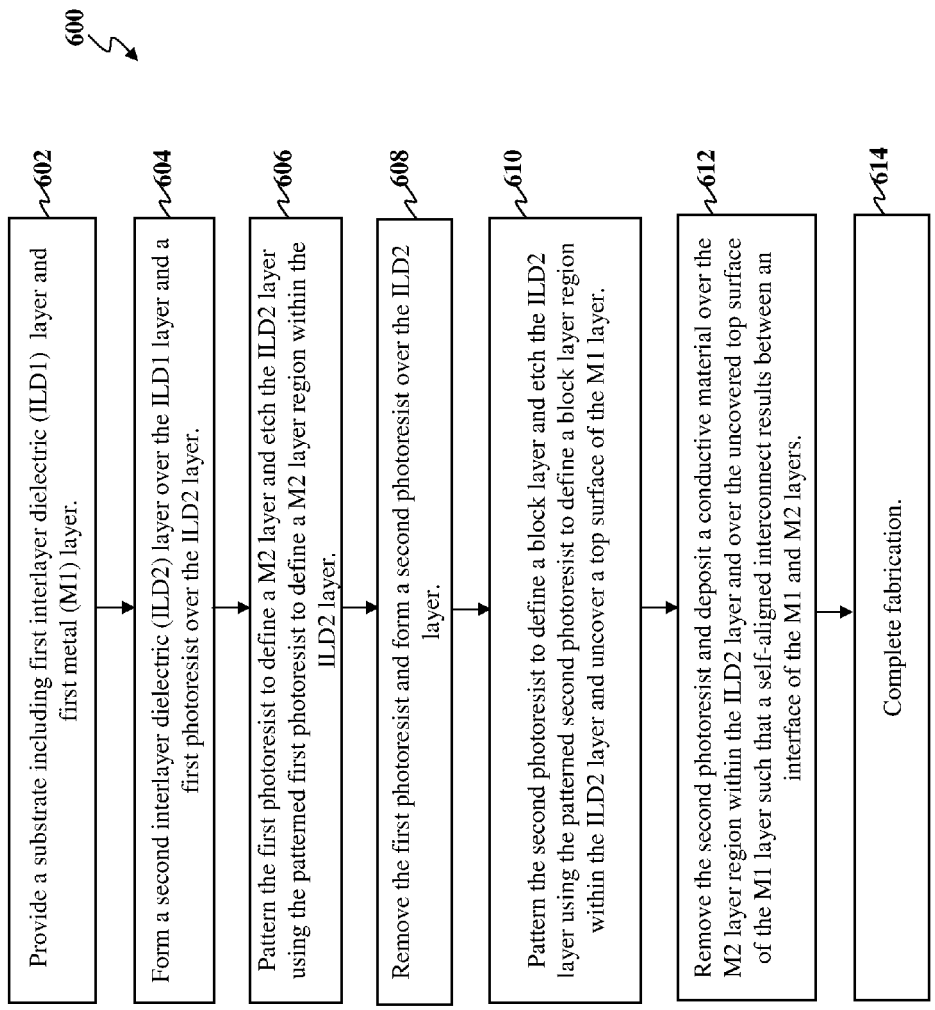
FIG. 26 is a flowchart illustrating a method of fabricating a multilayer device according to various aspects of the present disclosure.

Referring to FIG. 26, a method 600 for fabricating a semiconductor device is described according to various aspects of the present disclosure. The embodiment of method 600 may include similar process steps as an embodiment of the method 100 which is disclosed above. In disclosing the embodiment of method 600, some details regarding processing and/or structure may be skipped for simplicity if they are similar to those described in the embodiment of method 100.

Still referring to FIG. 26, in the present embodiment, the method 600 is for fabricating a multilayer integrated circuit device. The method 600 begins at block 602 where a substrate including first interlayer dielectric (ILD1) layer and first metal (M1) layer is provided. At block 604, a second interlayer dielectric (ILD2) layer is formed over the ILD1 layer and a first photoresist is formed over the ILD2 layer. The method continues with block 606 where the first photoresist is patterned to define a block layer and the ILD2 layer is etched using the patterned first photoresist to define a block layer region within the ILD2 layer. The method continues with block 608 where the first photoresist is removed and a second photoresist is formed over the ILD2 layer. At block 610, the second photoresist layer is patterned to define a M2 layer and the ILD2 layer is etched using the patterned second photoresist to define a M2 layer region within the ILD2 layer and uncover a top surface of the M1 layer. At block 612, the second photoresist is removed and a conductive material is deposited over the M2 layer region within the ILD2 layer and over the uncovered top surface of the M1 layer such that a self-aligned interconnect results between an interface of the M1 and M2 layers. A planarizing process may be performed to remove excess M2 layer material, thus planarizing the top surface of the multilayer device. In alternative embodiments, the second photoresist is not removed prior to formation of the M2 layer, but rather it is also removed by the planarizing process that is performed to remove excess M2 layer material. The method 600 continues with block 614 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes on two conductive layers (e.g., M1 and M2) more than two conducive layers are contemplated. Additional steps can be provided before, during, and after the method 600, and some of the steps described can be replaced or eliminated for other embodiments of the method. The discussion that follows illustrates various embodiments of a multilayer device that can be fabricated according to the method 600 of FIG. 26.

FIGS. 27-36 illustrate diagrammatic cross-sectional side views of one embodiment of a multilayer device 700 at various stages of fabrication, according to the method of FIG. 15. The semiconductor device 700 of FIGS. 27-36 is similar in certain respects to the semiconductor device 300 of FIGS. 5-14. Accordingly, similar features in FIGS. 5-14 and FIGS. 27-36 are identified by the same reference numerals for clarity and simplicity. It is understood that the multilayer device 700 may include various other devices and features, such as other types of transistors such as bipolar junction transistors, resistors, capacitors, diodes, fuses, etc., Accordingly, FIGS. 27-36 have been simplified for the sake of clarity to better understand the inventive concepts of the present disclosure. Additional features can be added in the multilayer device 700, and some of the features described below can be replaced or eliminated in other embodiments of the multilayer device 700.

Figure 27:
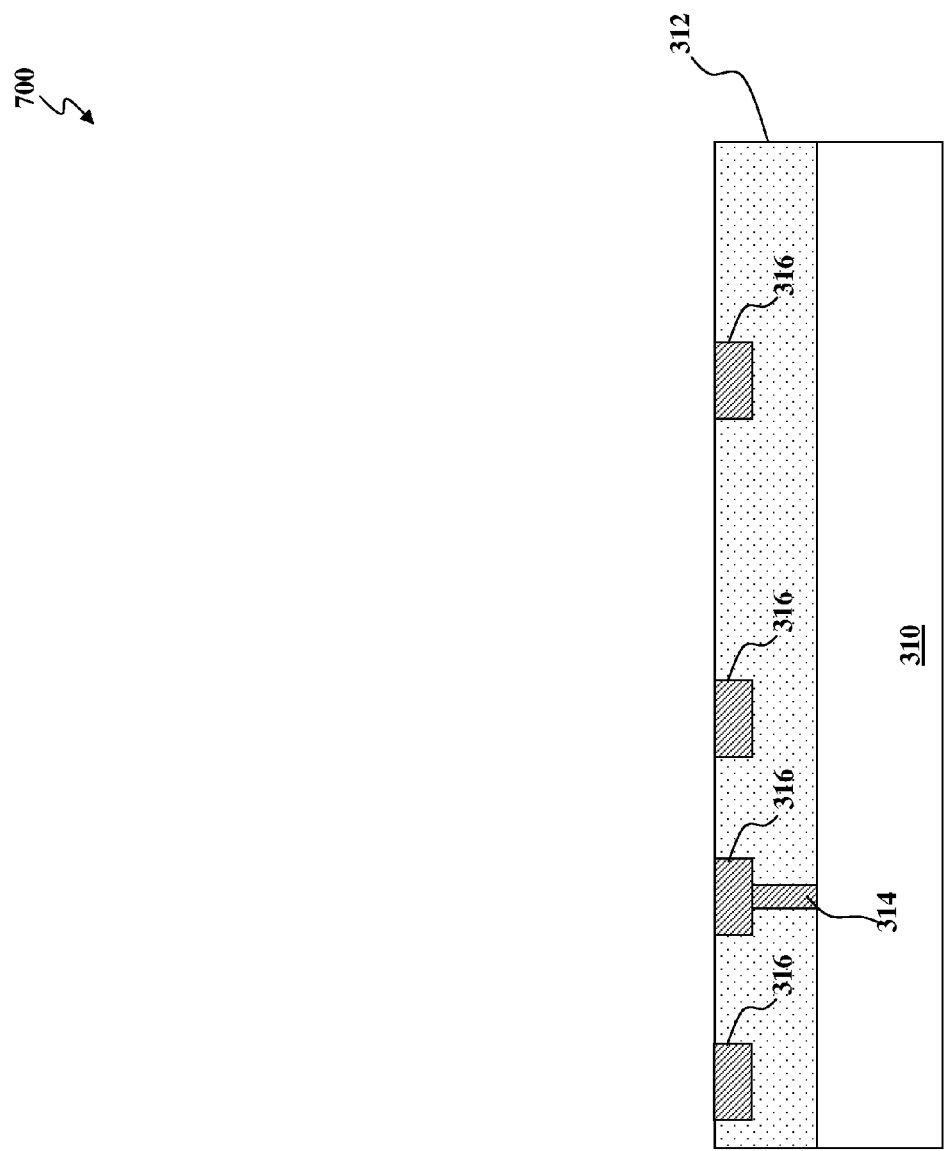
FIGS. 27-36 illustrate diagrammatic cross-sectional side views of one embodiment of a multilayer device at various stages of fabrication, according to the method of FIG. 26.

Referring to FIG. 27, a diagrammatic cross-sectional side view of multilayer device 700 is illustrated. The multilayer device 700 includes a substrate 310. In the present embodiment, the substrate 310 defined in the multilayer device 700 is substantially similar to the substrate 310 of the multilayer device 300 in terms of material composition and formation. In an alternative embodiment, they are different.

Still referring to FIG. 27, the substrate 310 further includes a first interlayer dielectric (ILD1) layer 312. In the present embodiment, the ILD1 layer 312 defined in the multilayer device 700 is substantially similar to the ILD1 layer 312 of the multilayer device 300 in terms of material composition and formation. In an alternative embodiment, they are different. Formed within the ILD1 layer 312 is a via 314 and a first metal (M1) layer 316. In the present embodiment, the via 314 and the M1 layer 316 defined in the multilayer device 700 is substantially similar to the via 314 and the M1 layer 316 of the multilayer device 300 in terms of material composition and formation. In an alternative embodiment, they are different.

Figure 28:
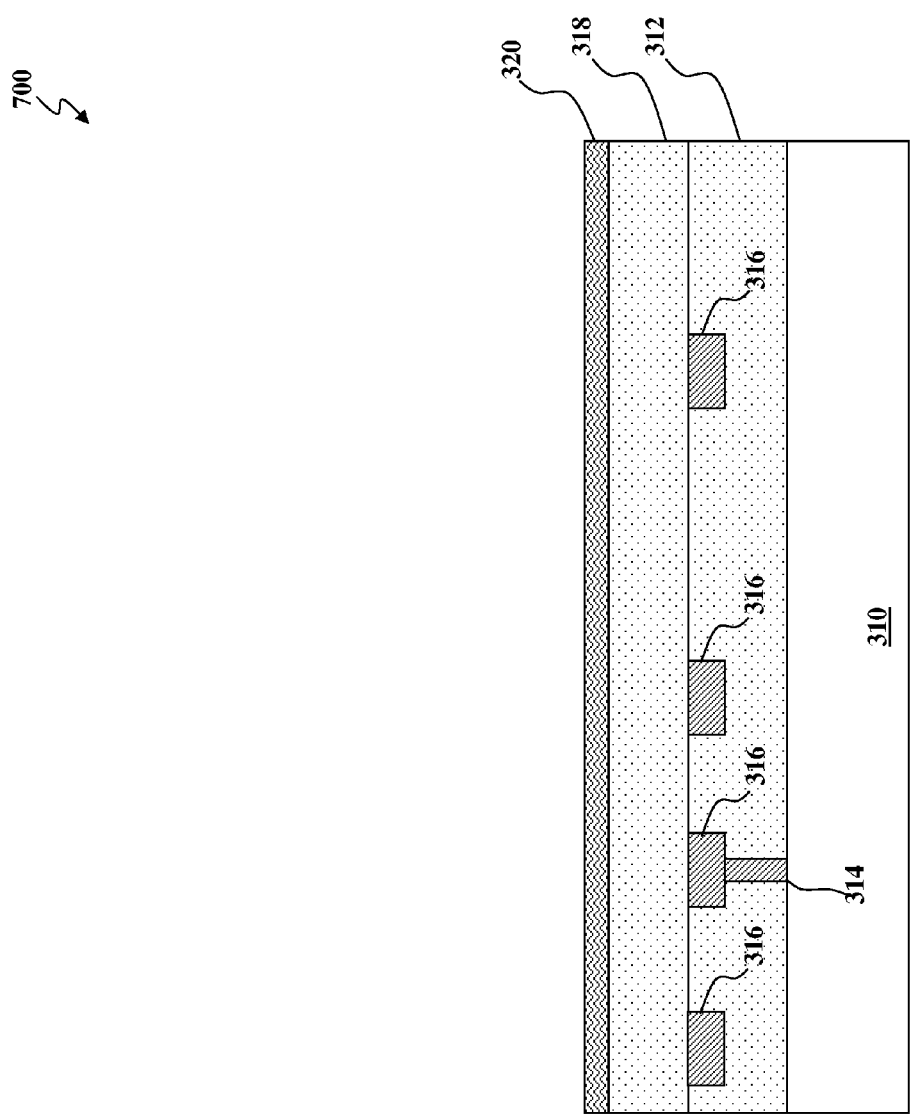

Referring to FIG. 28, formed over the ILD1 layer 312 is a second interlayer dielectric (ILD2) layer 318. In the present embodiment, the ILD2 layer 318 defined in the multilayer device 700 is substantially similar to the ILD2 layer 318 of the multilayer device 300 in terms of material composition and formation. In an alternative embodiment, they are different.

Still referring to FIG. 28, formed over the ILD2 layer 318 is a first photoresist layer 320. In the present embodiment, the first photoresist layer 320 defined in the multilayer device 700 is substantially similar to the first photoresist layer 320 of the multilayer device 300 in terms of material composition and formation. In an alternative embodiment, they are different.

Figure 29:
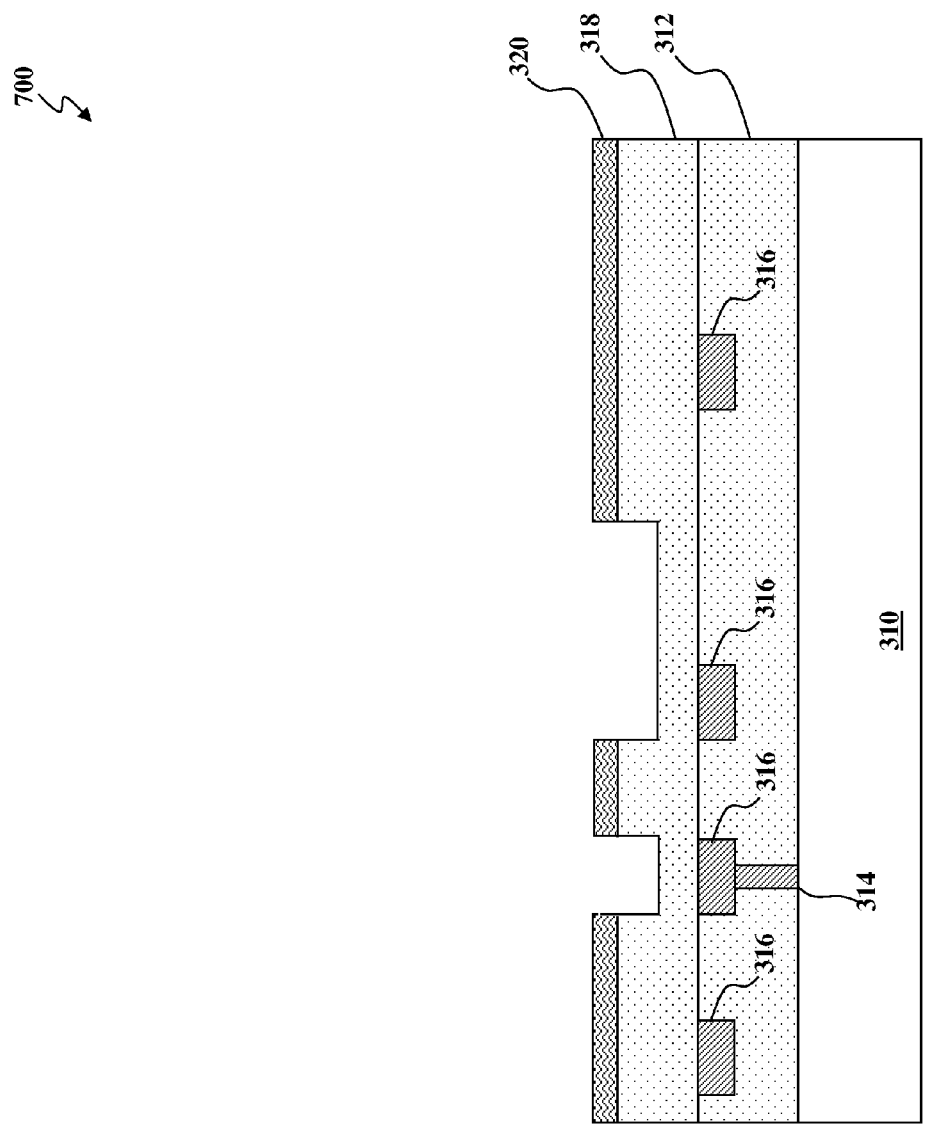

Referring to FIG. 29, the first photoresist layer 320 is patterned to define a M2 layer and the ILD2 layer 318 is etched using the patterned first photoresist layer 320 to define a M2 layer region within the ILD2 layer 318. Patterning the first photoresist layer 320 includes exposing the first photoresist layer 320 to a pattern, performing a post-exposure bake process, and developing the photoresist layer thereby forming a patterned first photoresist layer 320. The patterning may also be implemented or replaced by other proper methods, such as maskless photolithography, electron-beam writing, ion-beam writing, and molecular imprint. The etching process to etch the ILD1 layer 318 may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 30:
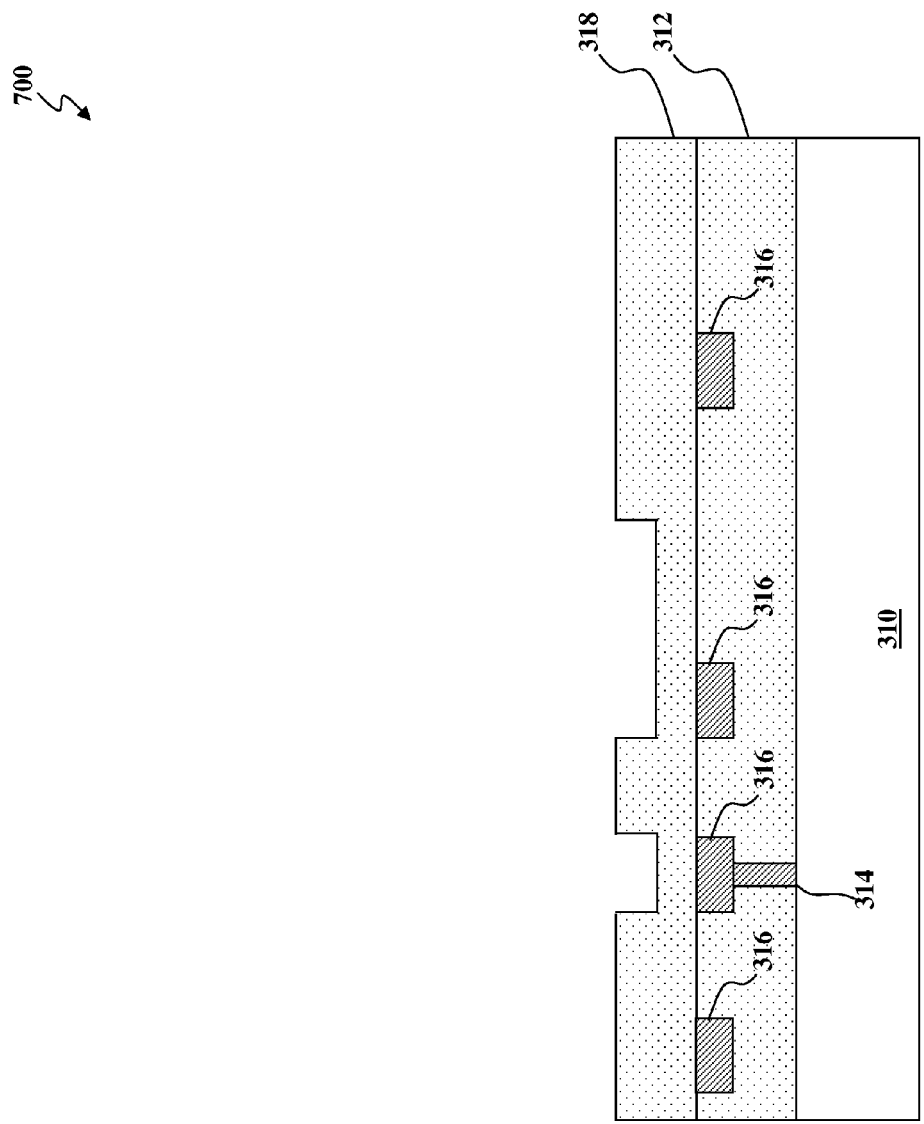

Referring to FIG. 30, after the ILD1 layer 318 etching process, the first photoresist layer 320 may be removed by any suitable process. For example, the first photoresist layer 320 may be removed by a liquid "resist stripper", which chemically alters the resist so that it no longer adheres to the underlying hard mask. Alternatively, first photoresist layer 320 may be removed by a plasma containing oxygen, which oxidizes it.

Figure 31:
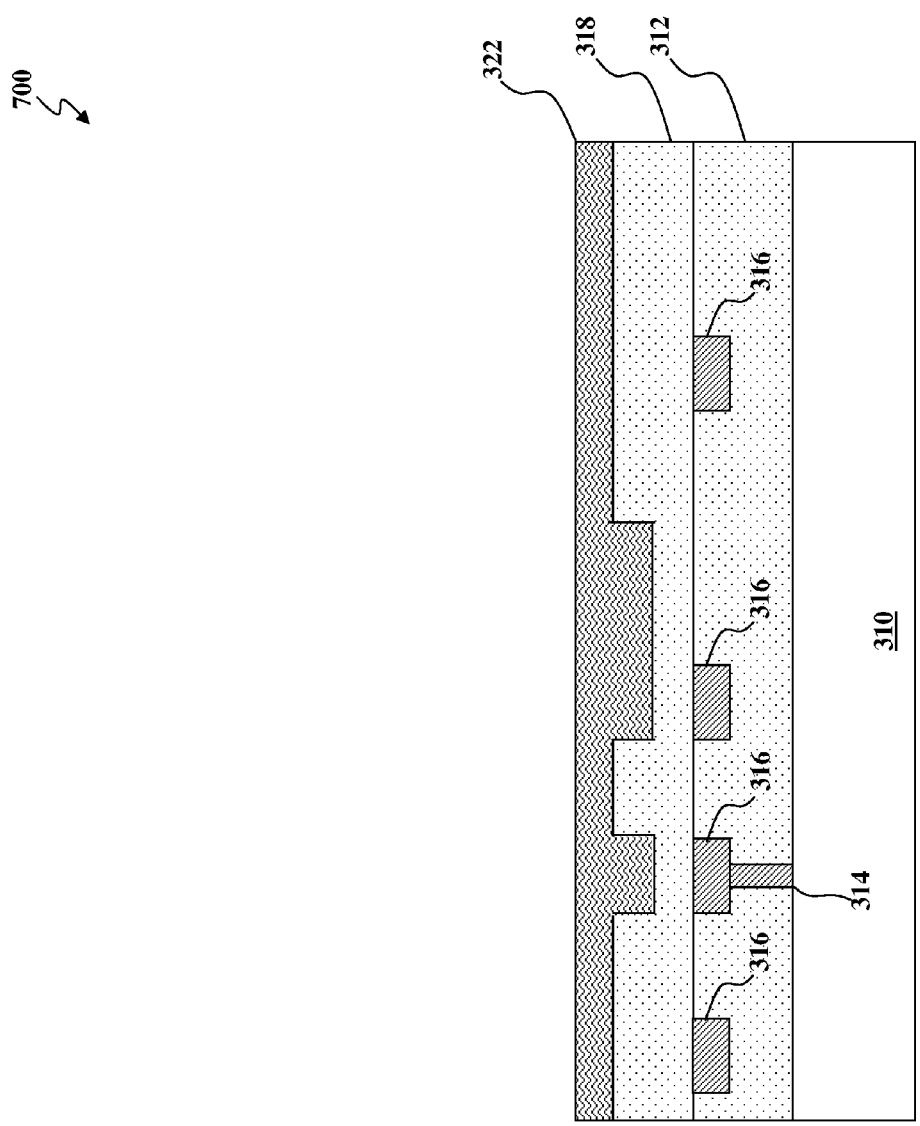

Referring to FIG. 31, after removing the first photoresist layer 320, a second photoresist layer 322 is formed over the ILD1 layer 318. In the present embodiment, the second photoresist layer 322 defined in the multilayer device 700 is substantially similar to the second photoresist layer 322 of the multilayer device 300 in terms of material composition and formation. In an alternative embodiment, they are different.

Figure 32:
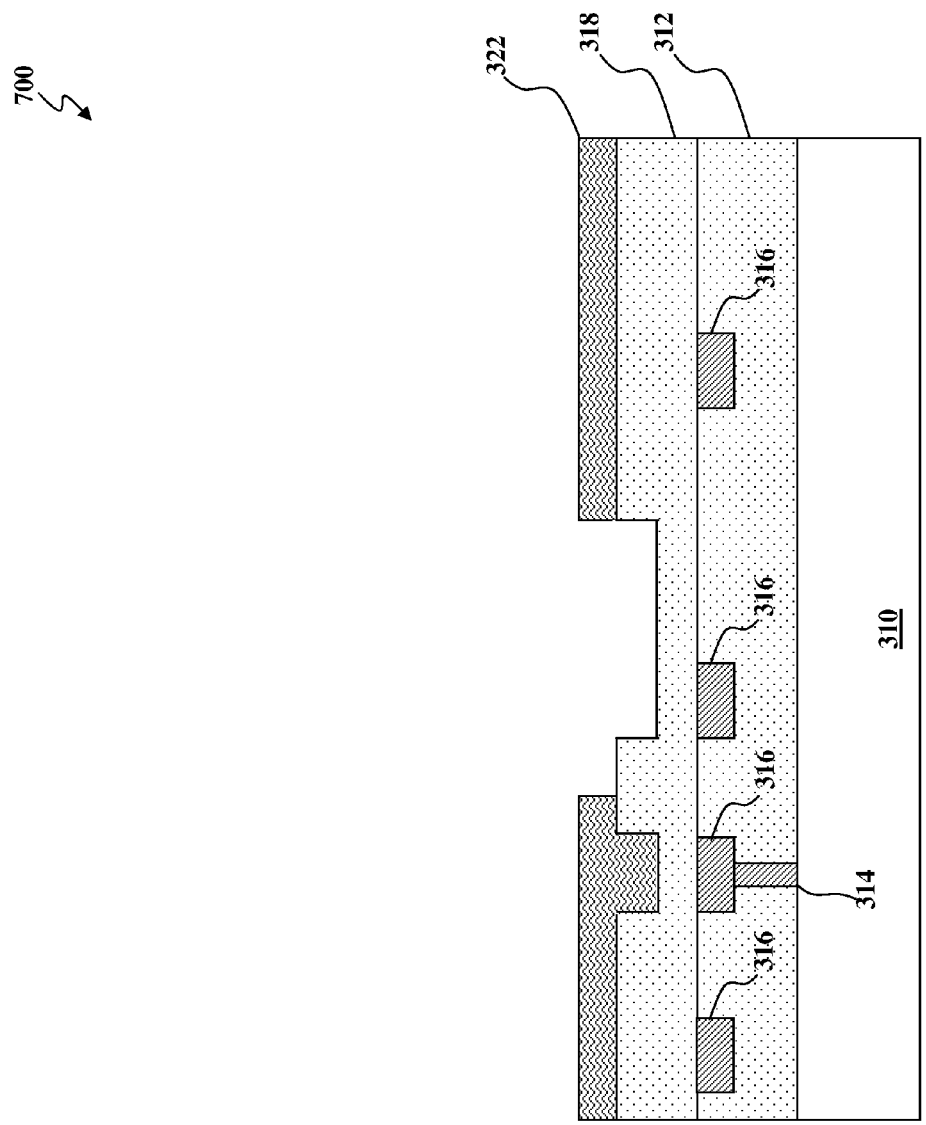

Referring to FIG. 32, the second photoresist layer 322 is patterned to further define regions where the ILD2 layer 318 will be subsequently etched. Patterning the second photoresist layer 322 includes exposing the second photoresist layer 322 to a pattern, performing a post-exposure bake process, and developing the photoresist layer thereby forming a patterned second photoresist layer 322. The patterning may also be implemented or replaced by other proper methods, such as maskless photolithography, electron-beam writing, ion-beam writing, and molecular imprint.

Figure 33:
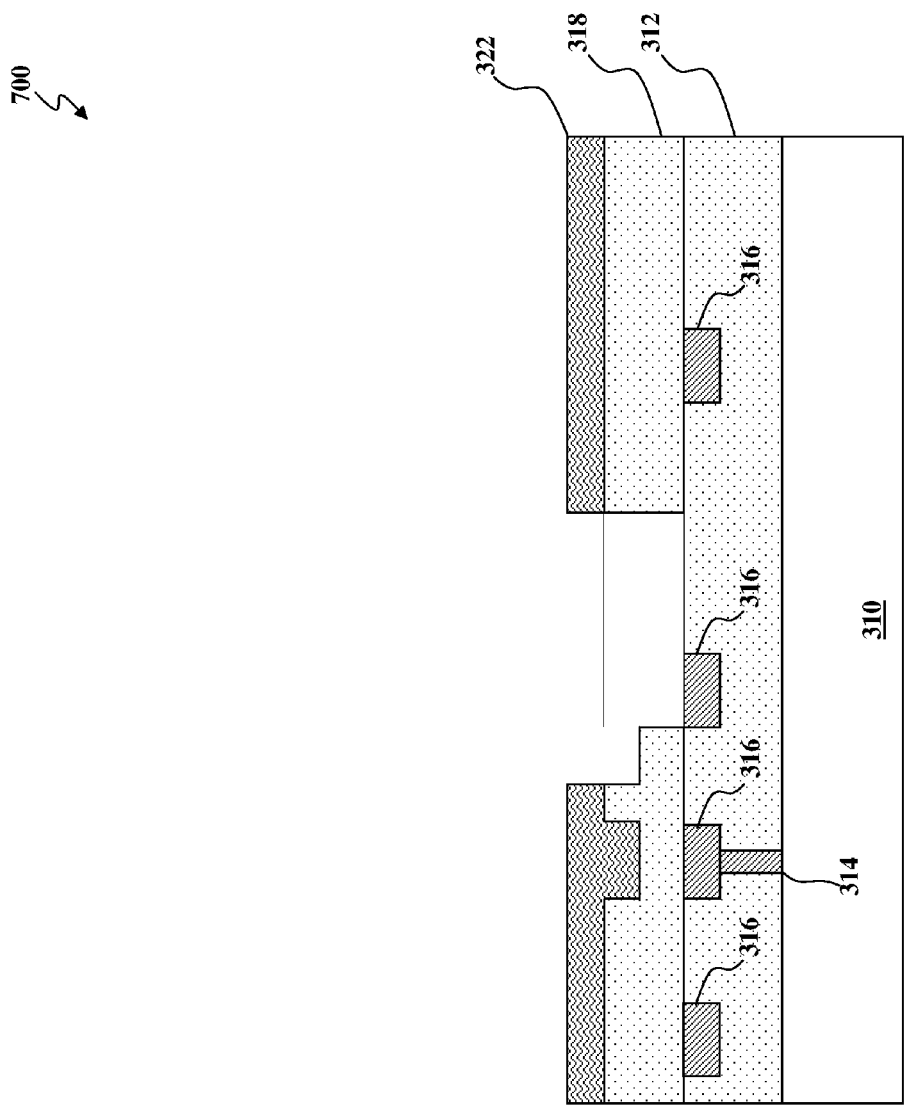

Referring to FIG. 33, the ILD2 layer 318 is further etched using the patterned second photoresist layer 322 to define further define a block layer region within the ILD2 layer 318 and uncover a top surface of the M1 layer 316. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes CF4, SF6, or NF3. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 34:
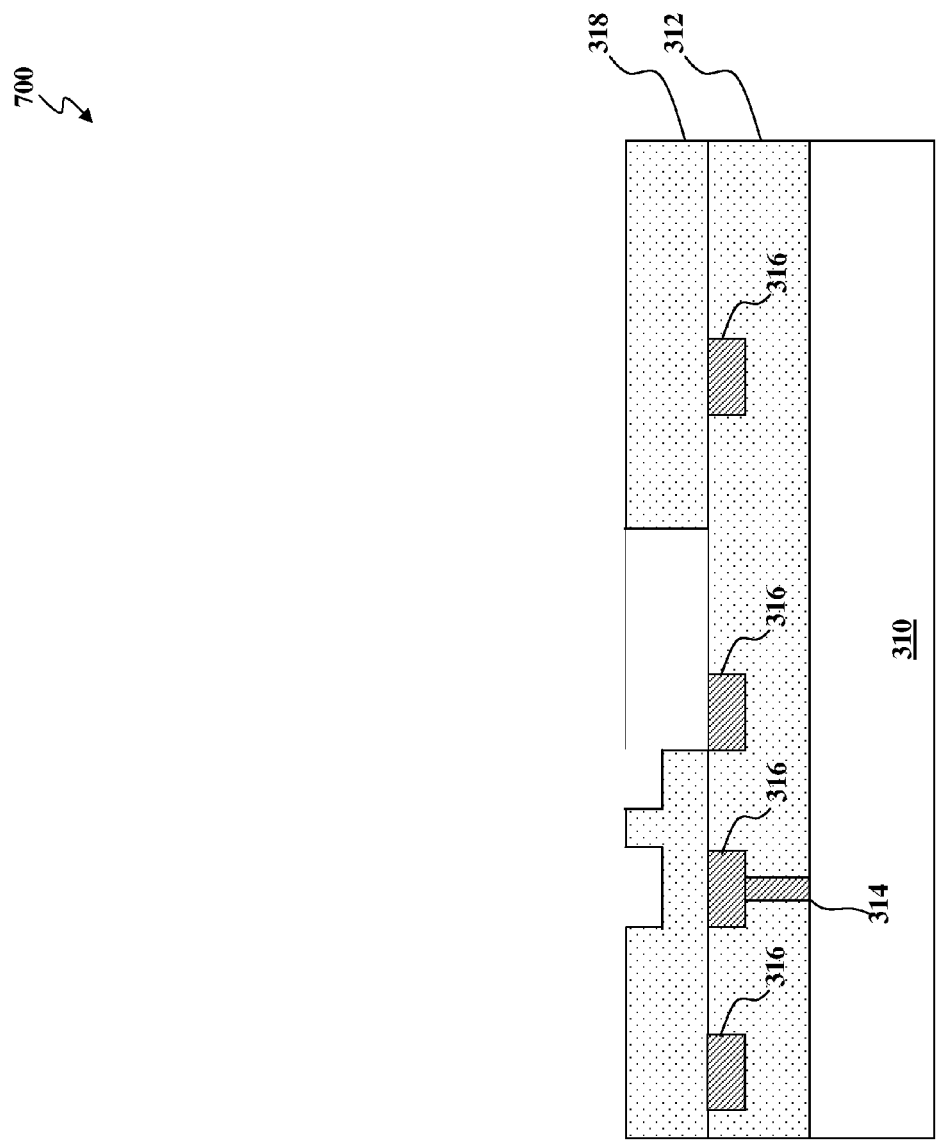

Referring to FIG. 34, after the ILD1 etching process, the second photoresist layer 322 may be removed by any suitable process. For example, the second photoresist layer 322 may be removed by a liquid "resist stripper", which chemically alters the resist so that it no longer adheres to the underlying hard mask. Alternatively, second photoresist layer 322 may be removed by a plasma containing oxygen, which oxidizes it.

Figure 35:
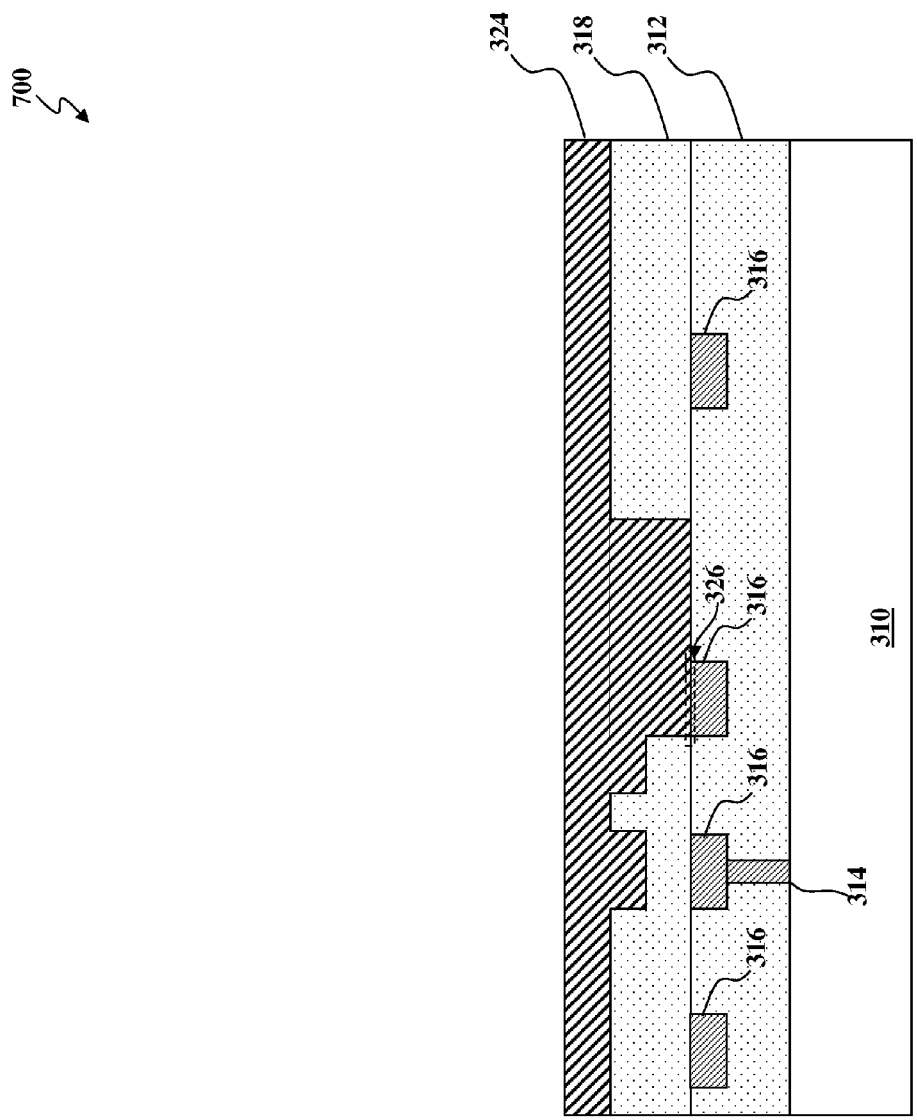

Referring to FIG. 35, after further defining the M2 layer region within the ILD2 layer 318 and uncovering the top surface of the M1 layer 316, a M2 layer 324 material is formed over the M2 layer region within the ILD2 layer 318. The M2 layer 324 provides electrical connection to the M1 layer 316 and other devices/features of the multilayer device 700. In the present embodiment, the M2 layer 324 defined in the multilayer device 700 is substantially similar to the M2 layer 324 of the multilayer device 300 in terms of material composition and formation. In an alternative embodiment, they are different.

As illustrated, the M2 layer 324 is disposed over the M1 layer 314 and in electrical contact with the M1 layer 316. The interface between at least one line of the M1 layer 316 and the M2 layer 324 forms a self-aligned interconnect 326. The interface forms a self-aligned interconnect 326 because no via is required to be defined between the M1 layer 316 and the M2 layer 323. Further, a blocking portion 328 is defined to block the formation of at least one self-aligned interconnect. In the present embodiment, the M1 layer 316 and the M2 layer 324 are in direct and electrical contact. In alternative embodiments, a material is interposed between the two layers to provide electrical contact between the self-aligned interconnect of the M1 layer 316 and the M2 layer 324.

Figure 36:
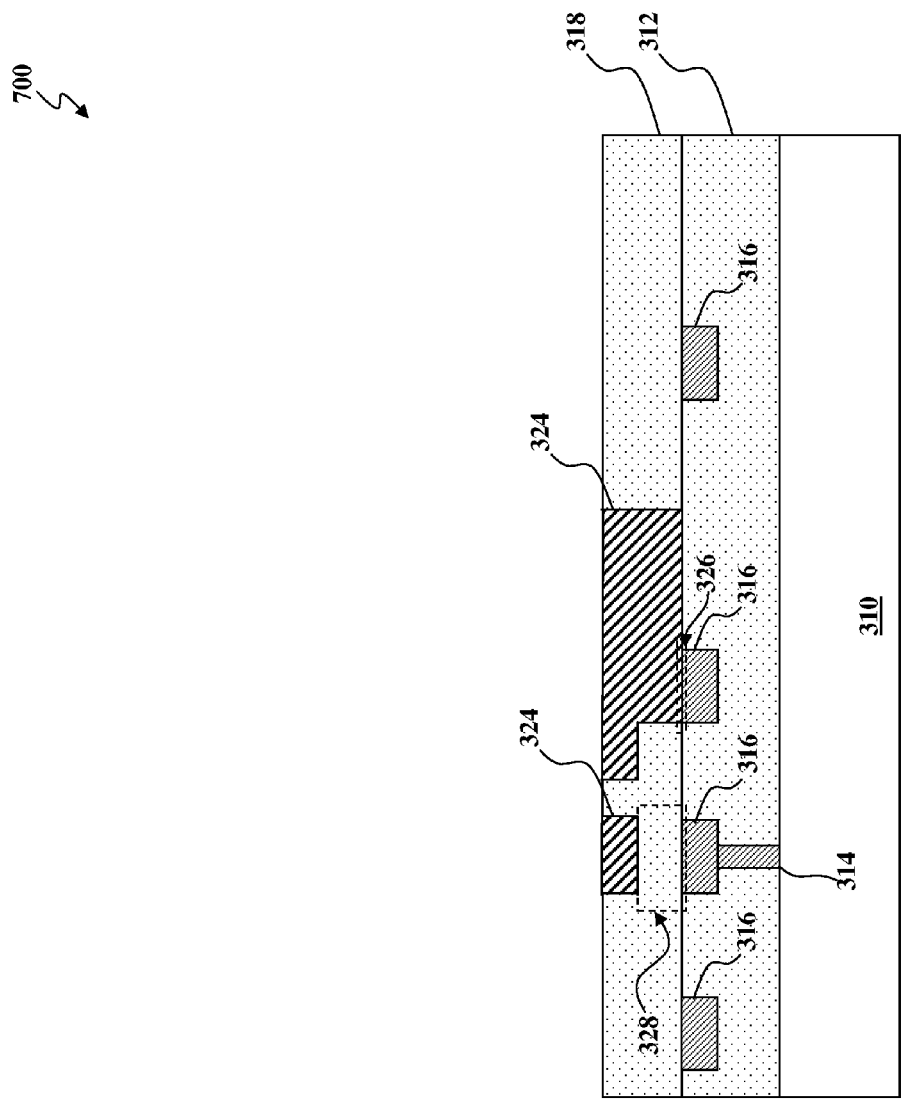

Referring to FIG. 36, the surface of the multilayer device 700 is planarized by a planarizing process that removes excess material of the M2 layer 324. In embodiments, where the second photoresist layer 322 has not been removed (as illustrated in FIG. 33), the planarizing process also removes the second photoresist layer 322. The planarizing process may be a chemical mechanical polishing (CMP) process or any suitable process.

Figure 37:
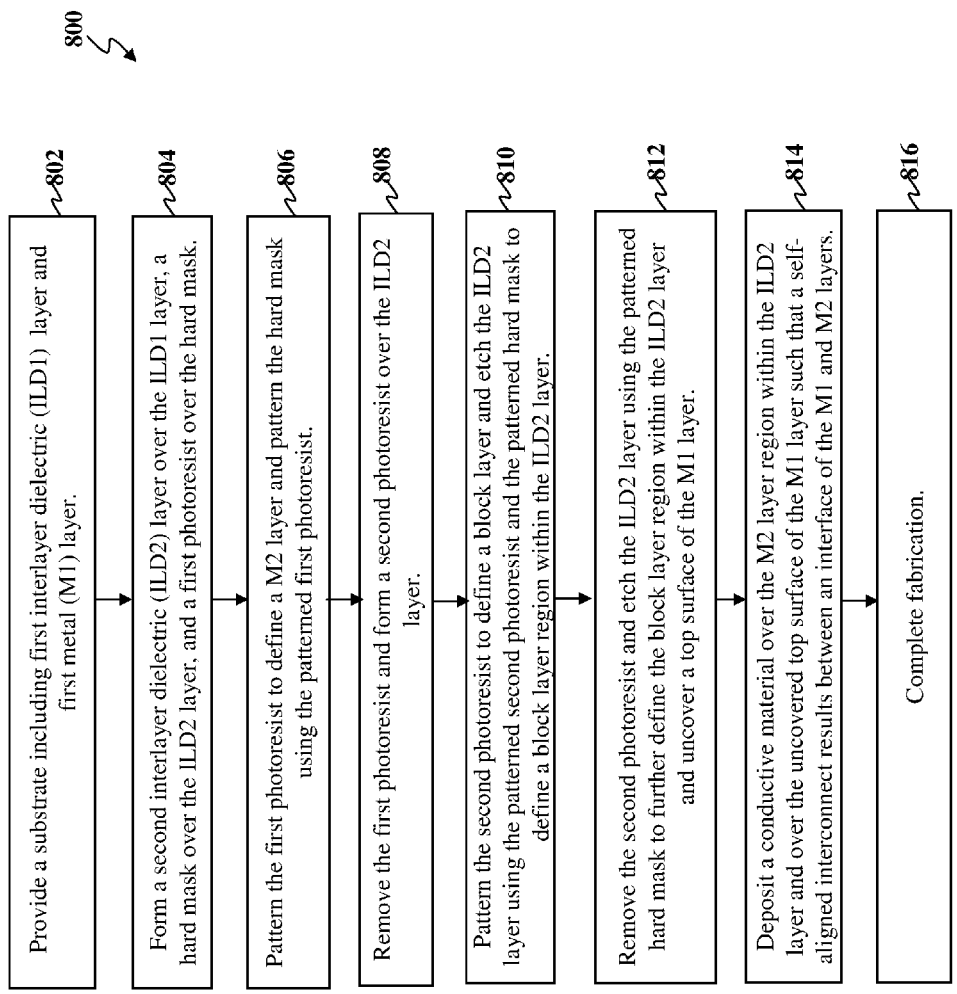
FIG. 37 is a flowchart illustrating a method of fabricating a multilayer device according to various aspects of the present disclosure.

Referring to FIG. 37, a method 800 for fabricating a semiconductor device is described according to various aspects of the present disclosure. The embodiment of method 800 may include similar process steps as an embodiment of the method 100 which is disclosed above. In disclosing the embodiment of method 800, some details regarding processing and/or structure may be skipped for simplicity if they are similar to those described in the embodiment of method 100.

Still referring to FIG. 37, in the present embodiment, the method 800 is for fabricating a multilayer integrated circuit device. The method 800 begins at block 802 where a substrate including first interlayer dielectric (ILD1) layer and first metal (M1) layer is provided. At block 804, a second interlayer dielectric (ILD2) layer is formed over the ILD1 layer, a hard mask is formed over the ILD2 layer, and a first photoresist is formed over the hard mask. The method continues with block 806 where the first photoresist is patterned to define a M2 layer and the hard mask is patterned using the patterned first photoresist. The method continues with block 808 where the first photoresist is removed and a second photoresist is formed over the ILD2 layer. At block 810, the second photoresist layer is patterned to further define a block layer and the ILD2 layer is etched using the patterned photoresist and the patterned hard mask to define a block layer region within the ILD2 layer. At block 812, the second photoresist is removed and the ILD2 layer is etched using the patterned hard mask to further define the block layer region within the ILD2 layer and uncover a top surface of the M1 layer. At block 814, a conductive material is deposited over the M2 layer region within the ILD2 layer and over the uncovered top surface of the M1 layer such that a self-aligned interconnect results between an interface of the M1 and M2 layers. A planarizing process may be performed to remove excess M2 layer material and the hard mask, thus planarizing the top surface of the multilayer device. The method 800 continues with block 816 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes on two conductive layers (e.g., M1 and M2) more than two conducive layers are contemplated. Additional steps can be provided before, during, and after the method 800, and some of the steps described can be replaced or eliminated for other embodiments of the method. The discussion that follows illustrates various embodiments of a multilayer device that can be fabricated according to the method 800 of FIG. 37.

FIGS. 38-47 illustrate diagrammatic cross-sectional side views of one embodiment of a multilayer device 900 at various stages of fabrication, according to the method of FIG. 37. The semiconductor device 900 of FIGS. 38-47 is similar in certain respects to the semiconductor device 300 of FIGS. 5-14. Accordingly, similar features in FIGS. 5-14 and FIGS. 38-47 are identified by the same reference numerals for clarity and simplicity. It is understood that the multilayer device 900 may include various other devices and features, such as other types of transistors such as bipolar junction transistors, resistors, capacitors, diodes, fuses, etc. Accordingly, FIGS. 38-47 have been simplified for the sake of clarity to better understand the inventive concepts of the present disclosure. Additional features can be added in the multilayer device 900, and some of the features described below can be replaced or eliminated in other embodiments of the multilayer device 900.

Figure 38:
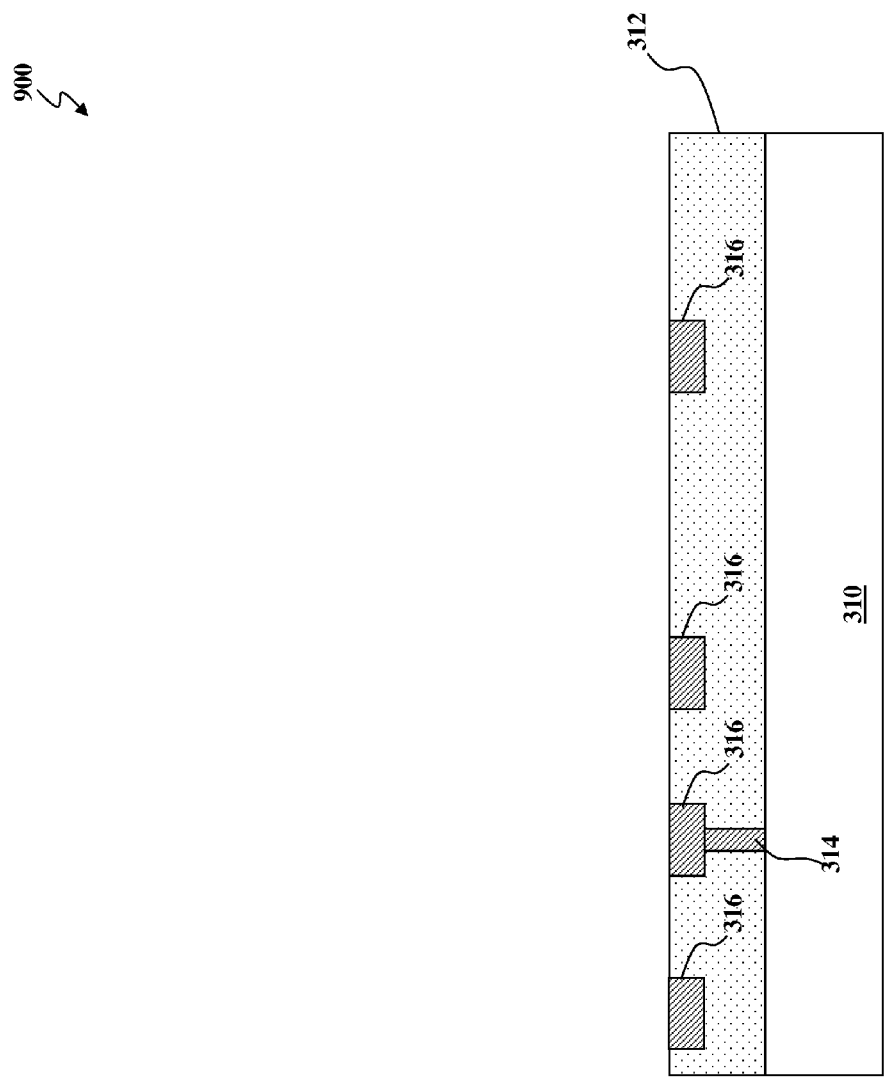
FIGS. 38-47 illustrate diagrammatic cross-sectional side views of one embodiment of a multilayer device at various stages of fabrication, according to the method of FIG. 37.

Referring to FIG. 38, a diagrammatic cross-sectional side view of multilayer device 900 is illustrated. The multilayer device 900 includes a substrate 310. In the present embodiment, the substrate 310 defined in the multilayer device 900 is substantially similar to the substrate 310 of the multilayer device 300 in terms of material composition and formation. In an alternative embodiment, they are different.

Still referring to FIG. 38, the substrate 310 further includes a first interlayer dielectric (ILD1) layer 312. In the present embodiment, the ILD1 layer 312 defined in the multilayer device 900 is substantially similar to the ILD1 layer 312 of the multilayer device 300 in terms of material composition and formation. In an alternative embodiment, they are different. Formed within the ILD1 layer 312 is a via 314 and a first metal (M1) layer 316. In the present embodiment, the via 314 and the M1 layer 316 defined in the multilayer device 900 is substantially similar to the via 314 and the M1 layer 316 of the multilayer device 300 in terms of material composition and formation. In an alternative embodiment, they are different.

Figure 39:
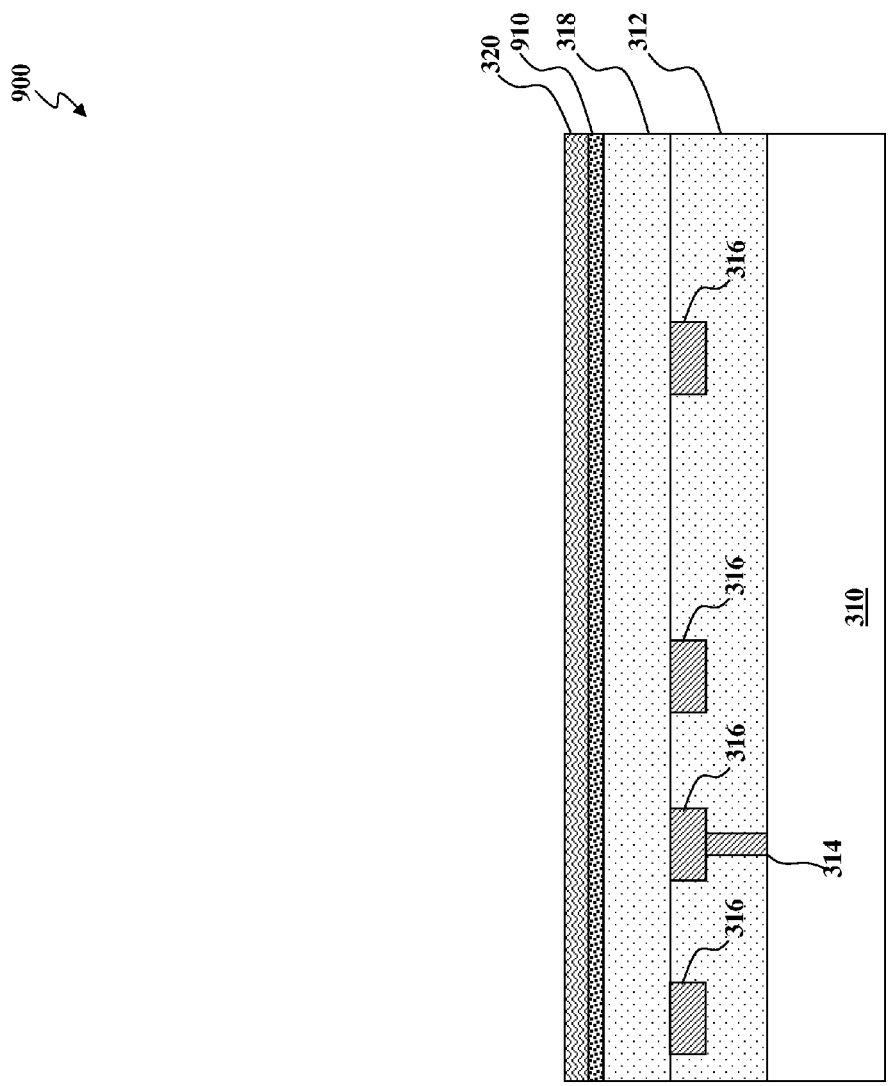

Referring to FIG. 39, formed over the ILD1 layer 312 is a second interlayer dielectric (ILD2) layer 318. In the present embodiment, the ILD2 layer 318 defined in the multilayer device 900 is substantially similar to the ILD2 layer 318 of the multilayer device 300 in terms of material composition and formation. In an alternative embodiment, they are different.

Still referring to FIG. 39, formed over the ILD2 layer 318 is a hard mask 910. Forming the hard mask 910 includes, for example, depositing a material over the ILD2 layer 316 using a CVD process. The material may include, for example, oxide, nitride, or other suitable material. In various examples, the hard mask 910 can be formed by atomic layer deposition (ALD), high density plasma CVD (HDPCVD), other suitable methods, and/or combinations thereof. The CVD process, for example, may use chemicals including Hexachlorodisilane (HCD or $Si_2Cl_6$), Dichlorosilane (DCS or $SiH_2Cl_2$), Bis (TertiaryButylAmino) Silane (BTBAS or $C_8H_{22}N_2Si$) and Disilane (DS or $Si_2H_6$). Formed over the hard mask 910 is a first photoresist layer 320. In the present embodiment, the first photoresist layer 320 defined in the multilayer device 900 is substantially similar to the first photoresist layer 320 of the multilayer device 300 in terms of material composition and formation. In an alternative embodiment, they are different.

Figure 40:
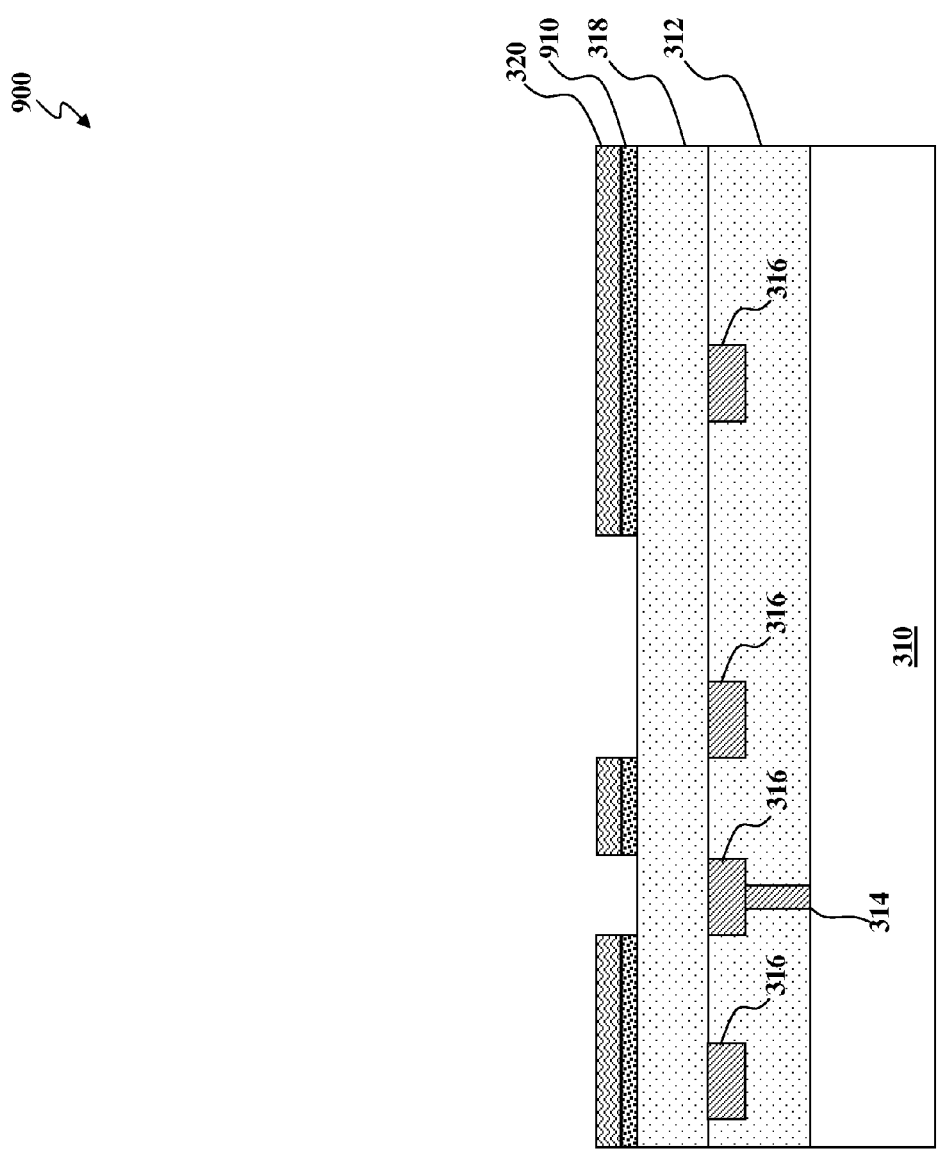

Referring to FIG. 40, the first photoresist layer 320 is patterned to define regions where the hard mask 910 and the ILD2 layer 318 will be subsequently etched. Patterning the first photoresist layer 320 includes exposing the first photoresist layer 320 to a pattern, performing a post-exposure bake process, and developing the photoresist layer thereby forming a patterned first photoresist layer 320. The patterning may also be implemented or replaced by other proper methods, such as maskless photolithography, electron-beam writing, ion-beam writing, and molecular imprint.

Still referring to FIG. 40, the hard mask 910 is patterned using the patterned first photoresist layer 320. Patterning the hard mask 910 includes an etching process. The etching process can include a wet etching process, a dry etching process, or a combination thereof. In one example, a dry etching process used to etch the hard mask may include a chemistry including fluorine-containing gas. In furtherance of the example, the chemistry of the dry etch includes $CF_4$, $SF_6$, or $NF_3$.

Figure 41:
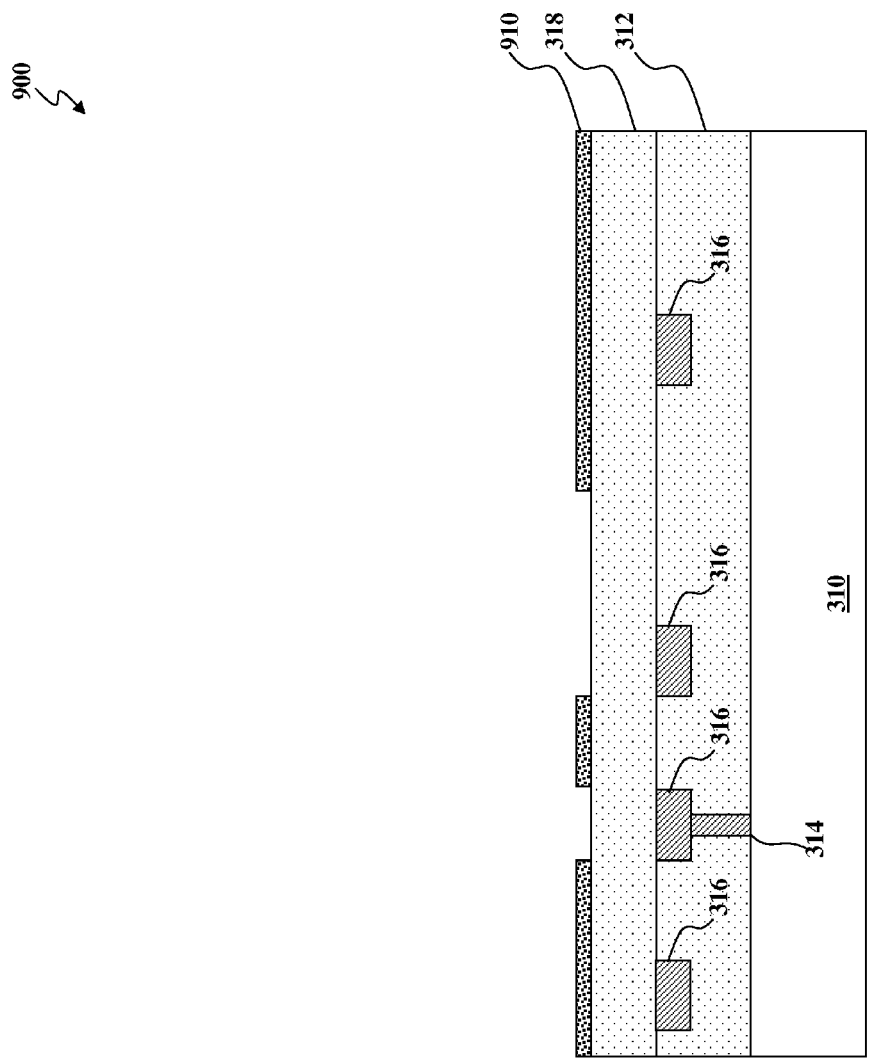

Referring to FIG. 41, after the hard mask 910 patterning process, the first photoresist layer 320 may be removed by any suitable process. For example, the first photoresist layer 320 may be removed by a liquid "resist stripper", which chemically alters the resist so that it no longer adheres to the underlying hard mask. Alternatively, first photoresist layer 320 may be removed by a plasma containing oxygen, which oxidizes it.

Figure 42:
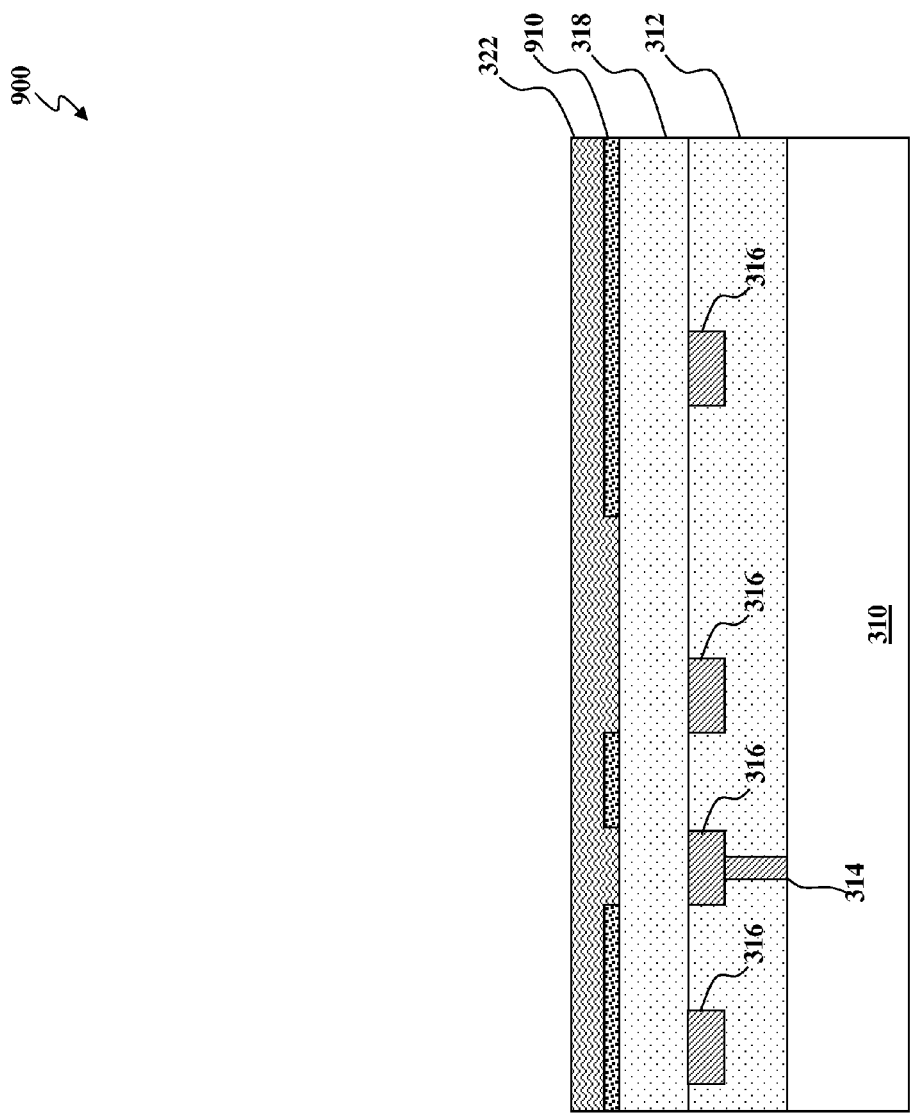

Referring to FIG. 42, after removing the first photoresist layer 320, a second photoresist layer 322 is formed over the hard mask 910. In the present embodiment, the second photoresist layer 322 defined in the multilayer device 900 is substantially similar to the second photoresist layer 322 of the multilayer device 300 in terms of material composition and formation. In an alternative embodiment, they are different.

Figure 43:
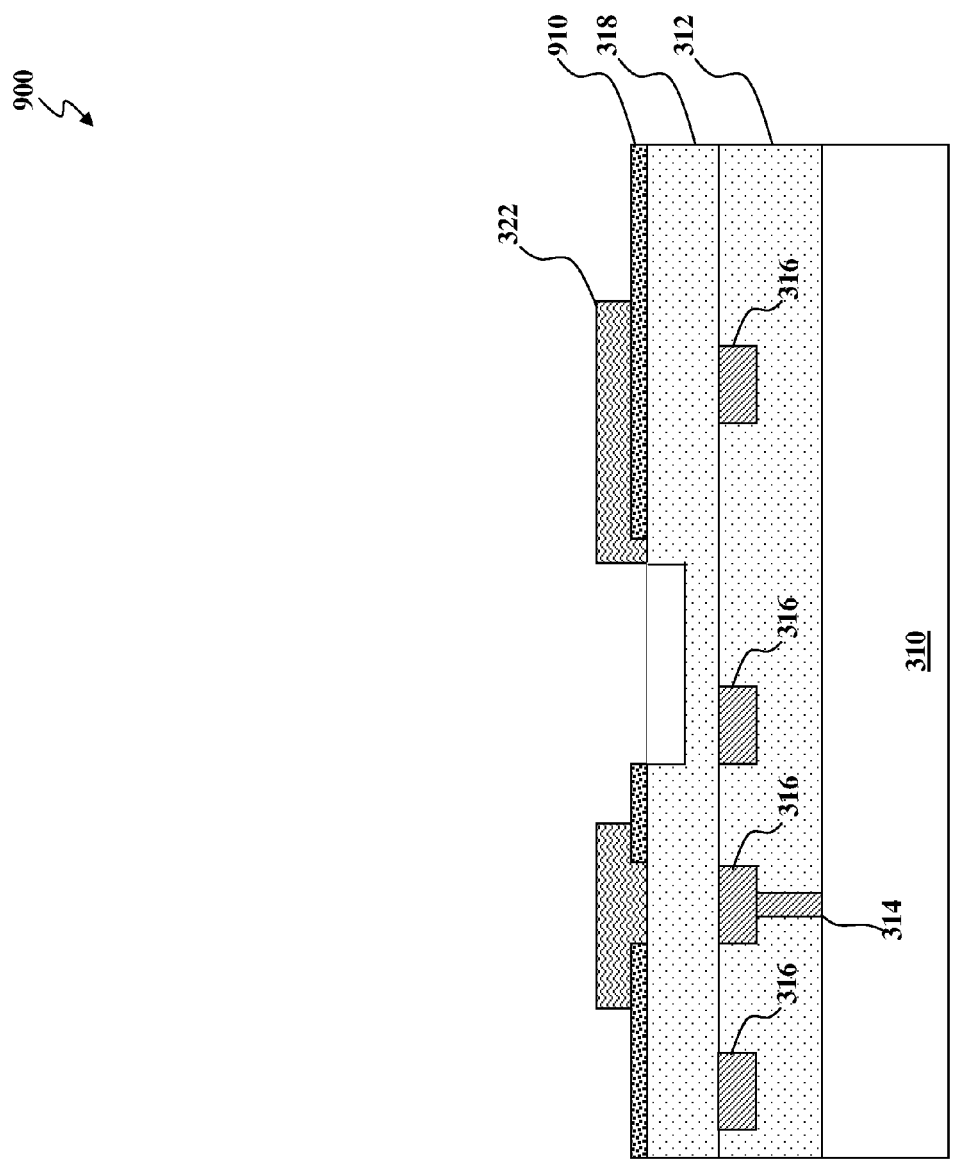

Referring to FIG. 43, the second photoresist layer 322 is patterned to further define regions where the ILD2 layer 318 will be subsequently etched. Patterning the second photoresist layer 322 includes exposing the second photoresist layer 322 to a pattern, performing a post-exposure bake process, and developing the photoresist layer thereby forming a patterned second photoresist layer 322. The patterning may also be implemented or replaced by other proper methods, such as maskless photolithography, electron-beam writing, ion-beam writing, and molecular imprint.

Still referring to FIG. 43, the ILD2 layer 318 is etched using the patterned hard mask 910 and the patterned second photoresist 322 to define a block layer region within the ILD2 layer 318. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes $CF_4$, $SF_6$, or $NF_3$. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 44:
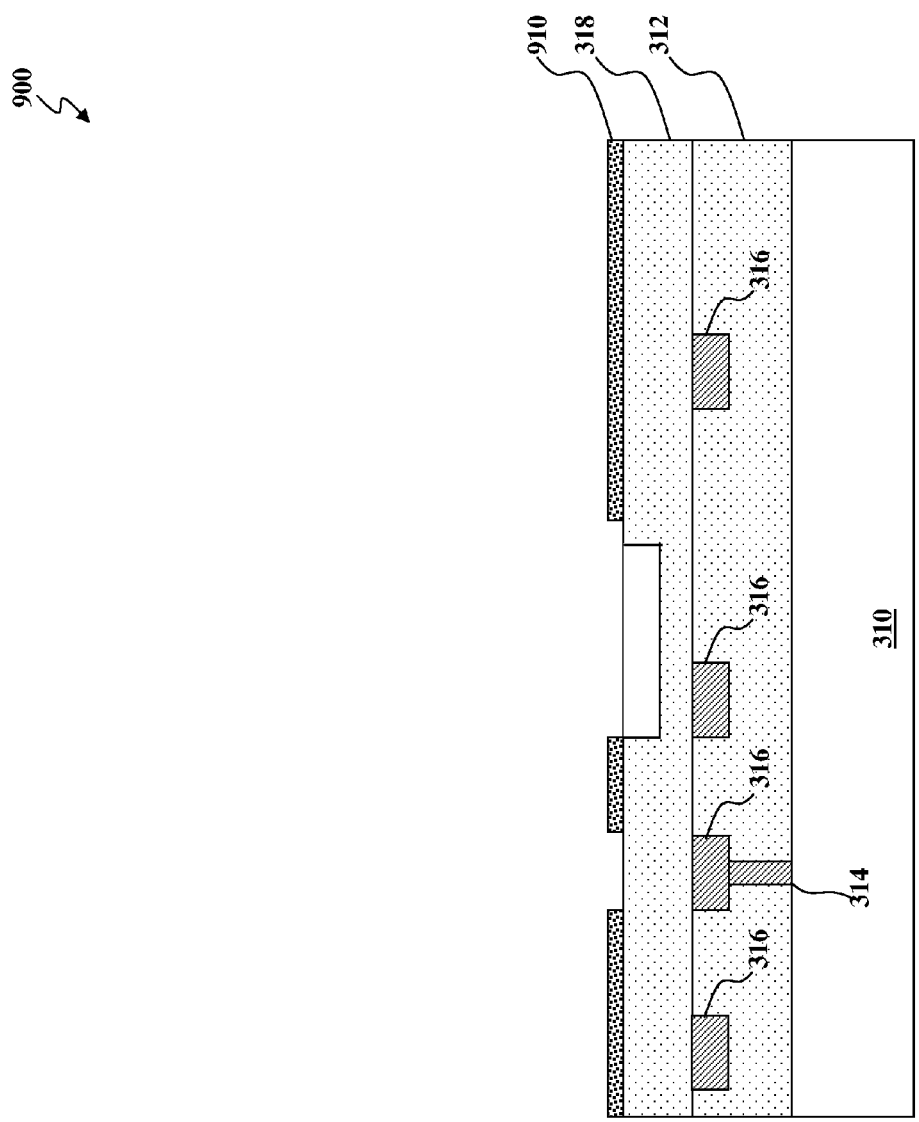

Referring to FIG. 44, after the ILD2 layer 318 etching process, the second photoresist layer 322 may be removed by any suitable process. For example, the second photoresist layer 322 may be removed by a liquid "resist stripper", which chemically alters the resist so that it no longer adheres to the underlying hard mask. Alternatively, second photoresist layer 322 may be removed by a plasma containing oxygen, which oxidizes it.

Figure 45:
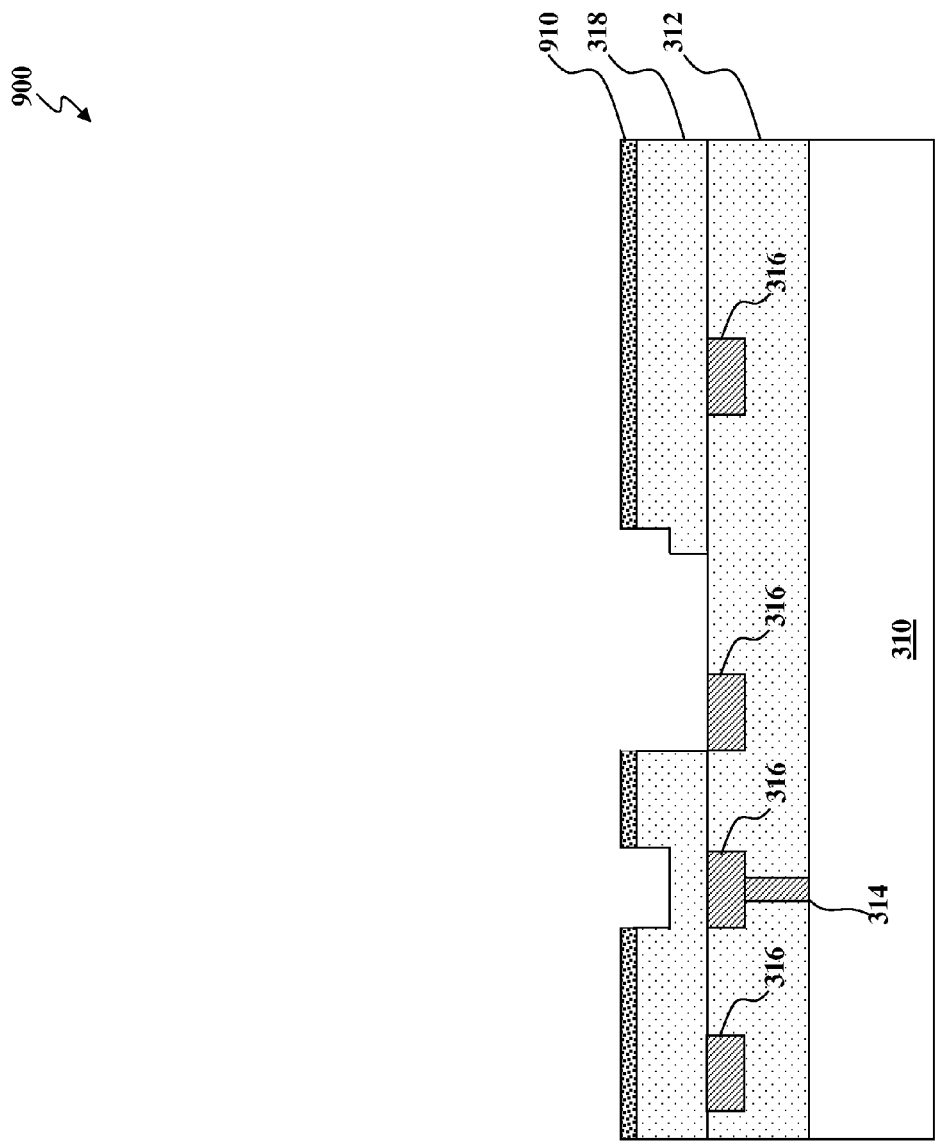

Referring to FIG. 45, the ILD2 layer 318 is further etched using the patterned hard mask 910 to further define the M2 layer region within the ILD2 layer 318 and uncover a top surface of the M1 layer 316. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD2 layer 318 that includes a chemistry including fluorine-containing gas. In furtherance of the example, the chemistry of the dry etch includes $CF_4$, $SF_6$, or $NF_3$. As illustrated, in the present embodiment, the etching process is a time sensitive etching process that uses the etch rate of the etching chemistry to determine how long to etch such that the desired portions of the ILD2 layer 318 are etched while other portions of the ILD2 layer 318 remain. Alternatively, the etching process may be any suitable etching process and may stop according to design requirements.

Figure 46:
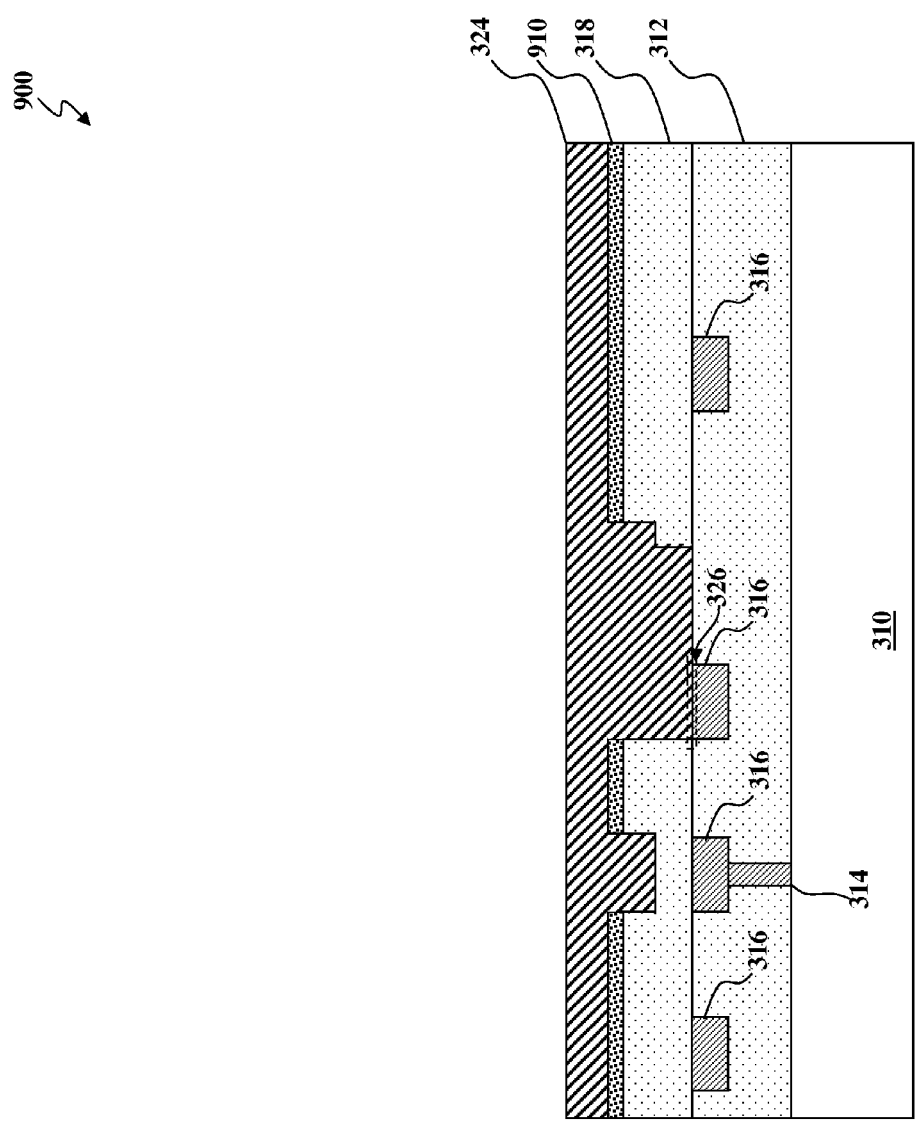

Still referring to FIG. 46, after further defining the M2 layer region within the ILD2 layer 318 and uncovering the top surface of the M1 layer 316, a M2 layer 324 is formed over the M2 layer region within the ILD2 layer 318. The M2 layer 324 provides electrical connection to the M1 layer 316 and other devices/features of the multilayer device 900. In the present embodiment, the M2 layer 324 defined in the multilayer device 900 is substantially similar to the M2 layer 324 of the multilayer device 300 in terms of material composition and formation. In an alternative embodiment, they are different.

As illustrated, the M2 layer 324 is disposed over the M1 layer 314 and in electrical contact with the M1 layer 316. The interface between at least one line of the M1 layer 316 and the M2 layer 324 forms a self-aligned interconnect 326. The interface forms a self-aligned interconnect 326 because no via is required to be defined between the M1 layer 316 and the M2 layer 323. Further, a blocking portion 328 is defined to block the formation of at least one self-aligned interconnect. In the present embodiment, the M1 layer 316 and the M2 layer 324 are in direct and electrical contact. In alternative embodiments, a material is interposed between the two layers to provide electrical contact between the self-aligned interconnect of the M1 layer 316 and the M2 layer 324.

Figure 47:
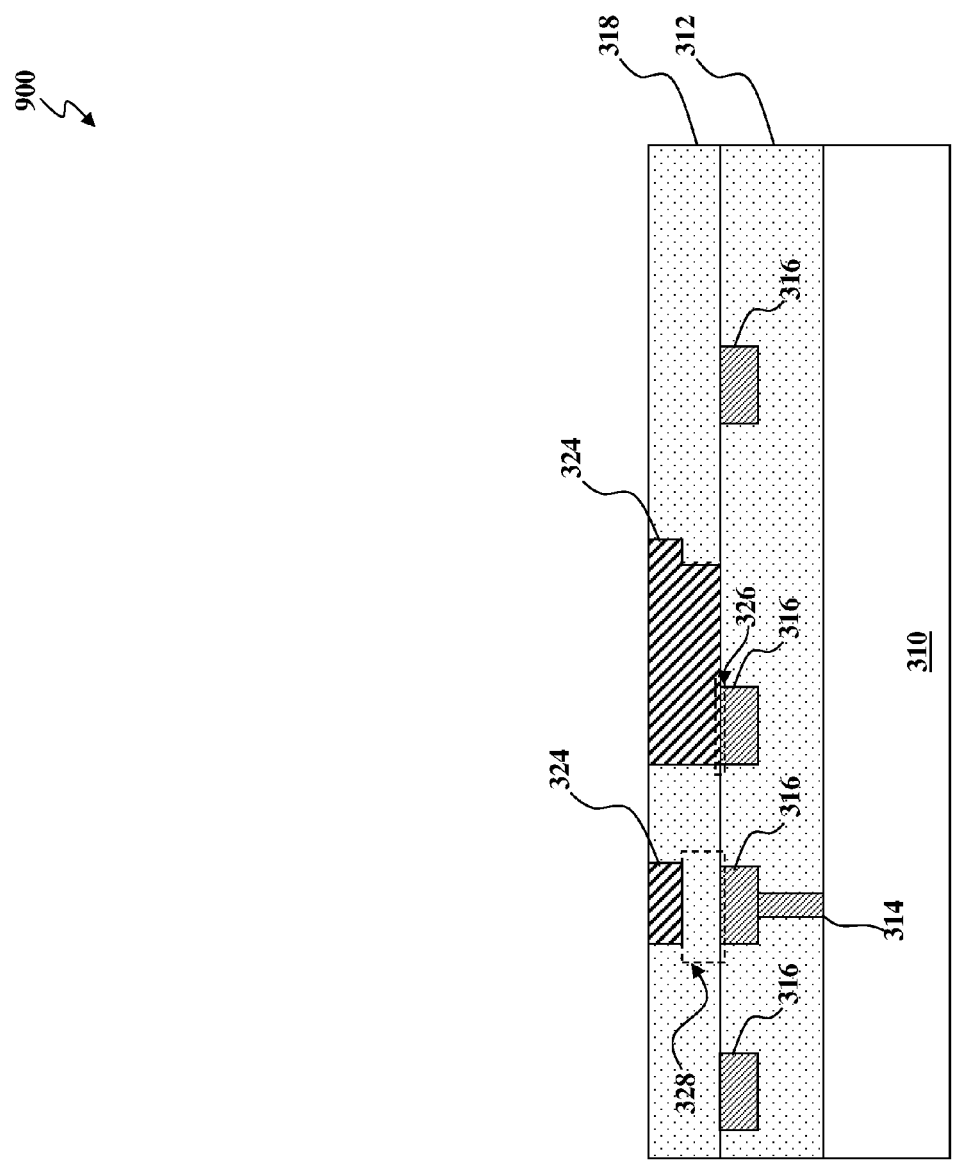

Referring to FIG. 47, the surface of the multilayer device 900 is planarized by a planarizing process that removes excess material of the M2 layer 324 and the hard mask 910. The planarizing process may be a chemical mechanical polishing (CMP) process or any suitable process.

Figure 48:
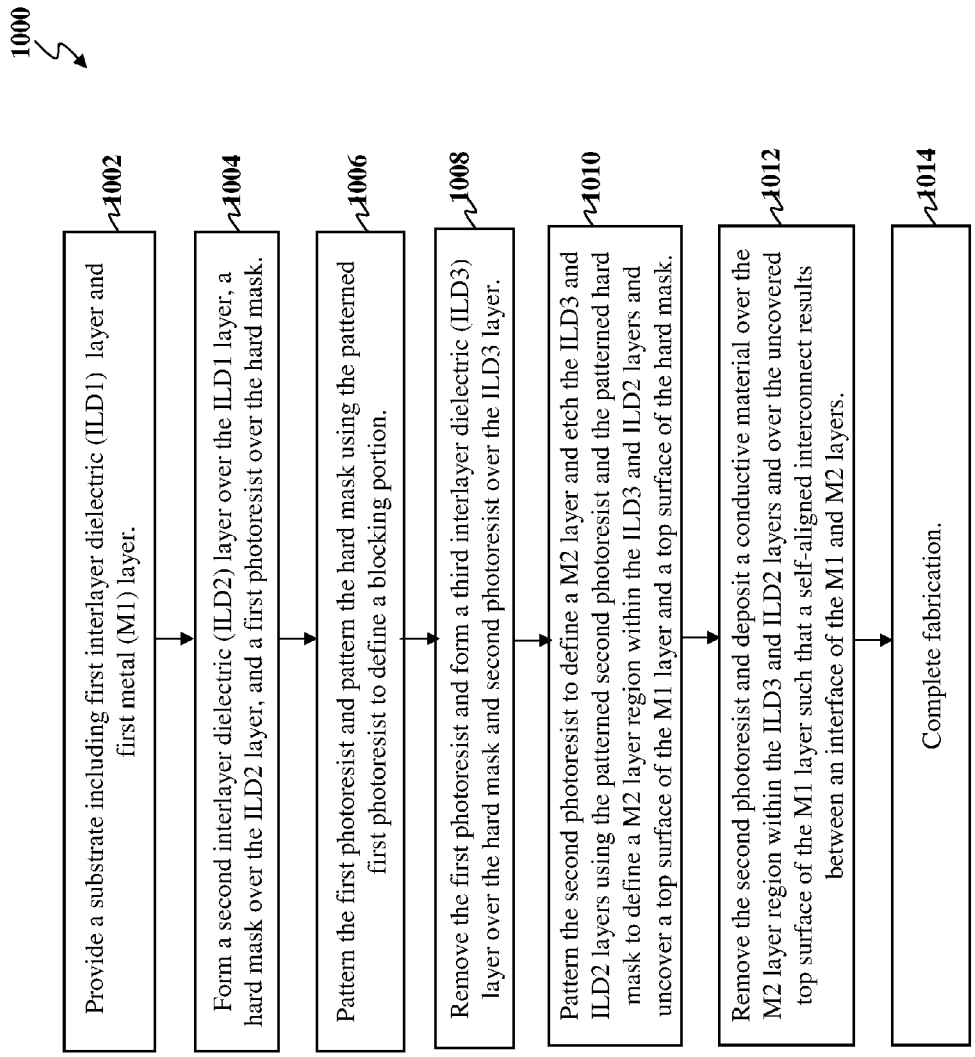
FIG. 48 is a flowchart illustrating a method of fabricating a multilayer device according to various aspects of the present disclosure.

Referring to FIG. 48, a method 1000 for fabricating a semiconductor device is described according to various aspects of the present disclosure. The embodiment of method 1000 may include similar process steps as an embodiment of the method 100 which is disclosed above. In disclosing the embodiment of method 1000, some details regarding processing and/or structure may be skipped for simplicity if they are similar to those described in the embodiment of method 100.

Still referring to FIG. 48, in the present embodiment, the method 1000 is for fabricating a multilayer integrated circuit device. The method 1000 begins at block 1002 where a substrate including first interlayer dielectric (ILD1) layer and first metal (M1) layer is provided. At block 1004, a second interlayer dielectric (ILD2) layer is formed over the ILD1 layer, a hard mask is formed over the ILD2 layer, and a first photoresist is formed over the hard mask. The method continues with block 1006 where the first photoresist is patterned and the hard mask is patterned using the patterned first photoresist to define a blocking portion. The method continues with block 1008 where the first photoresist is removed, a third interlayer dielectric (ILD3) layer over the hard mask and second photoresist over the ILD3 layer, and a second photoresist is formed over the ILD3 layer. At block 1010, the second photoresist layer is patterned to define a M2 layer and the ILD3 and ILD2 layers are etched using the patterned second photoresist and the patterned hard mask to define a M2 layer region within the ILD3 and ILD2 layers and to uncover a top surface of the M1 layer and a top surface of the hard mask. At block 1012, the second photoresist is removed and a conductive material is deposited over the M2 layer region within the ILD3 and ILD2 layers and over the uncovered top surface of the M1 layer such that a self-aligned interconnect results between an interface of the M1 and M2 layers. A planarizing process may be performed to remove excess M2 layer material and the hard mask, thus planarizing the top surface of the multilayer device. In alternative embodiments, the second photoresist is not removed prior to formation of the M2 layer, but rather it is also removed by the planarizing process that is performed to remove excess M2 layer material and the hard mask. The method 1000 continues with block 1014 where fabrication of the integrated circuit device is completed. It is understood that although the present embodiment describes the conductive layers as being metal layers (e.g., M1 and M2) the conductive layers may be any appropriate conductive material. Further, it is understood that although the present embodiment describes on two conductive layers (e.g., M1 and M2) more than two conducive layers are contemplated. Additional steps can be provided before, during, and after the method 1000, and some of the steps described can be replaced or eliminated for other embodiments of the method. The discussion that follows illustrates various embodiments of a multilayer device that can be fabricated according to the method 1000 of FIG. 48.

FIGS. 49-58 illustrate diagrammatic cross-sectional side views of one embodiment of a multilayer device 1100 at various stages of fabrication, according to the method of FIG. 48. The semiconductor device 1100 of FIGS. 49-58 is similar in certain respects to the semiconductor device 300 of FIGS. 5-14. Accordingly, similar features in FIGS. 5-14 and FIGS. 49-58 are identified by the same reference numerals for clarity and simplicity. It is understood that the multilayer device 1100 may include various other devices and features, such as other types of transistors such as bipolar junction transistors, resistors, capacitors, diodes, fuses, etc. Accordingly, FIGS. 49-58 have been simplified for the sake of clarity to better understand the inventive concepts of the present disclosure. Additional features can be added in the multilayer device 1100, and some of the features described below can be replaced or eliminated in other embodiments of the multilayer device 1100.

Figure 49:
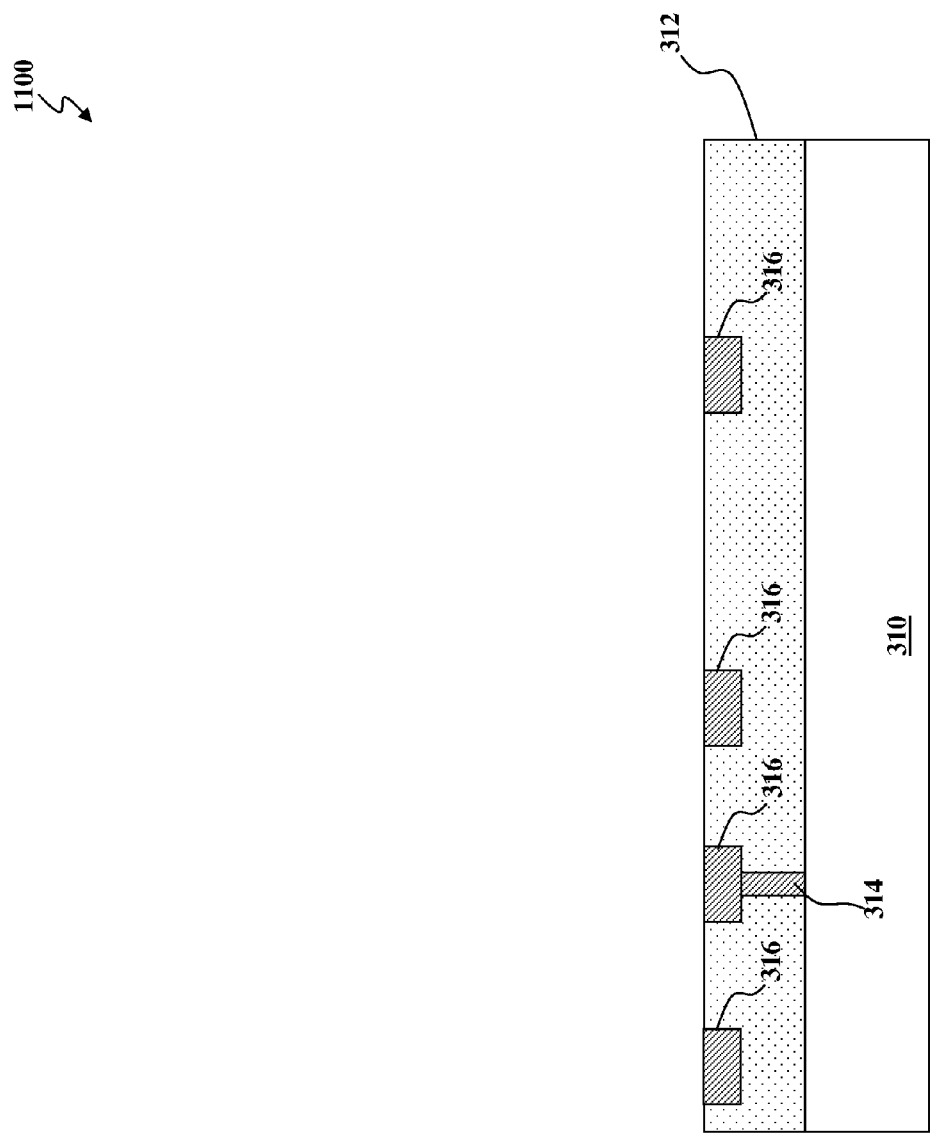
FIGS. 49-58 illustrate diagrammatic cross-sectional side views of one embodiment of a multilayer device at various stages of fabrication, according to the method of FIG. 48.

Referring to FIG. 49, a diagrammatic cross-sectional side view of multilayer device 1100 is illustrated. The multilayer device 1100 includes a substrate 310. In the present embodiment, the substrate 310 defined in the multilayer device 1100 is substantially similar to the substrate 310 of the multilayer device 300 in terms of material composition and formation. In an alternative embodiment, they are different.

Still referring to FIG. 49, the substrate 310 further includes a first interlayer dielectric (ILD1) layer 312. In the present embodiment, the ILD1 layer 312 defined in the multilayer device 1100 is substantially similar to the ILD1 layer 312 of the multilayer device 300 in terms of material composition and formation. In an alternative embodiment, they are different. Formed within the ILD1 layer 312 is a via 314 and a first metal (M1) layer 316. In the present embodiment, the via 314 and the M1 layer 316 defined in the multilayer device 1100 is substantially similar to the via 314 and the M1 layer 316 of the multilayer device 300 in terms of material composition and formation. In an alternative embodiment, they are different.

Figure 50:
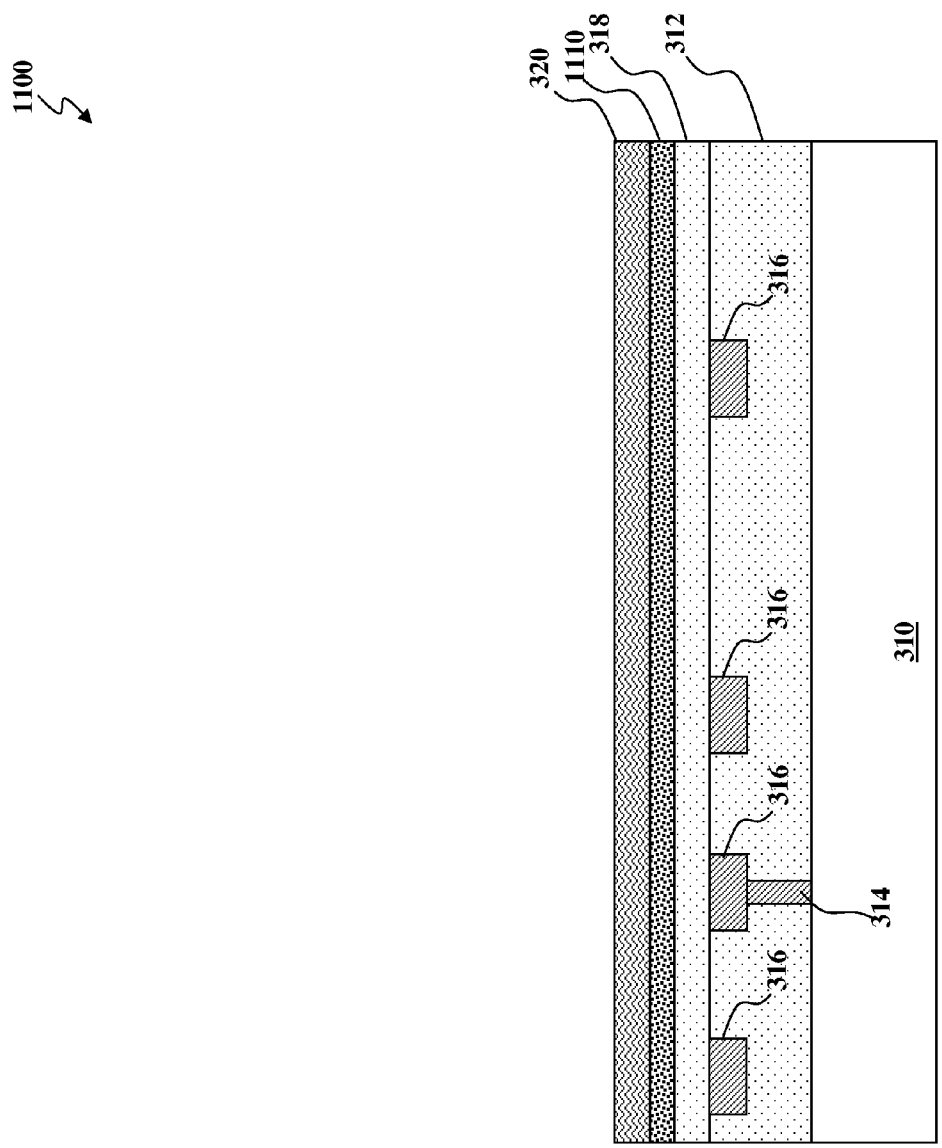

Referring to FIG. 50, formed over the ILD1 layer 312 is a second interlayer dielectric (ILD2) layer 318. In the present embodiment, the ILD2 layer 318 defined in the multilayer device 1100 is substantially similar to the ILD2 layer 318 of the multilayer device 300 in terms of material composition and formation. In an alternative embodiment, they are different.

Still referring to FIG. 50, formed over the ILD2 layer 318 is a hard mask 1110. Forming the hard mask 1110 includes, for example, depositing a material over the ILD2 layer 316 using a CVD process. The material may include, for example, oxide, nitride, or other suitable material. In various examples, the hard mask 1110 can be formed by atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6). Formed over the hard mask 1110 is a first photoresist layer 320. In the present embodiment, the first photoresist layer 320 defined in the multilayer device 1100 is substantially similar to the first photoresist layer 320 of the multilayer device 300 in terms of material composition and formation. In an alternative embodiment, they are different.

Figure 51:
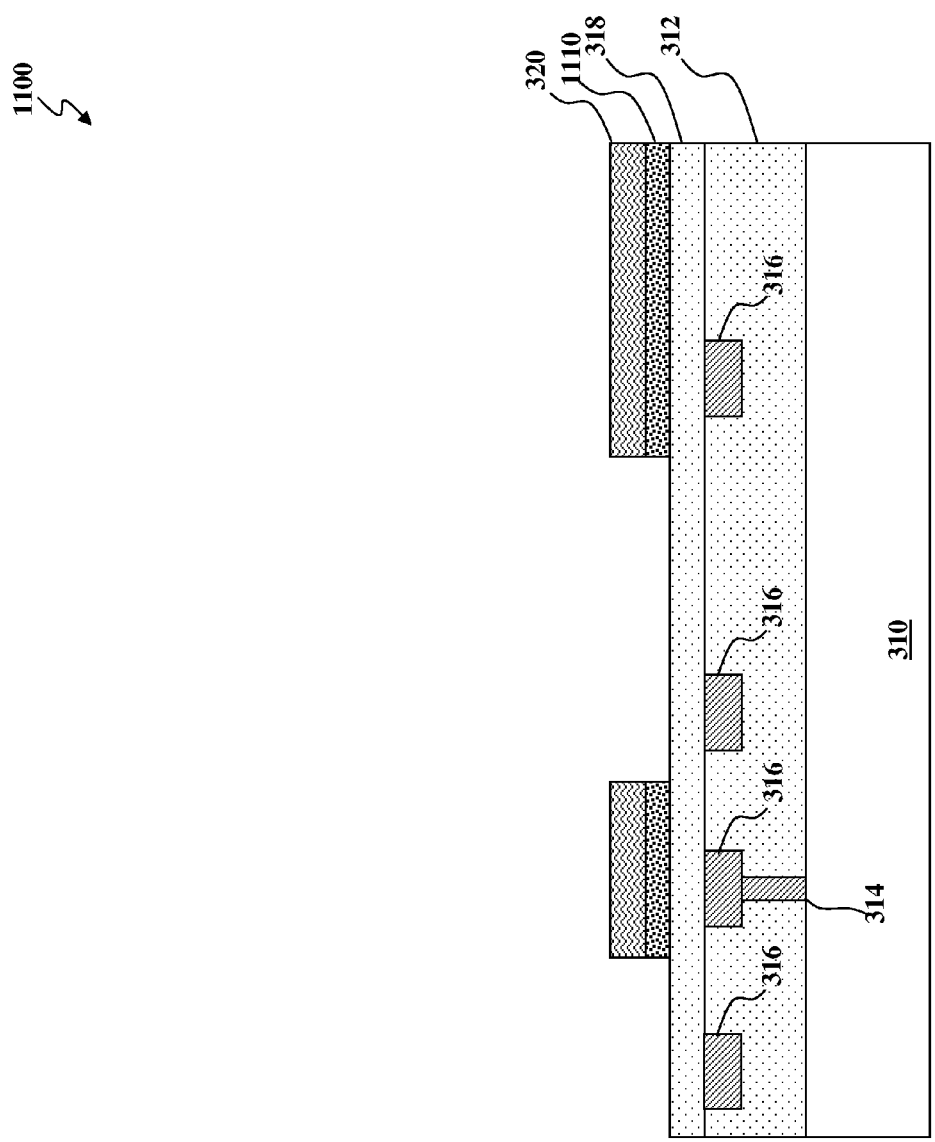

Referring to FIG. 51, the first photoresist layer 320 is patterned to define regions where the hard mask 1110 and the ILD2 layer 318 will be subsequently etched. Patterning the first photoresist layer 320 includes exposing the first photoresist layer 320 to a pattern, performing a post-exposure bake process, and developing the photoresist layer thereby forming a patterned first photoresist layer 320. The patterning may also be implemented or replaced by other proper methods, such as maskless photolithography, electron-beam writing, ion-beam writing, and molecular imprint.

Still referring to FIG. 51, the hard mask 1110 is patterned using the patterned first photoresist layer 320 to define a blocking portion. Patterning the hard mask 1110 includes an etching process. The etching process can include a wet etching process, a dry etching process, or a combination thereof. In one example, a dry etching process used to etch the hard mask may include a chemistry including fluorine-containing gas. In furtherance of the example, the chemistry of the dry etch includes CF4, SF6, or NF3.

Figure 52:
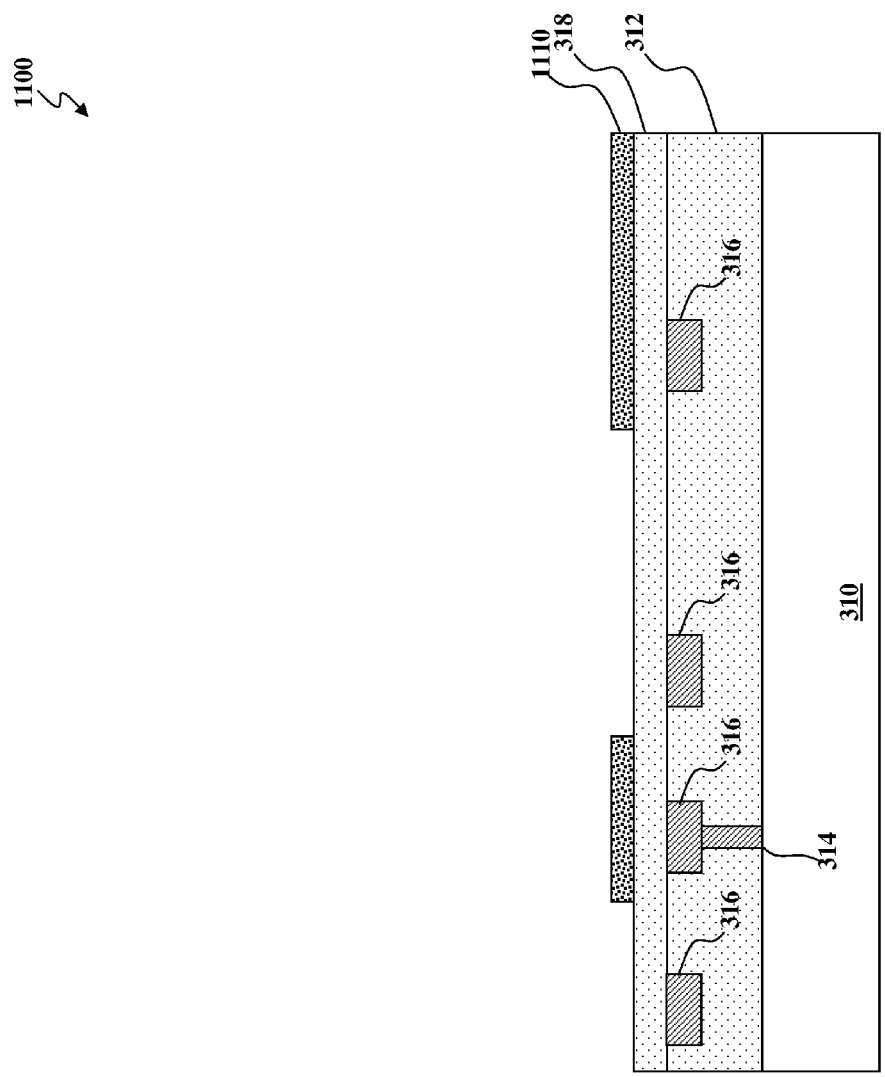

Referring to FIG. 52, after the hard mask 1110 patterning process, the first photoresist layer 320 may be removed by any suitable process. For example, the first photoresist layer 320 may be removed by a liquid "resist stripper", which chemically alters the resist so that it no longer adheres to the underlying hard mask. Alternatively, first photoresist layer 320 may be removed by a plasma containing oxygen, which oxidizes it.

Figure 53:
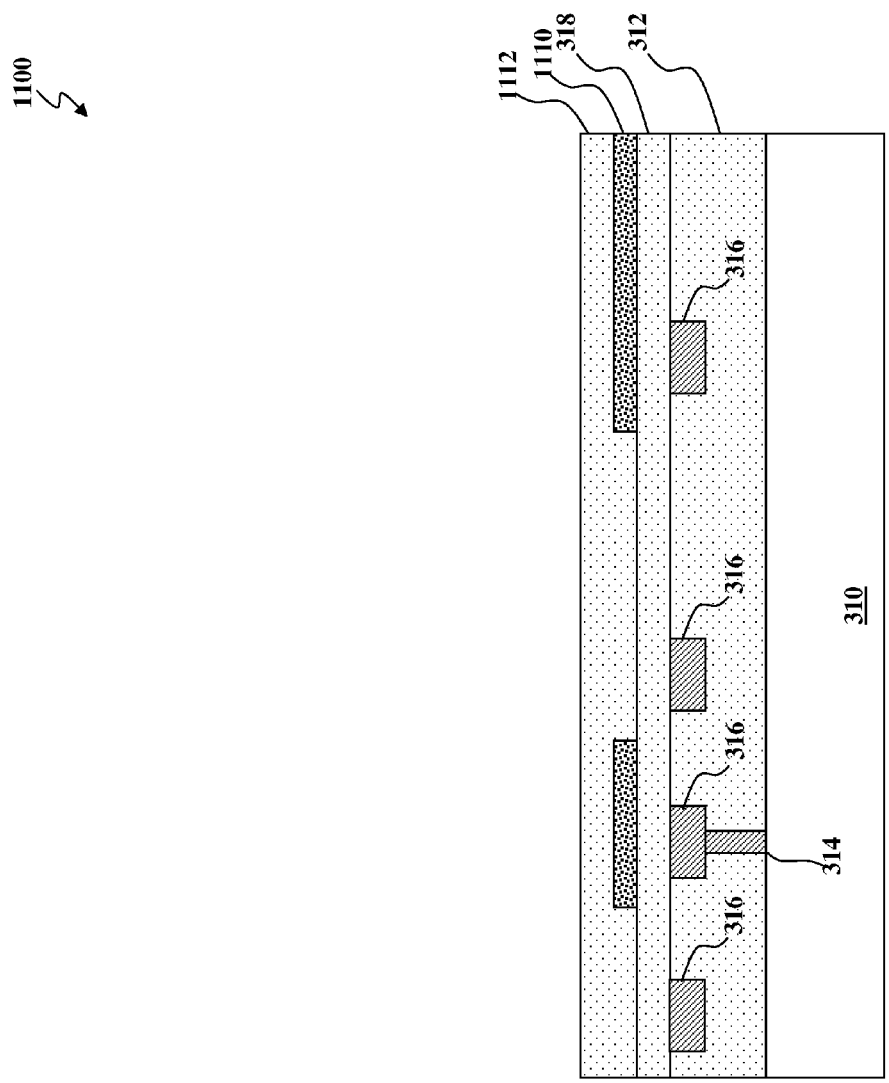

Referring to FIG. 53, a third interlayer dielectric (ILD3) layer 1112 is formed over the patterned hard mask 1110 and the ILD2 layer 312. The ILD3 layer 1112 may include silicon oxide, silicon oxynitride, a low-k material such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD3 layer 1112 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 54:
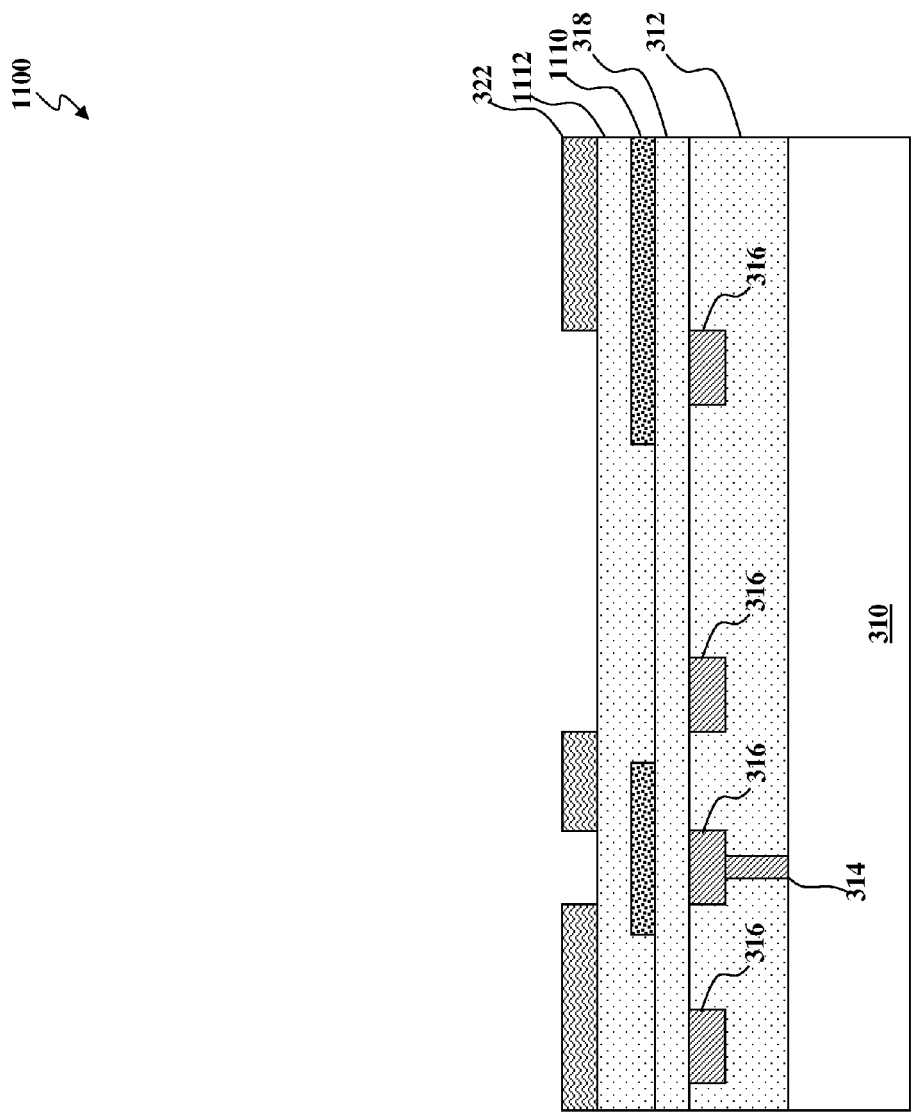

Referring to FIG. 54, a second photoresist layer 322 is formed over the ILD3 layer 1112. In the present embodiment, the second photoresist layer 322 defined in the multilayer device 1100 is substantially similar to the second photoresist layer 322 of the multilayer device 300 in terms of material composition and formation. In an alternative embodiment, they are different.

Still referring to FIG. 54, the second photoresist layer 322 is patterned to define regions where the ILD3 and the ILD2 layers 1112, 318 will be subsequently etched. Patterning the second photoresist layer 322 includes exposing the second photoresist layer 322 to a pattern, performing a post-exposure bake process, and developing the photoresist layer thereby forming a patterned second photoresist layer 322. The patterning may also be implemented or replaced by other proper methods, such as maskless photolithography, electron-beam writing, ion-beam writing, and molecular imprint.

Figure 55:
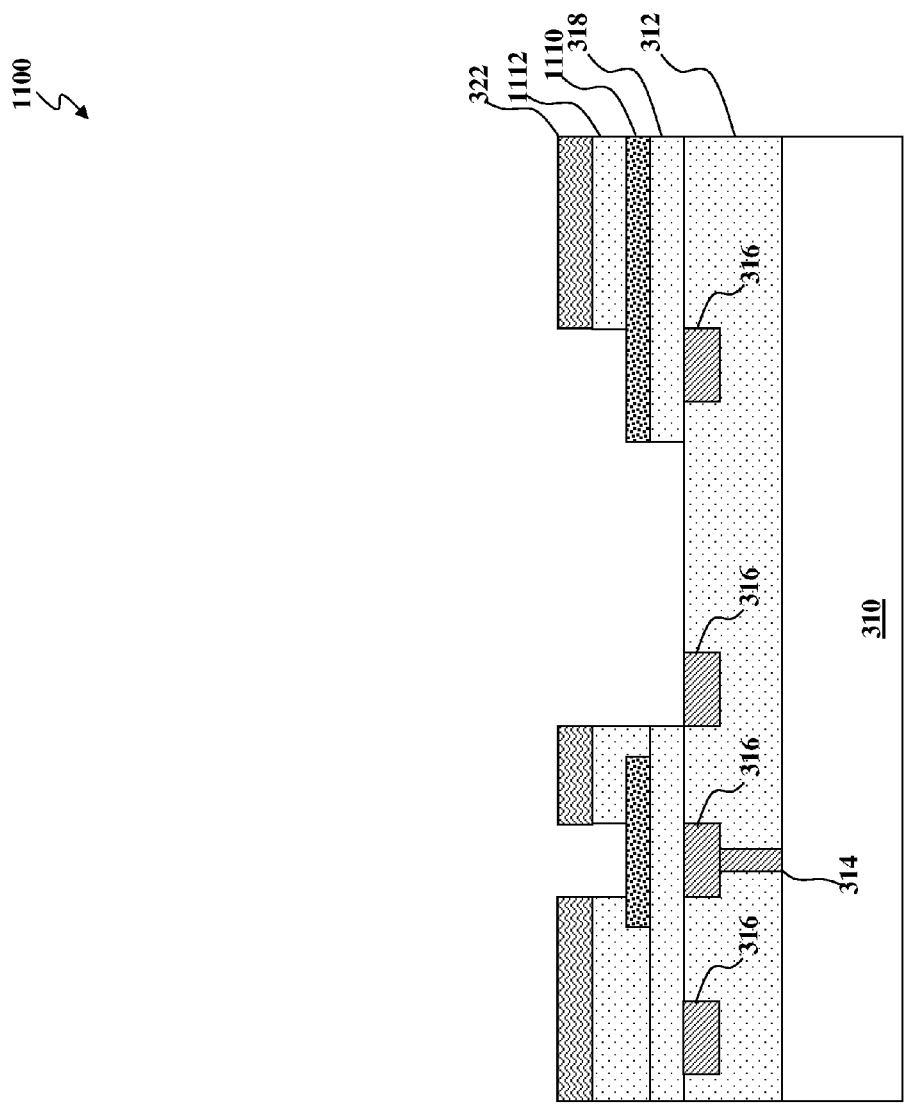

Referring to FIG. 55, the ILD3 and the ILD2 layers 1112, 318 are etched using the patterned hard mask 1110 and the patterned second photoresist 322 to define a M2 layer region within the ILD2 layer 318 and uncover a top surface of the M1 layer and a top surface of a blocking portion of the hard mask 1110. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the ILD3 and the ILD2 layers 1112, 318 that includes a chemistry including fluorine-containing gas. In furtherance of the example, the chemistry of the dry etch includes CF4, SF6, or NF3. As illustrated the blocking portion of the hard mask 1110 serves to stop/block the etching over at least one line of the M1 layer 316. In alternative embodiments, the etching process may be any suitable etching process and may stop according to design requirements.

Figure 56:
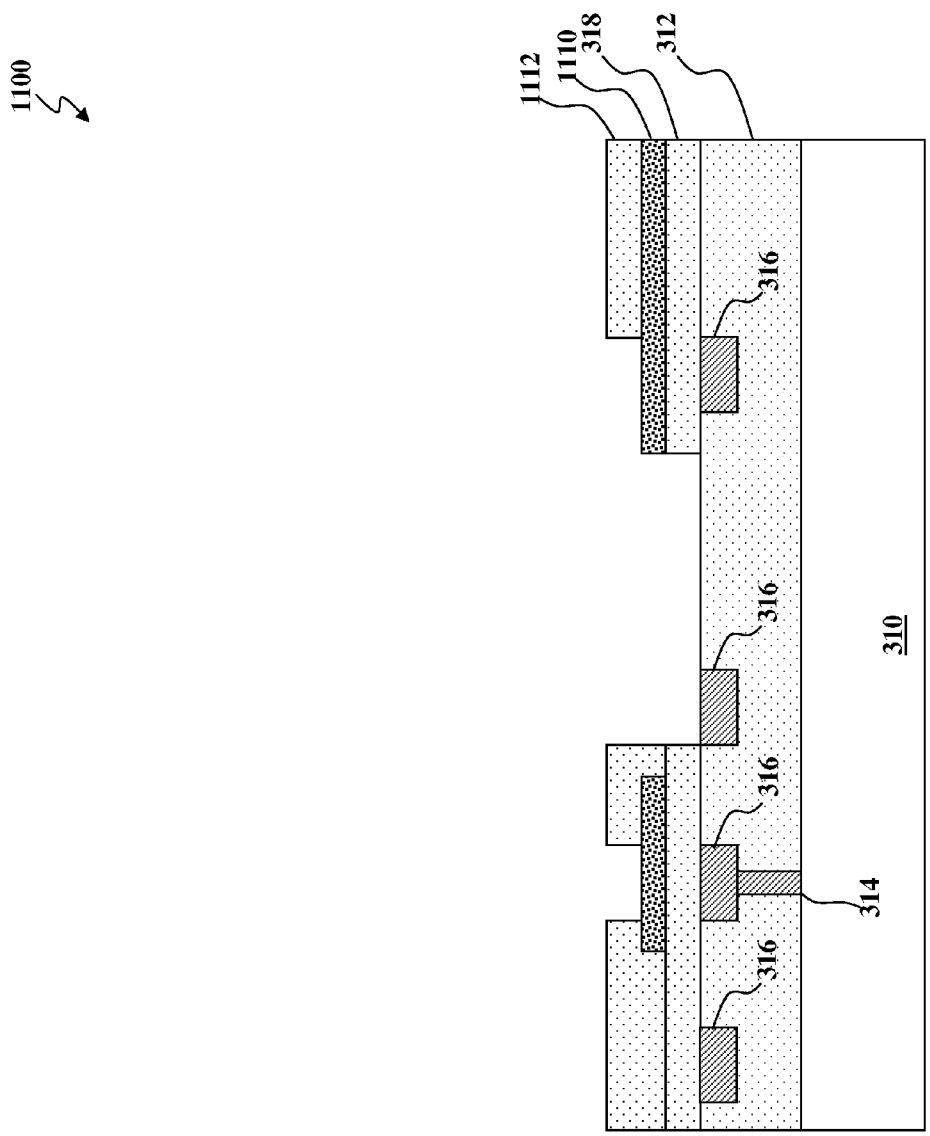

Referring to FIG. 56, after the ILD3 and the ILD2 layers 1112, 318 etching process, the second photoresist layer 322 may be removed by any suitable process. For example, the second photoresist layer 322 may be removed by a liquid "resist stripper", which chemically alters the resist so that it no longer adheres to the underlying hard mask. Alternatively, second photoresist layer 322 may be removed by a plasma containing oxygen, which oxidizes it.

Figure 57:
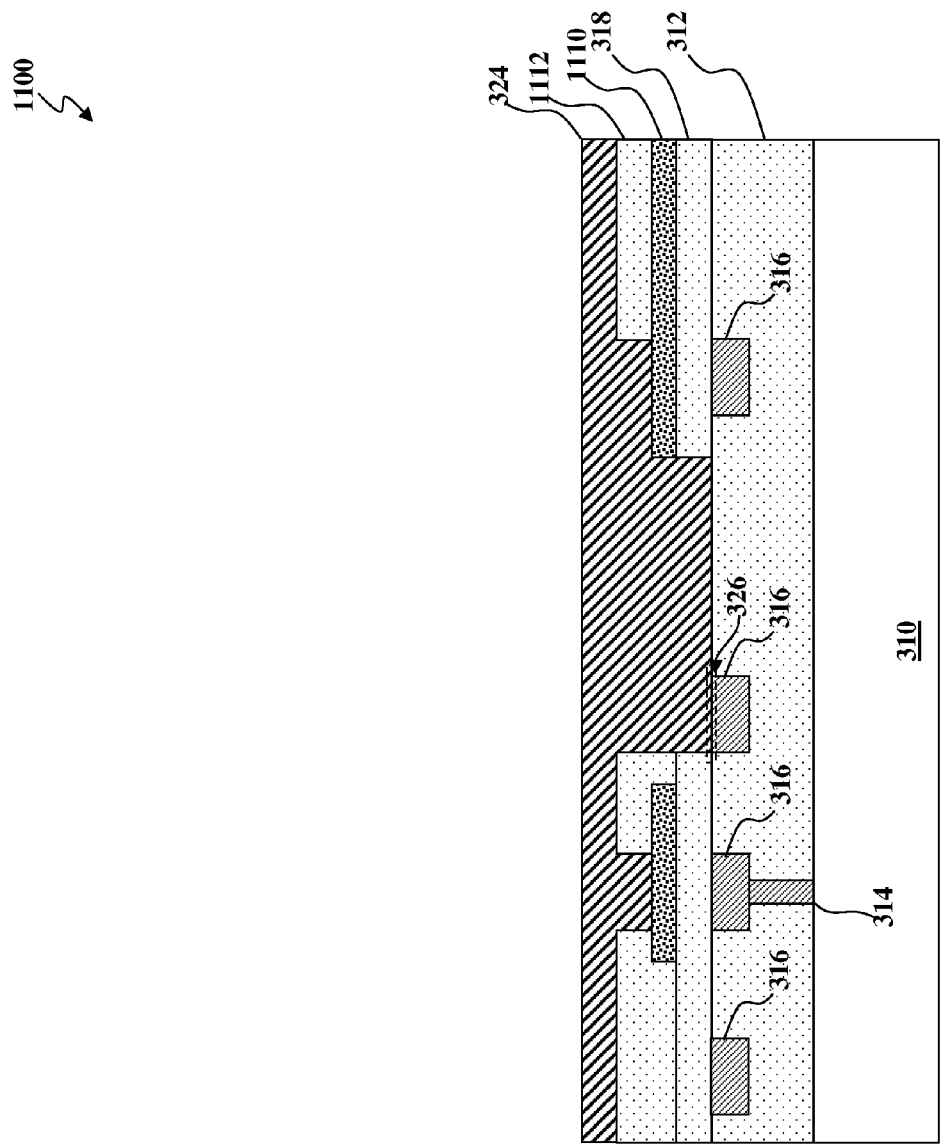

Referring to FIG. 57, after defining the M2 layer region within the ILD3 and the ILD2 layers 1112, 318 and uncovering the top surface of the M1 layer 316 and a top surface of the blocking portion of the hard mask 1110, a M2 layer 324 is formed over the M2 layer region within the ILD3 and the ILD2 layers 1112, 318. The M2 layer 324 provides electrical connection to the M1 layer 316 and other devices/features of the multilayer device 1100. In the present embodiment, the M2 layer 324 defined in the multilayer device 1100 is substantially similar to the M2 layer 324 of the multilayer device 300 in terms of material composition and formation. In an alternative embodiment, they are different.

As illustrated, the M2 layer 324 is disposed over the M1 layer 314 and in electrical contact with the M1 layer 316. The interface between at least one line of the M1 layer 316 and the M2 layer 324 forms a self-aligned interconnect 326. The interface forms a self-aligned interconnect 326 because no via is required to be defined between the M1 layer 316 and the M2 layer 323. Further, a blocking portion 328 is defined to block the formation of at least one self-aligned interconnect. In the present embodiment, the blocking portion 328 includes the hard mask 1110 (which remains as part of the final device) and the ILD2 layer 318. In the present embodiment, the M1 layer 316 and the M2 layer 324 are in direct and electrical contact. In alternative embodiments, a material is interposed between the two layers to provide electrical contact between the self-aligned interconnect of the M1 layer 316 and the M2 layer 324.

Figure 58:
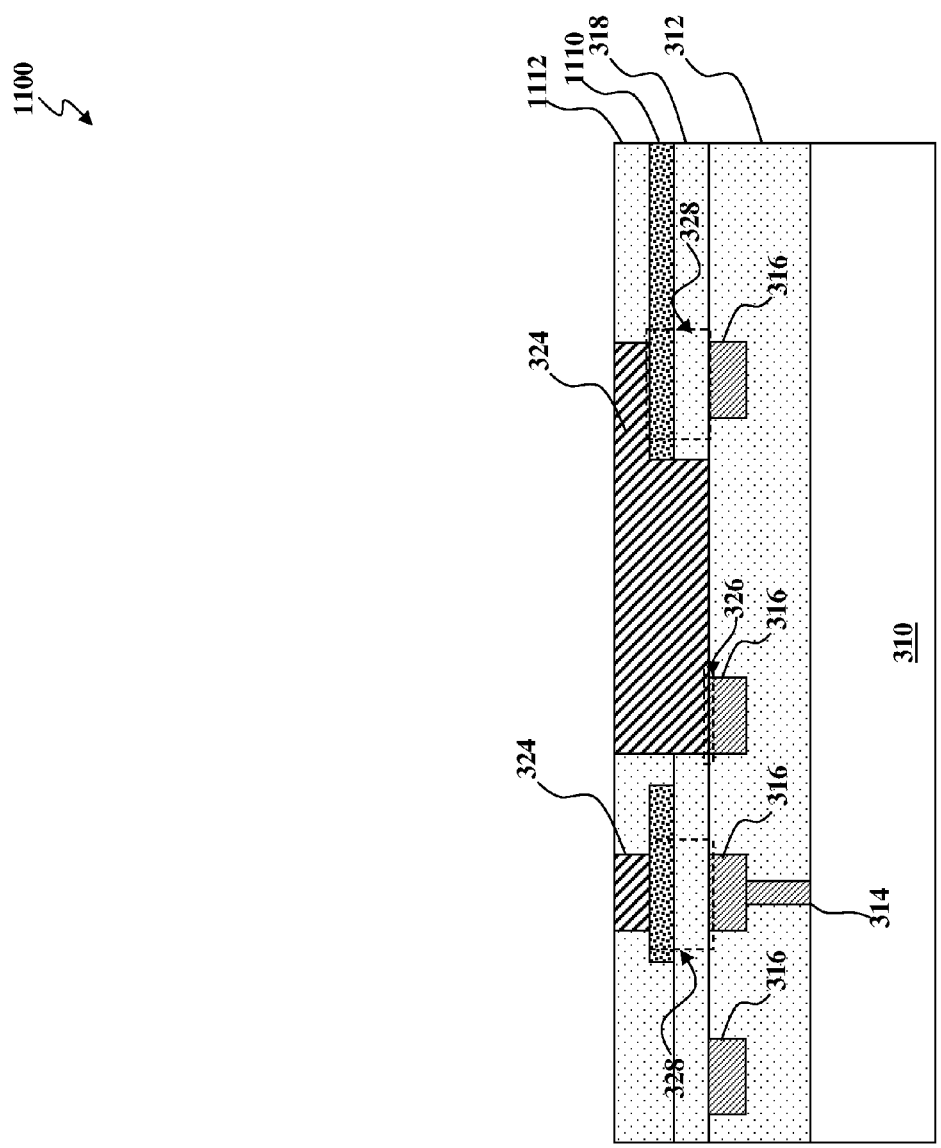

Referring to FIG. 58, the surface of the multilayer device 1100 is planarized by a planarizing process that removes excess material of the M2 layer 324. The planarizing process may be a chemical mechanical polishing (CMP) process or any suitable process.

Based on the discussions above, it can be seen that the embodiments of the present disclosure offer advantages, it being understood that different embodiments may offer different advantages, and not all the advantages are discussed herein, and that no particular advantage is required for all embodiments. One advantage, for example, of certain embodiments of the present disclosure is that by forming the self-aligned interconnects which do not require vias to connect to lines of underlying conductive layers, multiple steps of aligning, patterning, and forming the vias are avoided. Also, because blocking portions are utilized, the disclosed embodiments allows for blocking multiple unwanted self-aligned interconnects from forming. Another advantage is that the self-aligned interconnect that results at the interface of the lines of the conductive layers are robust and more reliable as compared to traditional methods that utilize vias. Further, the embodiments described herein can be easily implemented into current manufacturing process and technology, thereby lowering cost and minimizing complexity.

It is understood that although the interconnect structure according to the present disclosure can be formed to be totally via-free, it need not necessarily be implemented that way. For example, in some alternative embodiments, some interconnect layers may be formed to be via-free by adopting the routing scheme of the present disclosure, while other interconnect layers may still utilize actual vias to interconnect their metal lines. The specific routing scheme of the interconnect structure may be configured and implemented according to design requirements and manufacturing concerns.

Thus, provided is a device. The exemplary device includes a first interlayer dielectric (ILD) layer disposed over a substrate, the first ILD layer including a first conductive layer including first and second conductive lines in a first direction. The device further includes a second ILD layer disposed over the first ILD layer, the second ILD layer including a second conductive layer including first and second conductive lines in a second direction. The first conductive line of the second conductive layer is formed over the first conductive line of the first conductive layer and contacts the first conductive line of the first conductive layer at an interface, the interface providing electrical contact without the use of a via. The second conductive line of the second conductive layer is formed over the second conductive line of the first conductive layer. A blocking portion is interposed between the second conductive line of the second conductive layer and the second conductive line of the first conductive layer.

In some embodiments, the blocking portion includes a part of the second ILD layer. In various embodiments, the blocking portion includes a part of a hard mask. In certain embodiments, the blocking portion is formed of first and second portions, the first portion is formed over the second conductive line of the first conducive layer, and the second portion is formed over a third conductive line of the first conducive layer. In further embodiments, the first and second portions are not in contact with each other. In some embodiments, the first and second conductive layers include a material selected from the group consisting of aluminum, tungsten, and copper, and the first and second ILD layers include a low-k dielectric material. In various embodiments, the first conductive line of the second conductive layer includes a thickness that is substantially the same as a thickness of the second ILD layer. In certain embodiments, the first conductive line of the second conductive layer extends through the second ILD layer and through a third ILD layer formed over the second ILD layer, the second conductive line of the second conductive layer extends through the third ILD layer to a hard mask of the blocking portion, and the hard mask is disposed on the second ILD layer. In some embodiments, the first conductive line of the second conductive layer includes a top surface that is substantially coplanar with a top surface of the second ILD layer, and the first conductive line of the second conductive layer includes a bottom surface that is substantially coplanar with a bottom surface of the second ILD layer.

Also provided is an alternative embodiment of a device. The exemplary device includes a first conductive layer disposed over a substrate, the first conductive layer including a first plurality of conductive lines extending in a first direction. The device further includes a second conductive layer disposed over the first conductive layer, the second conductive layer including a second plurality of conductive lines extending in a second direction. The device further includes a self-aligned interconnect formed at an interface where a first conductive line of the first plurality of conductive lines is in electrical contact with a first conductive line of the second plurality of conductive lines. The device further includes a blocking portion interposed between a second conductive line of the first plurality of conductive lines and a second conductive line of the second plurality of conductive lines.

In some embodiments, the blocking portion is also interposed between a third conductive line of the first plurality of conductive lines and a third conductive line of the second plurality of conductive lines. In various embodiments, the blocking layer is formed of a continuous and uninterrupted material that extends from between the second conductive lines to between the third conductive lines. In certain embodiments, the first and second conductive layers are disposed in a dielectric material. In further embodiments, the interface spans a width of the first conductive line of the first plurality of conductive lines. In some embodiments, the first direction is perpendicular to the second direction.

Also provided is a method of forming a device. The exemplary method includes forming a first conductive layer over a substrate, the first conductive layer including a first plurality of conductive lines extending in a first direction. The method further includes forming a second conductive layer over the first conductive layer, the second conductive layer including a second plurality of conductive lines extending in a second direction. The method further includes forming a self-aligned interconnect at an interface where a first conductive line of the first plurality of conductive lines is in electrical contact with a first conductive line of the second plurality of conductive lines. The method further includes forming a blocking portion interposed between a second conductive line of the first plurality of conductive lines and a second conductive line of the second plurality of conductive lines.

In some embodiments, forming the first conductive layer includes forming the first conductive layer within a first interlayer dielectric (ILD) layer, and forming the second conductive layer includes forming the second conductive layer within a second interlayer dielectric (ILD) layer. In various embodiments, the first conductive line of the second plurality of conductive lines is formed within the second ILD layer and within a third ILD layer, the second conductive line of the second plurality of conductive lines is formed on a hard mask of the blocking portion and within the third ILD layer, and the hard mask is formed on a top surface of the second ILD layer. In certain embodiments, the first and second conductive layers include a material selected from the group consisting aluminum, tungsten, and copper, and the first, second, and third ILD layers include a low-k dielectric material. In further embodiments, forming the blocking portion includes forming a hard mask over the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first interlayer dielectric (ILD) layer disposed over a substrate, the first ILD layer including a first conductive layer including first and second conductive lines in a first direction; and
    a second ILD layer disposed over the first ILD layer, the second ILD layer including a second conductive layer including first and second conductive lines in a second direction,
    wherein the first conductive line of the second conductive layer is formed over the first conductive line of the first conductive layer and contacts the first conductive line of the first conductive layer at an interface, the interface providing electrical contact without the use of a via,
    wherein the second conductive line of the second conductive layer is formed over the second conductive line of the first conductive layer, and
    wherein a blocking portion is interposed between the second conductive line of the second conductive layer and the second conductive line of the first conductive layer.

2. The device of claim 1 wherein the blocking portion includes a part of the second ILD layer.

3. The device of claim 2 wherein the blocking portion includes a part of a hard mask.

4. The device of claim 3 wherein the blocking portion is formed of first and second portions,
    wherein the first portion is formed over the second conductive line of the first conducive layer, and
    wherein the second portion is formed over a third conductive line of the first conducive layer.

5. The device of claim 4 wherein the first and second portions are not in contact with each other.

6. The device of claim 1 wherein the first and second conductive layers include a material selected from the group consisting of aluminum, tungsten, and copper, and wherein the first and second ILD layers include a low-k dielectric material.

7. The device of claim 1 wherein the first conductive line of the second conductive layer includes a thickness that is substantially the same as a thickness of the second ILD layer.

8. The device of claim 1 wherein the first conductive line of the second conductive layer extends through the second ILD layer and through a third ILD layer formed over the second ILD layer,
    wherein the second conductive line of the second conductive layer extends through the third ILD layer to a hard mask of the blocking portion, and
    wherein the hard mask is disposed on the second ILD layer.

9. The device of claim 1 wherein the first conductive line of the second conductive layer includes a top surface that is substantially coplanar with a top surface of the second ILD layer, and
    wherein the first conductive line of the second conductive layer includes a bottom surface that is substantially coplanar with a bottom surface of the second ILD layer.

10. A device comprising:
    a first conductive layer disposed over a substrate, the first conductive layer including a first plurality of conductive lines extending in a first direction;

a second conductive layer disposed over the first conductive layer, the second conductive layer including a second plurality of conductive lines extending in a second direction;

a self-aligned interconnect formed at an interface where a first conductive line of the first plurality of conductive lines is in electrical contact with a first conductive line of the second plurality of conductive lines; and a blocking portion interposed between a second conductive line of the first plurality of conductive lines and a second conductive line of the second plurality of conductive lines.

11. The device of claim 10 wherein the blocking portion is also interposed between a third conductive line of the first plurality of conductive lines and a third conductive line of the second plurality of conductive lines.

12. The device of claim 11 wherein the blocking portion is formed of a continuous and uninterrupted material that extends from between the second conductive lines to between the third conductive lines.

13. The device of claim 10 wherein the first and second conductive layers are disposed in a dielectric material.

14. The device of claim 10 wherein the first direction is substantially the same as the second direction.

15. The device of claim 10 wherein the first direction is different from the second direction.

16. A device comprising:

a first conductive layer over a substrate, the first conductive layer including a first conductive portion and a second conductive portion;

a second conductive layer over the first conductive layer, the second conductive layer including a third conductive portion and a fourth conductive portion, wherein the third conductive portion is over the first conductive portion, and the fourth conductive portion is over the second conductive portion;

a self-aligned interconnect at an interface where the first conductive portion and the third conductive portion; and a blocking portion interposed between the second conductive portion and the fourth conductive portion.

17. The device of claim 16 wherein the first conductive layer is within a first interlayer dielectric (ILD) layer, and wherein the second conductive layer is within a second ILD layer.

18. The device of claim 17 wherein the first and second conductive layers include a material selected from the group consisting of aluminum, tungsten, and copper, and wherein the first and second ILD layers include a low-k dielectric material.

\* \* \* \* \*